(12) United States Patent
Kamigaichi et al.

(10) Patent No.: US 8,044,448 B2
(45) Date of Patent: Oct. 25, 2011

(54) NONVOLATILE SEMICONDUCTOR MEMORY DEVICE

(75) Inventors: Takeshi Kamigaichi, Kanagawa-ken (JP); Fumitaka Arai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 12/508,904

(22) Filed: Jul. 24, 2009

(65) Prior Publication Data

US 2010/0020608 A1    Jan. 28, 2010

(30) Foreign Application Priority Data

Jul. 25, 2008  (JP) ................. 2008-191762
Nov. 4, 2008   (JP) ................. 2008-283547

(51) Int. Cl.
*H01L 27/108* (2006.01)
(52) U.S. Cl. ............... 257/296; 257/390; 365/185.05; 365/184
(58) Field of Classification Search .......... 257/296, 257/390; 365/185.05, 184
See application file for complete search history.

(56) References Cited

U.S. PATENT DOCUMENTS

| | | | |
|---|---|---|---|
| 5,599,724 | A | 2/1997 | Yoshida |
| 5,707,885 | A | 1/1998 | Lim |
| 2007/0158736 | A1 | 7/2007 | Arai et al. |
| 2008/0073635 | A1 | 3/2008 | Kiyotoshi et al. |
| 2008/0128780 | A1 | 6/2008 | Nishihara et al. |
| 2008/0173928 | A1 | 7/2008 | Arai et al. |
| 2009/0020744 | A1 | 1/2009 | Mizukami et al. |
| 2009/0090959 | A1 | 4/2009 | Nishihara et al. |
| 2009/0090960 | A1 | 4/2009 | Izumi et al. |
| 2009/0097309 | A1 | 4/2009 | Mizukami et al. |

FOREIGN PATENT DOCUMENTS

| | | |
|---|---|---|
| JP | 2007-180389 | 7/2007 |
| JP | 2007-266143 | 10/2007 |

OTHER PUBLICATIONS

U.S. Appl. No. 12/434,305, filed May 1, 2009, Takeshi Murata, et al.
U.S. Appl. No. 12/394,929, filed Feb. 27, 2009, Yasuhiro Shiino, et al.
U.S. Appl. No. 12/562,558, filed Sep. 18, 2009, Nishihara.

*Primary Examiner* — Tan N Tran
(74) *Attorney, Agent, or Firm* — Oblon, Spivak, McClelland, Maier & Neustadt, L.L.P.

(57) ABSTRACT

A nonvolatile semiconductor memory device includes: a memory cell array region having memory cells connected in series; a control circuit region disposed below the memory cell array region; and an interconnection portion electrically connecting the control circuit region and the memory cell array region. The memory cell array region includes: a plurality of first memory cell regions having the memory cells; and a plurality of connection regions. The interconnection portion is provided in the connection regions. The first memory cell regions are provided at a first pitch in a first direction orthogonal to a lamination direction of the memory cell array region and the control circuit region. The connection regions are provided between the first memory cell regions mutually adjacent in the first direction, and at a second pitch in a second direction orthogonal to the lamination direction and the first direction.

7 Claims, 35 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2008-191762, filed on Jul. 25, 2008 and the prior Japanese Patent Application No. 2008-283547, filed on Nov. 4, 2008; the entire contents of which are incorporated herein by reference.

BACKGROUND OF THE INVENTION

1. Field of the Invention

The present invention relates to a nonvolatile semiconductor memory device in which data can be electrically reprogrammed.

2. Background Art

Semiconductor memory devices of recent years tend to increase the number of bits (the number of memory cells) to increase the amount of data programmed to one chip. Therefore, in recent years, many semiconductor memory devices are proposed having structures in which memory cells are disposed three dimensionally (hereinbelow referred to as "3D laminated cell structures") to increase the integration of memory (refer to JP-A 2007-266143 (Kokai), U.S. Pat. No. 5,599,724, and U.S. Pat. No. 5,707,885).

In an EEPROM using a high voltage for programming and the like, an HV transistor is indispensable to breakdown against the high voltage. However, it is difficult to reduce the programming voltage, and the HV transistor cannot shrink. In the case where, for example, an HV transistor is used as a transfer gate transistor connected to a word line, it is necessary that the number of transistors is the same as the number of word lines. Accordingly, it is difficult to reduce the occupied surface area of the entire chip due to the occupied surface area of the HV transistor. In particular, the occupied surface area of the HV transistor becomes a problem in the case where a 3D laminated cell structure is formed.

In a NAND flash memory, for example, using a floating gate as the memory layer and a MONOS (Metal-Oxide-Nitride-Oxide-Semiconductor) nonvolatile semiconductor memory device using silicon nitride and the like as the memory layer, laminating the memory cell portion may be considered to increase the memory density. JP-A 2007-180389 (Kokai) discusses technology in regard to a laminated nonvolatile semiconductor memory device that includes multiple memory cell strings in which a semiconductor is formed in a pillar configuration perpendicular to a semiconductor substrate and multiple memory cells are connected in series.

In the nonvolatile semiconductor memory device, a control gate of the memory cell is connected to a word line; the word line is drawn out to a peripheral circuit region; and a prescribed operation is performed. Then, the word line is provided at a density according to the arrangement density of the memory cells. On the other hand, although a transfer gate transistor is provided in the peripheral circuit region, generally, the size of the transfer gate transistor is larger than the distance between the word lines. Although multi-layered interconnections are formed by the word lines connected to the control gates of each cell in a laminated nonvolatile semiconductor memory device having multi-layered memory cells, technology is not known that connects each word line laminated in such multiple layers to the transfer transistor of the peripheral circuit region. Therefore, in conventional art, it is necessary to increase the spacing between laminated word lines, resulting in an impediment to shrinking and increased densities of nonvolatile semiconductor memory devices.

SUMMARY OF THE INVENTION

According to an aspect of the invention, there is provided a nonvolatile semiconductor memory device including: a memory cell array region having memory cells connected in series; a control circuit region disposed below the memory cell array region; and an interconnection portion electrically connecting the control circuit region and the memory cell array region, the memory cell array region including: a plurality of first memory cell regions having the memory cells; and a plurality of connection regions, the interconnection portion being provided in the connection regions, the first memory cell regions being provided at a first pitch in a first direction orthogonal to a lamination direction of the memory cell array region and the control circuit region; and the connection regions being provided between the first memory cell regions mutually adjacent in the first direction, and at a second pitch in a second direction orthogonal to the lamination direction and the first direction.

According to another aspect of the invention, there is provided a nonvolatile semiconductor memory device including: a semiconductor substrate including a memory cell region and a peripheral circuit region provided adjacent to the memory cell region; a memory cell string including a plurality of memory cells connected in series in a direction perpendicular to a major surface of the semiconductor substrate in the memory cell region; a transistor provided on the semiconductor substrate in the peripheral circuit region; and a plurality of first interconnections being extension portions of first conductive layers forming control gates of the memory cells, the first conductive layers extending in a first direction as viewed from the semiconductor substrate, the extension portions of first conductive layers extending to the peripheral circuit region, the first interconnections passing above a gate electrode of the transistor as viewed from the semiconductor substrate.

According to another aspect of the invention, there is provided a nonvolatile semiconductor memory device including: a semiconductor substrate including a memory cell region and a peripheral circuit region provided adjacent to the memory cell region; a memory cell string including a plurality of memory cells connected in series in a direction perpendicular to a major surface of the semiconductor substrate in the memory cell region; a transistor provided on the semiconductor substrate in the peripheral circuit region; an inter-layer connection part being provided on the semiconductor substrate in the peripheral circuit region, the inter-layer connection part extending in a direction non-parallel to the major surface and electrically connecting to a diffusion layer of the transistor; and a peripheral circuit region interconnection being an extension portion of a conductive layer forming a control gate of the memory cell, the extension portion extending to the peripheral circuit region, the peripheral circuit region interconnection being provided in the peripheral circuit region and extending in a first direction parallel to the major surface of the semiconductor substrate, the peripheral circuit region interconnection including a connection portion protruding parallel to the major surface in a second direction non-parallel to the first direction, the connection portion being electrically connected to the inter-layer connection part.

DETAILED DESCRIPTION OF THE INVENTION

Figure 1:
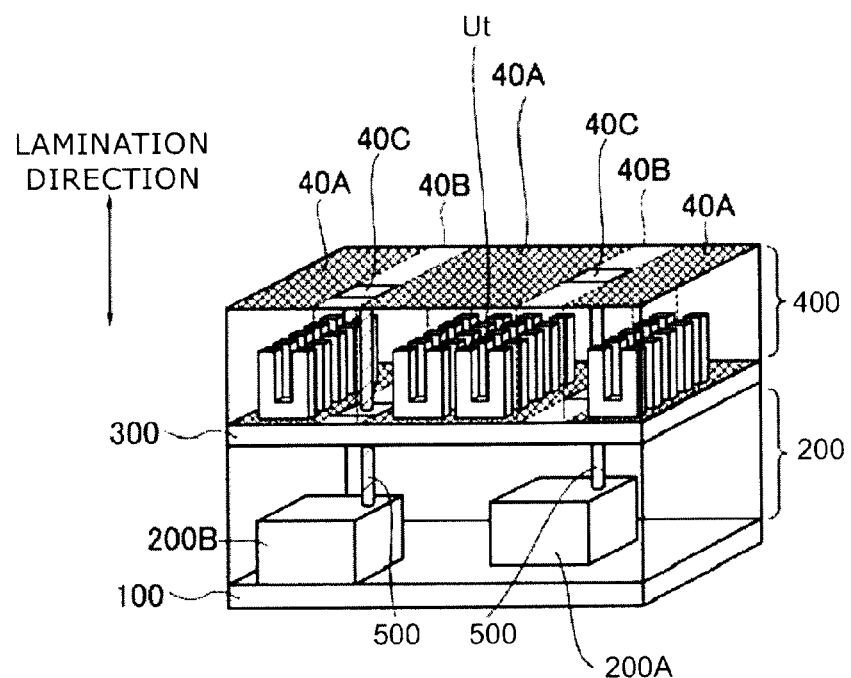
FIG. 1 is a schematic view of a nonvolatile semiconductor memory device according to a first embodiment of the invention;}

Embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described in regard to a drawing thereinabove are marked with like reference numerals, and a detailed description is omitted as appropriate.

FIRST EMBODIMENT

Schematic Configuration of a Nonvolatile Semiconductor Memory Device According to a First Embodiment FIG. 1 is a schematic view of a nonvolatile semiconductor memory device according to a first embodiment of the invention. As illustrated in FIG. 1, the nonvolatile semiconductor memory device according to the first embodiment includes a semiconductor substrate 100, a control circuit layer 200 sequentially formed on an upper portion of the semiconductor substrate 100, a support layer 300, and a memory cell array layer 400. The memory cell array layer 400 includes a memory cell array. The nonvolatile semiconductor memory device also includes an interconnection portion 500 that electrically connects the control circuit layer 200 and the memory cell array layer 400. The interconnection portion 500 passes through the support layer 300, extends into the memory cell array layer 400, and connects to the memory cell array.

The control circuit layer 200 functions as a control circuit that controls an operation of the memory cell array layer 400. The control circuit layer 200 includes a function that controls a voltage applied to a memory cell included in the memory cell array layer 400. The control circuit layer 200 includes, for example, a transfer transistor that transfers a high voltage from a row decoder to a word line of the memory cell. The control circuit layer 200 includes, for example, a row decoder unit 200A, a sense amplifier unit 200B, and the like. The row decoder unit 200A functions as a row decoder that drives an electrical potential of a word line WL (referring to FIG. 2A and FIG. 2B described below) provided in the memory cell array layer 400 to an "H" (high level) or an "L" (low level). The sense amplifier unit 200B functions as a sense amplifier that senses and amplifies a signal from a bit line BL (referring to FIG. 2A and FIG. 2B described below) of the memory cell array layer 400. In addition to the row decoder unit 200A and the sense amplifier unit 200B, the control circuit layer 200 may include, for example, a portion that functions as a column decoder and the like.

As illustrated in FIG. 1, the memory cell array layer 400 includes a first memory cell region 40A, a first non-memory cell region 40B, and a connection region 40C.

The first memory cell region 40A is a region including a memory unit Ut (memory cells MC) having a U-shaped 3D laminated cell structure. A memory cell array is formed by a collection of the memory units Ut. On the other hand, the non-memory cell region 40B is a region which does not include the memory unit Ut (the memory cells MC). The connection region 40C is regularly provided in a portion of the non-memory cell region 40B. The interconnection portion 500 formed in a layer below the memory cell array layer 400 to electrically connect the control circuit layer 200 and the memory cell array layer 400 is provided in (passes through) the connection region 40C.

(Circuit Configuration of the Memory Cell Array Layer 400 of the Nonvolatile Semiconductor Memory Device According to the First Embodiment)

A circuit configuration of the memory cell array layer 400 will now be described with reference to FIG. 2A. The memory cell array layer 400 is a so-called NAND flash memory.

Figure 2A:
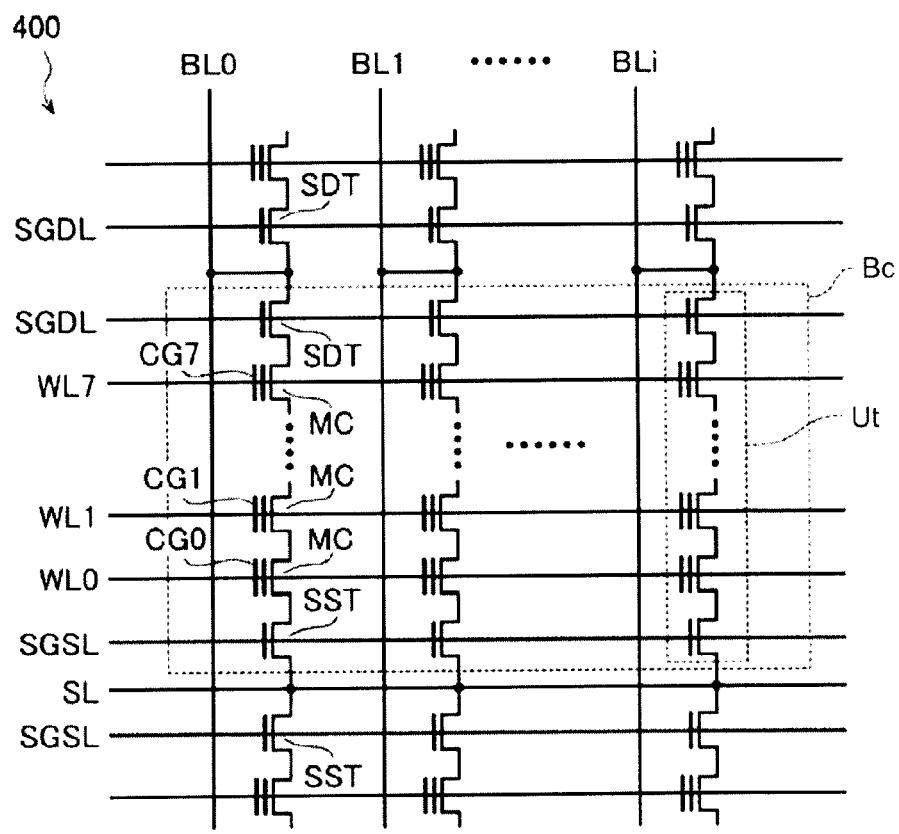
FIG. 2A is a circuit diagram of a memory array layer 400 according to the first embodiment.

As illustrated in FIG. 2A, the memory unit Ut, which is one erasing unit of data, includes multiple electrically reprogrammable memory cells MC connected in series, a source-side selection transistor SST connected in series on one end (a source side) thereof, and a drain-side selection transistor SDT connected in series on another end (a drain side) thereof. In the example illustrated in FIG. 2A, eight memory cells MC are connected in series and form one memory unit Ut. Although eight memory cells MC are used in FIG. 2A, it goes without saying that other numbers may be used.

Word lines WL0 to WL7 are connected to control gates CG0 to CG7 of memory cell transistors as the memory cells MC. A source-side selection gate line SGSL is connected to a gate terminal of the source-side selection transistor SST. A source line SL is connected to a source terminal of the source-side selection transistor SST. A drain-side selection gate line SGDL is connected to a gate terminal of the drain-side selection transistor SDT. Bit lines BL0 to BLi are connected to the drain terminals of the drain-side selection transistor SDT.

The source-side selection gate line SGSL is used to control an ON/OFF of the source-side selection transistor SST. The drain-side selection gate line SGDL is used to control an ON/OFF of the drain-side selection transistor SDT. The source-side selection transistor SST and the drain-side selection transistor SDT function as gates for supplying a prescribed electrical potential to the memory cells MC in the memory unit Ut when programming data, reading data, etc.

A memory block Bc includes multiple memory units Ut arranged in a row direction (the direction in which the word lines extend). Multiple memory cells MC connected to the same word line WL in one memory block Bc are handled as one page. Operations of programming data and reading data are executed for each page.

Multiple memory blocks Bc are arranged in a column direction (the direction in which the bit lines extend). The multiple memory blocks Bc are arranged to flip over in turn. In other words, a memory block Bc and a memory block Bc adjacent on one side thereto are disposed such that the drain-side selection transistors SDT face each other. The memory block Bc recited above and a memory block Bc adjacent on another side thereto are disposed such that the source-side selection transistors SST face each other.

(Schematic Configuration of the Memory Unit Ut of the Nonvolatile Semiconductor Memory Device According to the First Embodiment)

Figure 2B:
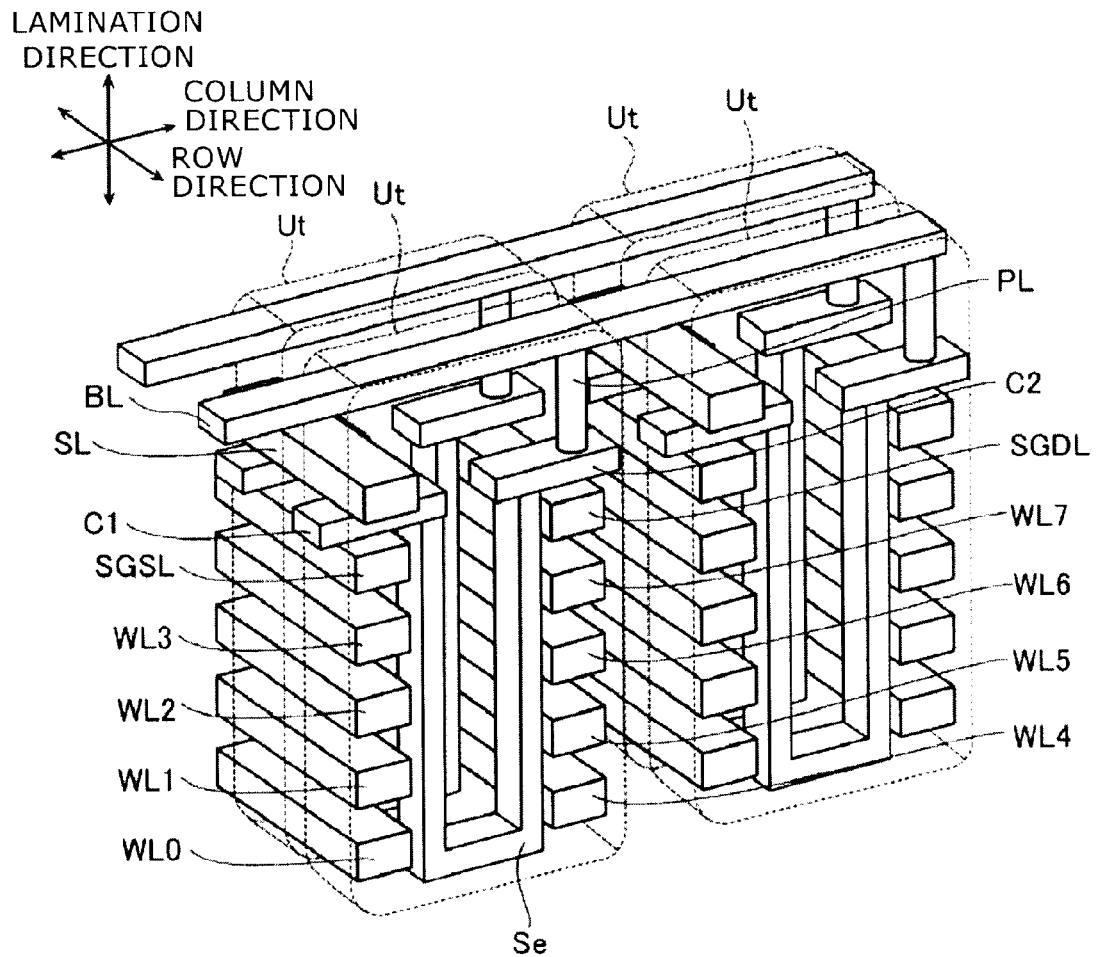
FIG. 2B is a schematic perspective view showing a memory unit Ut.

A schematic configuration of the memory unit Ut of the nonvolatile semiconductor memory device according to the first embodiment will now be described with reference to FIG. 2B. FIG. 2B is a schematic perspective view illustrating the memory unit Ut of the nonvolatile semiconductor memory device according to the first embodiment.

In the memory cell array layer 400 illustrated in FIG. 2B, the memory units Ut are disposed in a matrix configuration at prescribed pitches in the row direction and the column direction. The memory units Ut are illustrated in two rows and two columns in FIG. 2B as an example. The memory unit Ut includes the word lines WL0 to WL7, the source-side selection gate line SGSL, the drain-side selection gate line SGDL, a U-shaped semiconductor Se, a first contact electrode C1, and a second contact electrode C2.

The word lines WL0 to WL7 are formed in rectangular plate configurations extending in the row direction. The word lines WL0 to WL7 are shared with the multiple memory units Ut juxtaposed in the row direction. The word lines WL0 to WL3 are insulatively separated and laminated in order. The word lines WL4 to WL7 are insulatively separated and laminated in order. The word lines WL0 to WL3 and the word lines WL4 to WL7 are separated by a prescribed pitch in the column direction. The word line WL0 and the word line WL4 are formed in the same layer. The word line WL1 and the word line WL5 are formed in the same layer. The word line WL2 and the word line WL6 are formed in the same layer. The word line WL3 and the word line WL7 are formed in the same layer.

The source-side selection gate line SGSL and the drain-side selection gate line SGDL are formed in rectangular plate configurations extending in the row direction. The source-side selection gate line SGSL and the drain-side selection gate line SGDL are shared by the multiple memory units Ut juxtaposed in the row direction. The source-side selection gate line SGSL is formed in a layer above the word line WL3 and is insulatively separated. The drain-side selection gate line SGDL is formed in a layer above the word line WL7 and is insulatively separated. The source-side selection gate line SGSL and the drain-side selection gate line SGDL are formed in the same layer.

The U-shaped semiconductor Se is provided in each memory unit Ut. The U-shaped semiconductor Se is formed in a U-shape as viewed from the row direction. The U-shaped semiconductor Se is provided between the word lines WL0 to WL3, and the word lines WL4 to WL7, and between the source-side selection gate line SGSL on one side and the drain-side selection gate line SGDL on the other side.

A charge storage layer that can store a charge is provided between a side portion of the U-shaped semiconductor Se and the word lines WL0 to WL3, and between a side portion of the U-shaped semiconductor Se and the word lines WL4 to WL7. By such a configuration, the side portions of the U-shaped semiconductor Se form memory cells MC0 to MC7 with the word lines WL0 to WL7.

Insulating layers are provided between the side portion of the U-shaped semiconductor Se and the source-side selection gate line SGSL, and between the side portion of the U-shaped semiconductor Se and the drain-side selection gate line SGDL. By such a configuration, the side portion of the U-shaped semiconductor Se forms a source-side selection transistor SST with the source-side selection gate line SGSL;

and the side portion of the U-shaped semiconductor Se forms the drain-side selection transistor SDT with the drain-side selection gate line SGDL.

The first contact electrode C1 is provided in each memory unit Ut. The first contact electrode C1 is formed in a layer above the source-side selection gate line SGSL to contact one upper edge of each U-shaped semiconductor Se.

The second contact electrode C2 is provided in each memory unit Ut. The second contact electrode C2 is formed in a layer above the drain-side selection gate line SGDL to contact the other upper edge of each U-shaped semiconductor Se.

The source line SL is formed on an upper face of the first contact electrode C1. The source line SL is formed to extend in the row direction similarly to the word lines WL0 to WL7. The source line SL is shared by the multiple memory units Ut juxtaposed in the row direction.

A plug line PL having a pillar configuration extending into an upper layer is formed on an upper face of the second contact electrode C2. The bit line BL extending in the column direction is formed on an upper portion of the plug line PL. The bit line BL is shared by the multiple memory units Ut juxtaposed in the column direction.

(Specific Configuration of the Nonvolatile Semiconductor Memory Device According to the First Embodiment)

A specific configuration of the nonvolatile semiconductor memory device according to the first embodiment will now be described with reference to FIG. 3 to FIG. 12. The extension direction of the bit lines BL described above is the column direction; and the extension direction of the source lines SL described above is the row direction. In the description, it is assumed that inter-layer insulating layers exist in regions not illustrated in FIG. 3 to FIG. 12.

Figure 3:
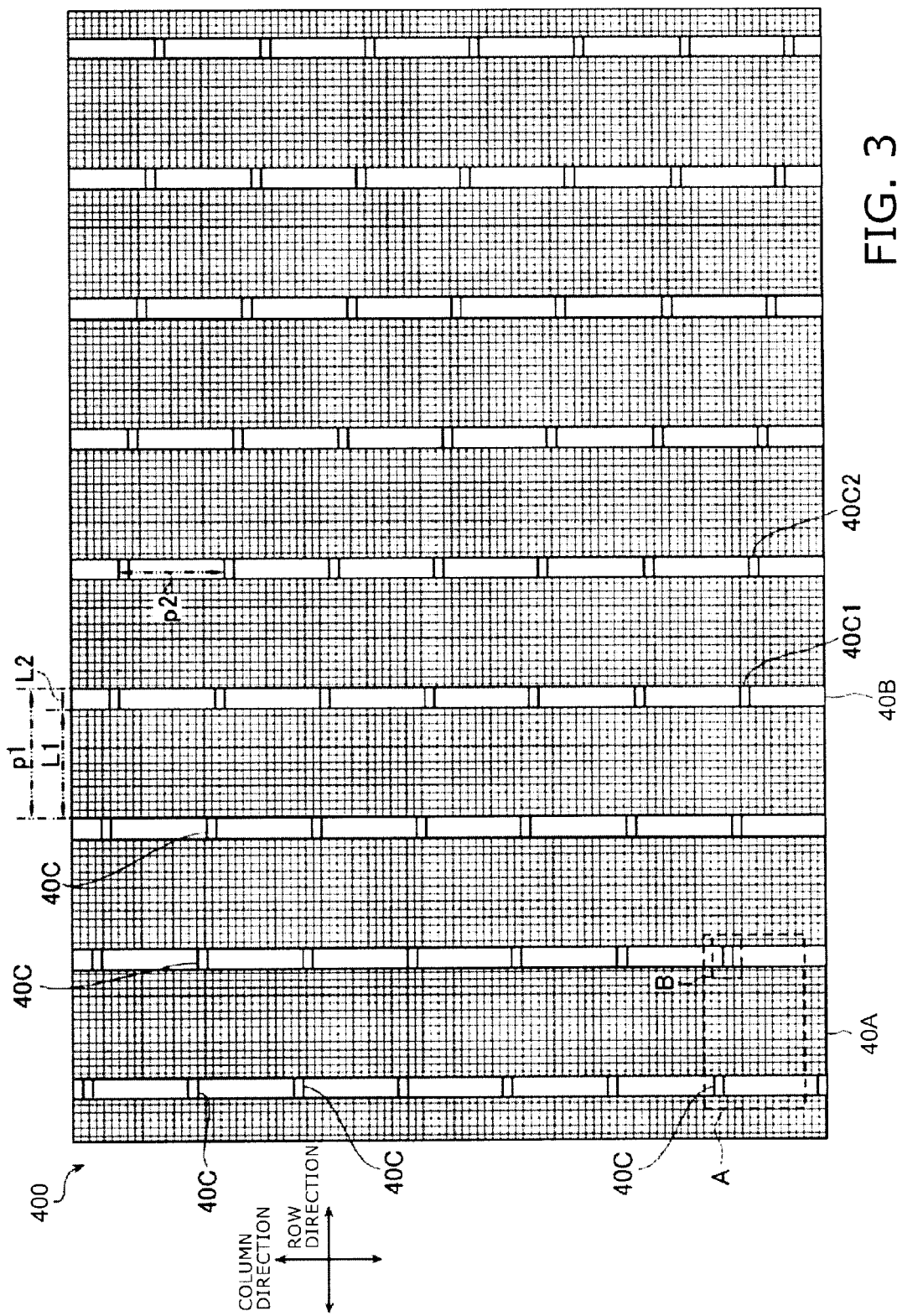
FIG. 3 is a schematic top view of the memory cell array layer 400 of the nonvolatile semiconductor memory device according to the first embodiment.
Figure 4:
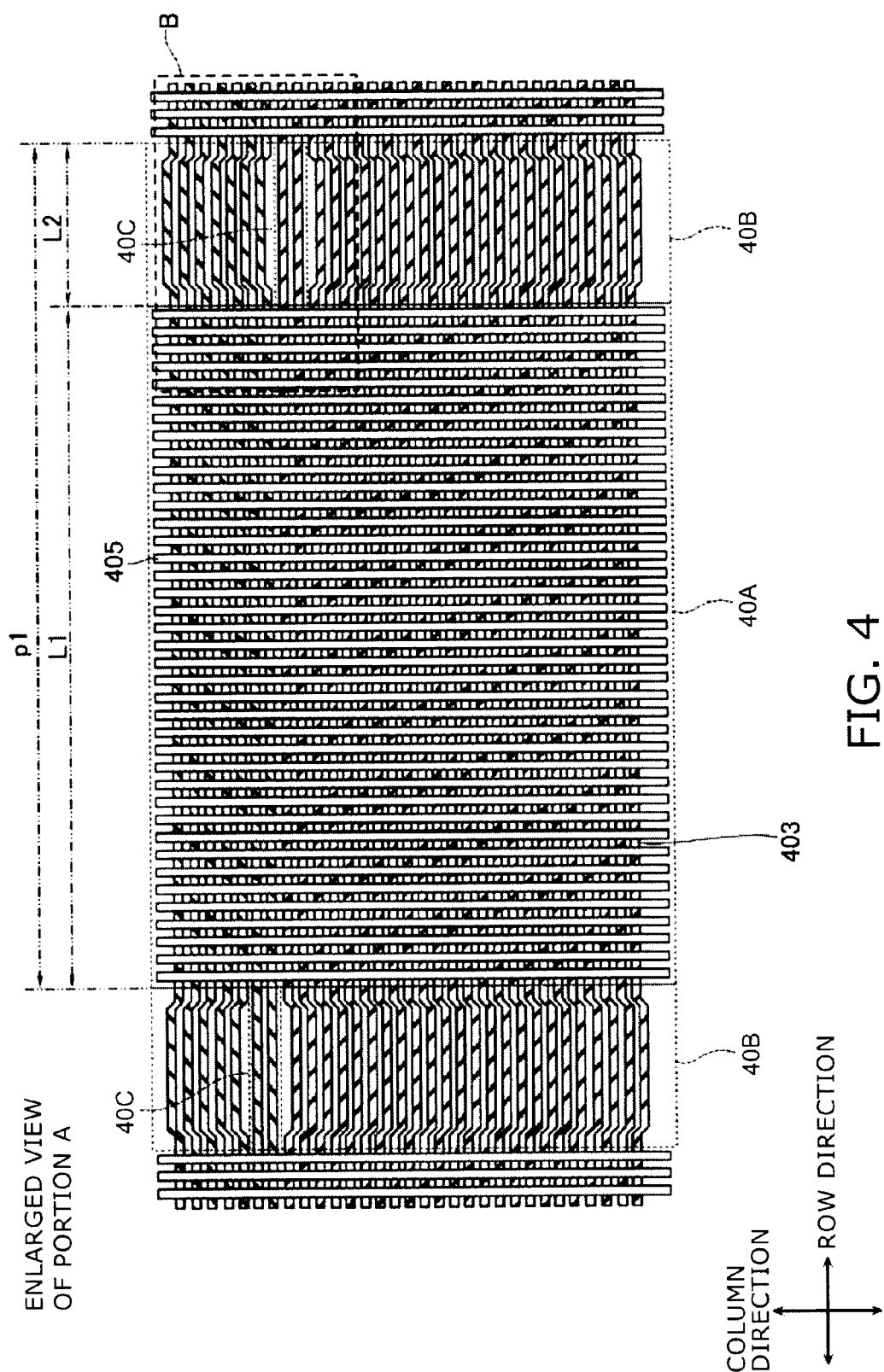
FIG. 4 is an enlarged view of the portion A of FIG. 3.
Figure 5:
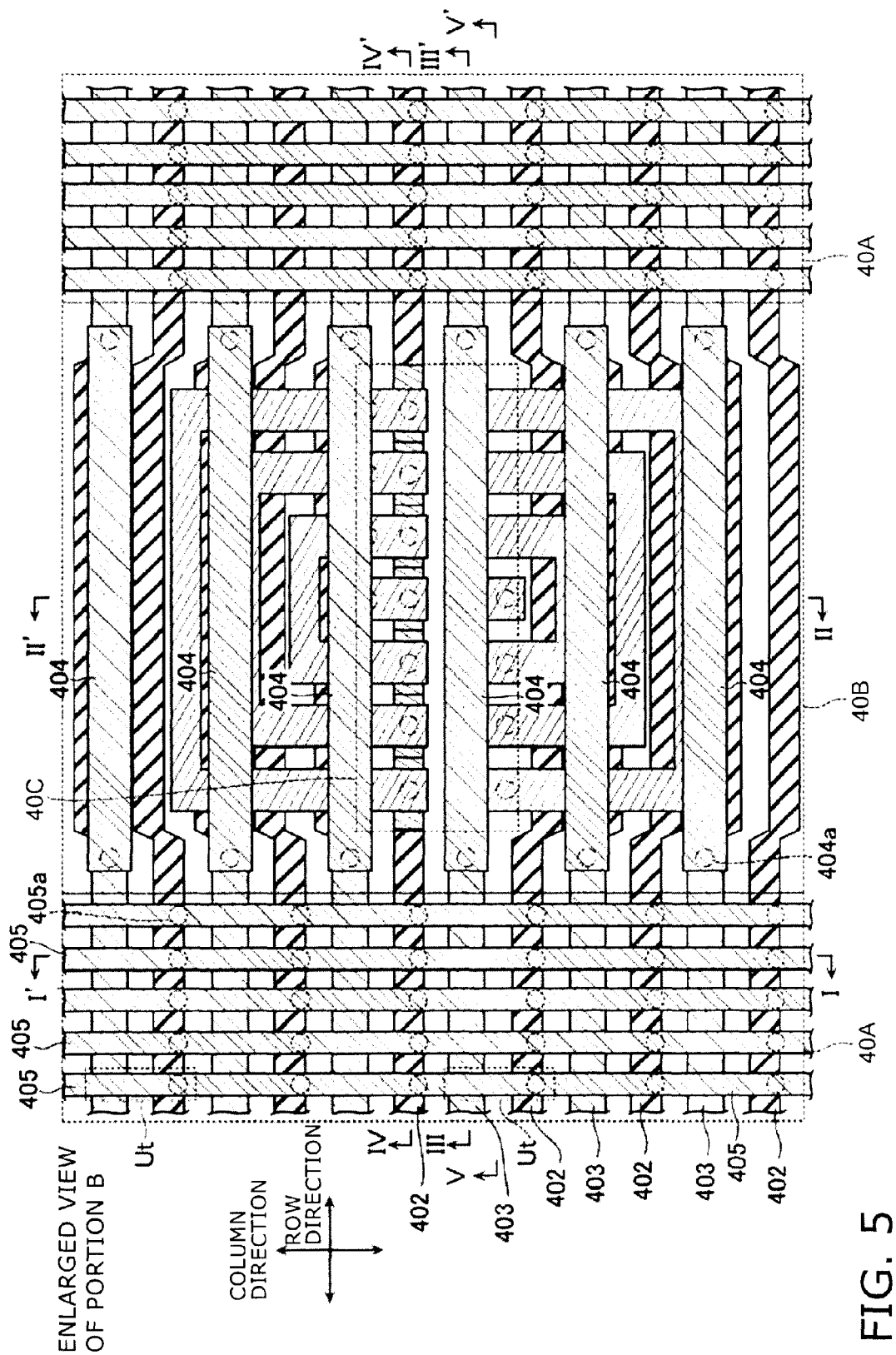
FIG. 5 is an enlarged view of the portion B of FIG. 3.
Figure 6:
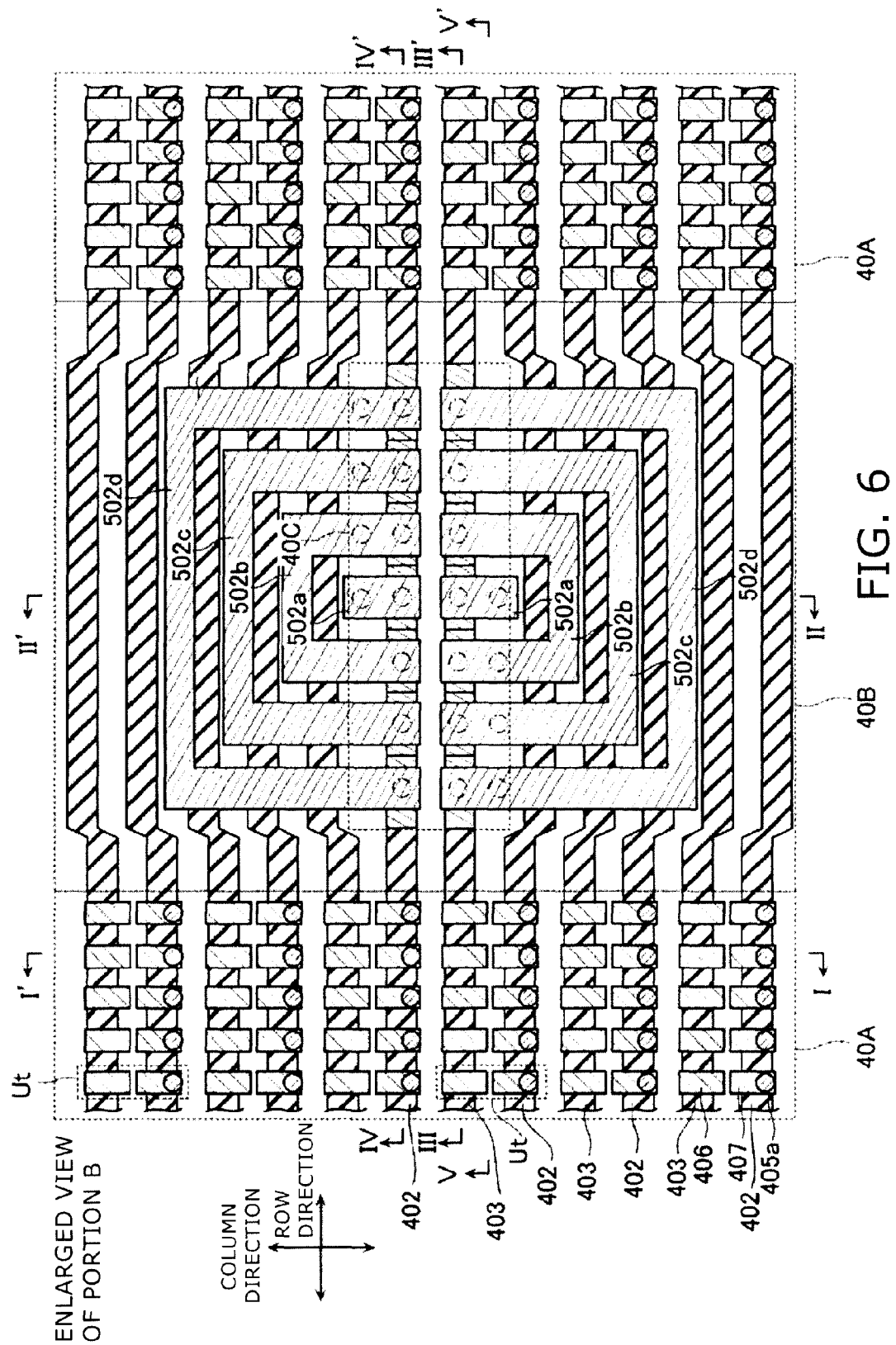
FIG. 6 and FIG. 7 are views of FIG. 5 minus omitted portions.
Figure 7:
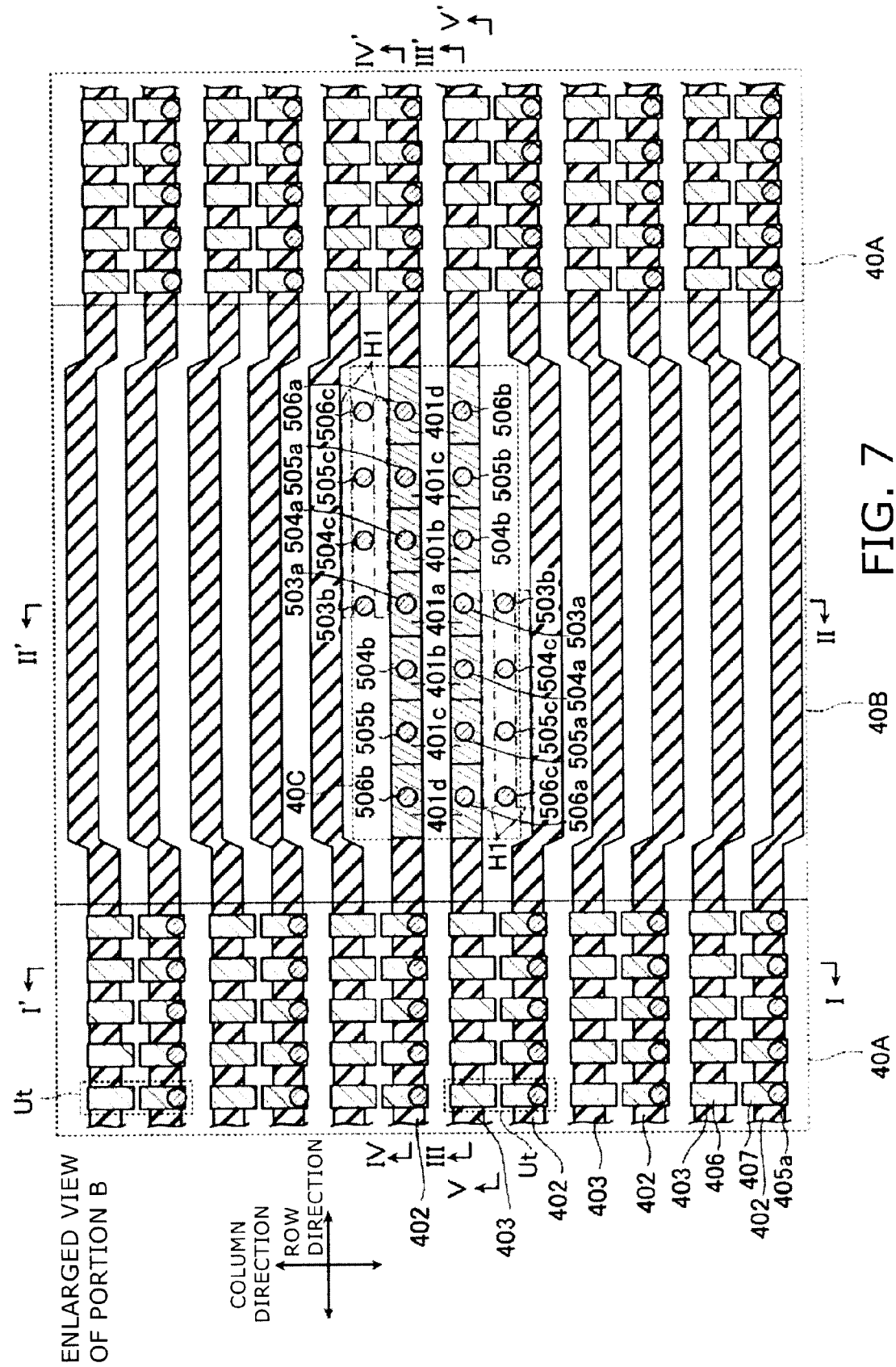

FIG. 3 is a schematic top view of the memory cell array layer 400 of the nonvolatile semiconductor memory device according to the first embodiment of the invention. FIG. 4 is an enlarged view of the portion A of FIG. 3. FIG. 5 is an enlarged view of the portion B of FIG. 3. FIG. 6 and FIG. 7 are views of FIG. 5 minus omitted portions. For details, a first source line conductive layer 403, a second source line conductive layer 404, and a bit line conductive layer 405, to be described below, are omitted in FIG. 6. In FIG. 7, the first source line conductive layer 403, the second source line conductive layer 404, the bit line conductive layer 405, and an upper interconnection layer 502, to be described below, are omitted from FIG. 5. FIG. 8 to FIG. 12 are cross-sectional views along lines I-I' to V-V' of FIG. 5.

Figure 10:
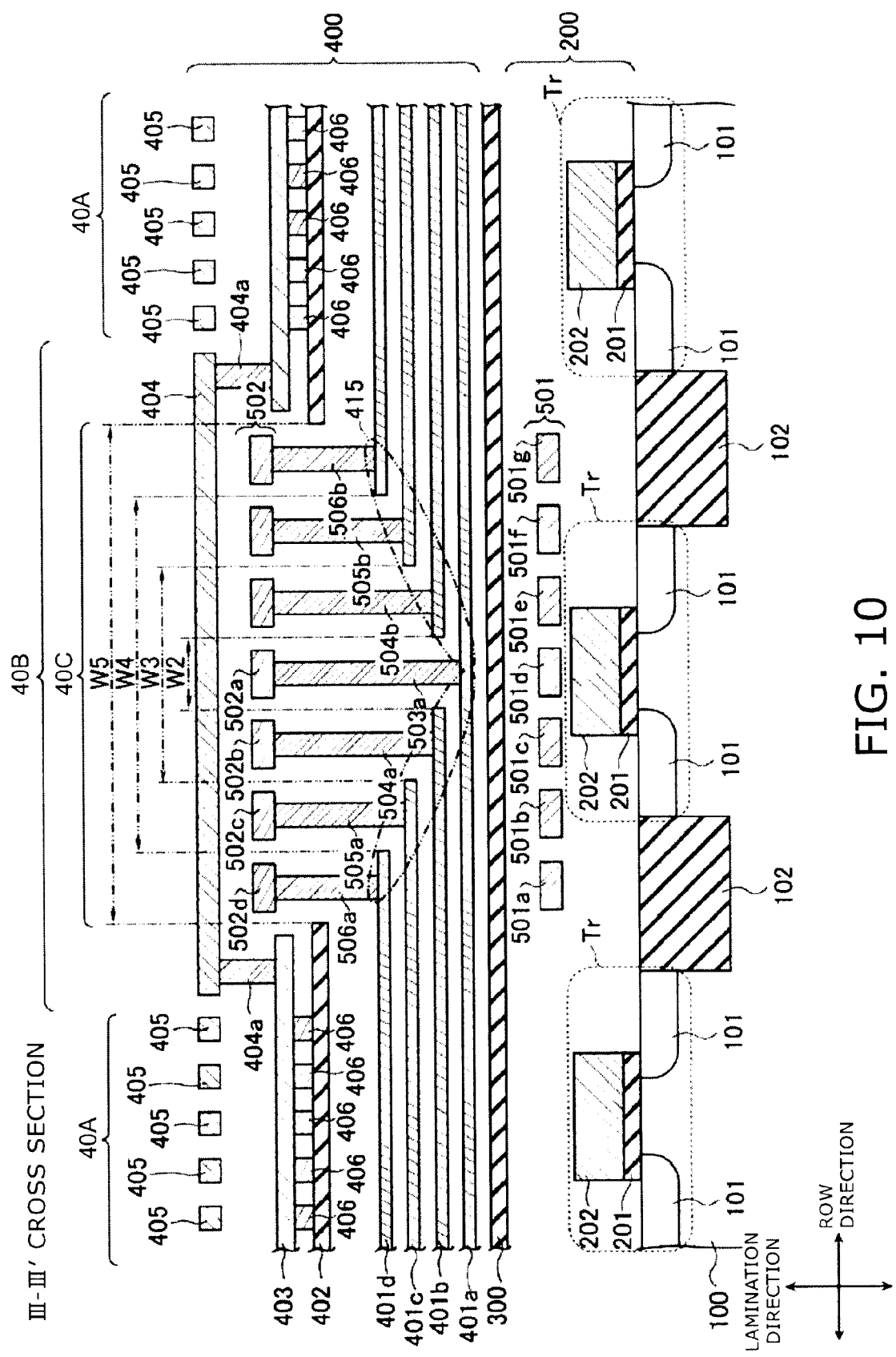
FIG. 10 is a cross-sectional view along the line III-III' of FIG. 5.
Figure 11:
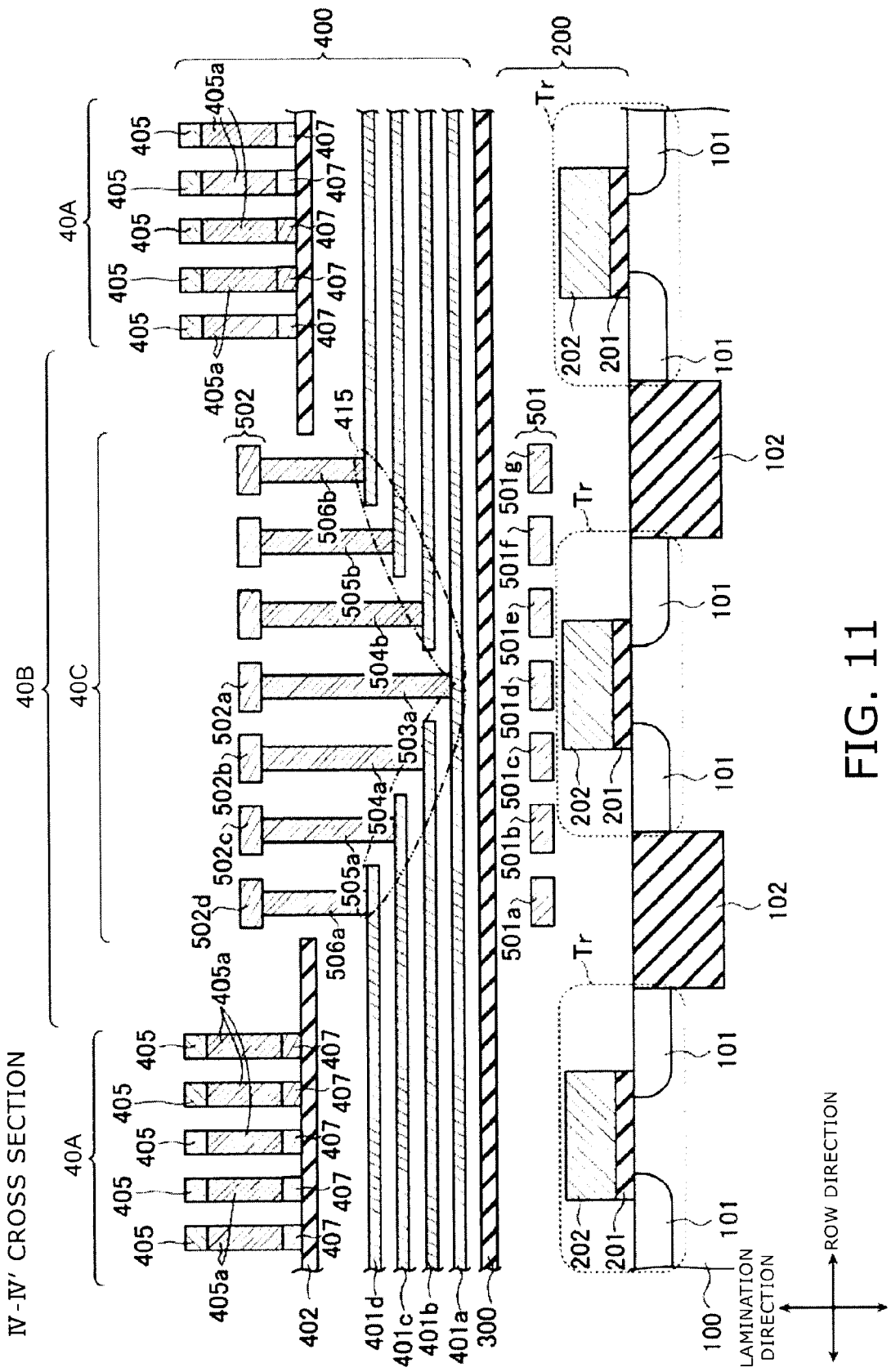
FIG. 11 is a cross-sectional view along the line IV-IV' of FIG. 5.
Figure 12:
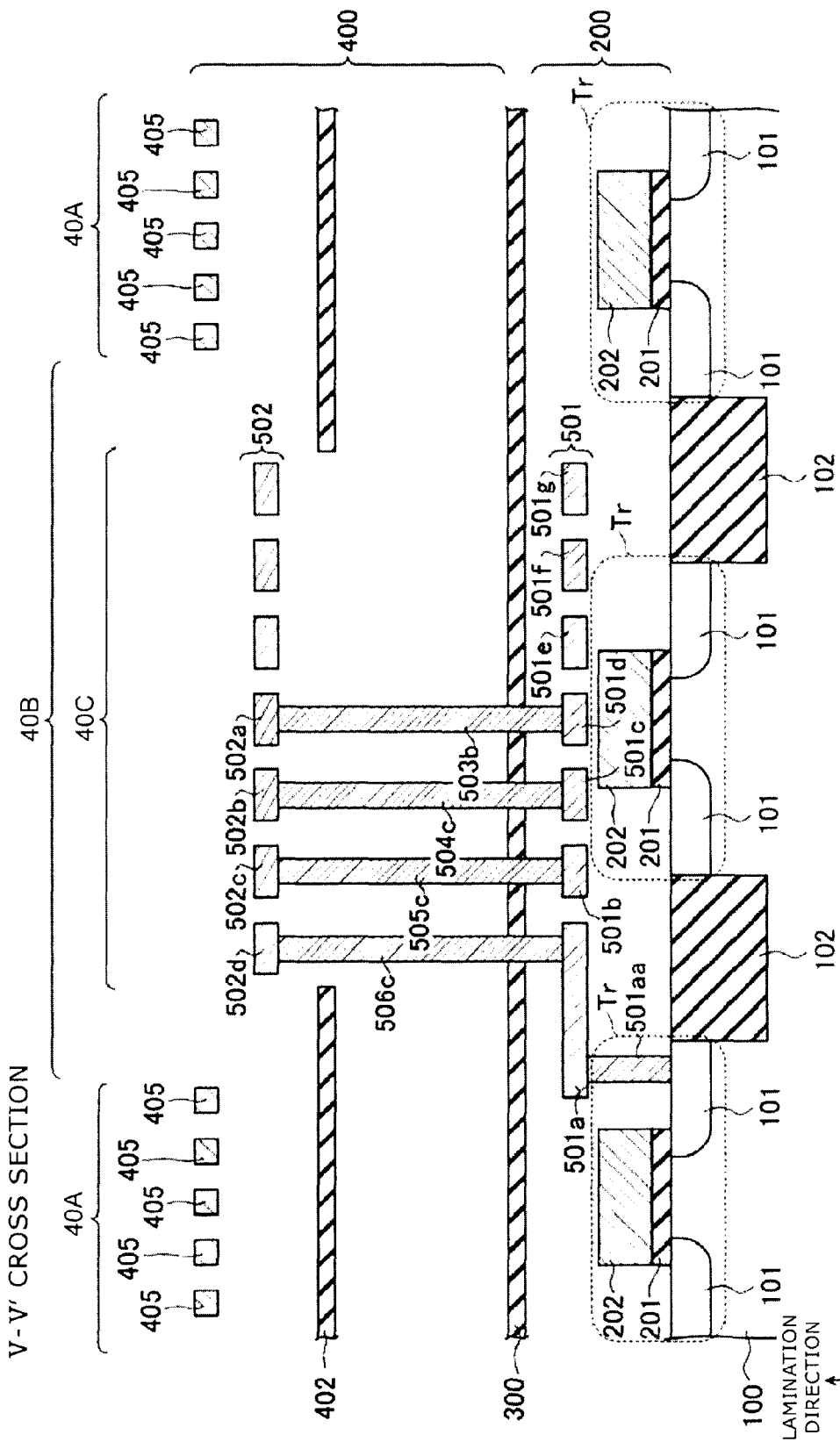
FIG. 12 is a cross-sectional view along the line V-V' of FIG. 5.

First, the specific configurations of the semiconductor substrate 100 and the control circuit layer 200 will be described. The semiconductor substrate 100 includes silicon (Si). The surface of the semiconductor substrate 100 includes diffusion layers 101 formed at a prescribed spacing as illustrated in FIG. 10 to FIG. 12. The diffusion layers 101 include p-type or n-type impurity ions implanted into the semiconductor substrate 100. The semiconductor substrate 100 also includes an element separation insulating layer 102 that insulates between the diffusion layers 101.

As illustrated in FIG. 10 to FIG. 12, the control circuit layer 200 includes a gate insulating layer 201 and a gate conductive layer 202. The gate insulating layer 201 is formed to straddle the upper faces of a pair of adjacent diffusion layers 101. The gate conductive layer 202 is formed to contact an upper face of the gate insulating layer 201. The gate insulating layer 201 includes silicon oxide ($SiO_2$). The gate conductive layer 202 includes polysilicon (p-Si).

In other words, the gate conductive layer 202 and the diffusion layers 101 of the control circuit layer 200 form a high voltage transistor Tr having the gate conductive layer 202 as a control gate and the diffusion layers 101 as a source and a drain. The high voltage transistor Tr is, for example, the transfer gate transistor described above. The high voltage transistor Tr is used in the row decoder unit 200A, the sense amplifier unit 200B, and the like described above. The high voltage transistor Tr is connected as a transfer gate transistor to first to fourth word line conductive layers 401a to 401d described below via the interconnection portion 500 (FIG. 1). As illustrated in FIG. 9 to FIG. 12, the interconnection portion 500 includes a lower interconnection layer 501, an upper interconnection layer 502, a first connection plug layer 503a, a second connection plug layer 503b, first connection plug layers 504a and 504b, a second connection plug layer 504c, first connection plug layers 505a and 505b, a second connection plug layer 505c, first connection plug layers 506a and 506b, and a second connection plug layer 506c. The details of the configuration of the interconnection portion 500 are described below.

As illustrated in FIG. 8 to FIG. 12, the support layer 300 is formed on a portion above the control circuit layer 200 via an insulating layer of a prescribed thickness. The support layer 300 includes, for example, aluminum oxide ($Al_2O_3$).

As described above, the memory cell array layer 400 includes the first memory cell region 40A, the first non-memory cell region 40B, and the connection region 40C.

As described above, the first memory cell region 40A is a region including the memory cell MC. On the other hand, the non-memory cell region 40B is a region which does not include a memory cell MC. The connection region 40C is regularly provided in a portion of the first non-memory cell region 40B. The interconnection portion 500 (FIG. 1) formed in a layer below the memory cell array layer 400 to electrically connect the control circuit layer 200 and the memory cell array layer 400 is provided in (passes through) the connection region 40C.

Specifically, as illustrated in FIG. 3 and FIG. 4, the first memory cell region 40A is repeatedly formed at a first pitch p1 in the row direction. The first memory cell region 40A is formed having a first length L1 (L1<p1) in the row direction. The non-memory cell region 40B is formed between the first memory cell regions 40A and has a second length L2 (L2=p1−L1) in the row direction. Restating the configuration recited above, the first memory cell region 40A and the non-memory cell region 40B are repeatedly and alternately provided in the row direction.

The connection region 40C is provided in the non-memory cell region 40B at the first pitch p1 in the row direction. Additionally, the connection region 40C is formed at a second pitch p2 in the column direction. Connection regions 40C that are adjacent in the row direction (for example, 40C1 and 40C2 of FIG. 3) are formed at different positions in the column direction (being shifted in the column direction to not juxtapose in the row direction).

In the first memory cell region 40A, the source line SL and the word line WL are disposed such that the longitudinal directions thereof are in the row direction; the bit line BL is disposed such that the longitudinal direction thereof is in the column direction; and the memory unit Ut is formed at an intersection of the word lines WL0 to WL7 and the bit line BL.

By such a formation pattern of the connection region 40C in the memory cell array layer 400, the interconnection portion 500 can be provided without being limited to the end portions of the memory cell array layer 400. Further, the connection region 40C is formed at different positions in the column direction. Therefore, the interconnection portion 500 can be provided uniformly to the word lines WL0 to WL7 juxtaposed in the column direction without a complex interconnection layout pattern.

As illustrated in FIG. 5 to FIG. 12, the memory cell array layer 400 includes the first to fourth word line conductive layers (first conductive layers) 401a to 401d which form the word lines WL0 to WL7 from the lower layer to the upper layer, the word line upper insulating layer 402, and the first source line conductive layer (a second conductive layer) 403 as the source line SL. The memory cell array layer 400 also includes the second source line conductive layer (a third conductive layer) 404 as the source line SL in a layer above the first source line conductive layer 403, and the bit line conductive layer (a fourth conductive layer) 405 as the bit line BL.

As illustrated in FIG. 8 to FIG. 12, the first to fourth word line conductive layers 401a to 401d and the word line upper insulating layer 402 are formed to extend in the row direction. The first to fourth word line conductive layers 401a to 401d and the word line upper insulating layer 402 are formed in plate configurations having similar widths in the column direction. The first to fourth word line conductive layers 401a to 401d and the word line upper insulating layer 402 are laminated via inter-layer insulating layers therebetween such that the end portions in the column direction are aligned. Also, the first to fourth word line conductive layers 401a to 401d and the word line upper insulating layer 402 are arranged at a prescribed pitch in the column direction.

As illustrated in FIG. 7, the first to fourth word line conductive layers 401a to 401d and the word line upper insulating layer 402 are formed in straight-line configurations in the row direction in the first memory cell regions 40A juxtaposed in the row direction. However, as illustrated in FIG. 7, the first to fourth word line conductive layers 401a to 401d and the word line upper insulating layer 402 are formed to curve in the column direction to avoid the connection region 40C in the non-memory cell regions 40B adjacent to the connection region 40C in the column direction. In other words, the first to fourth word line conductive layers 401a to 401d and the word line upper insulating layer 402 are curved symmetrically around the connection region 40C. Although only the word line upper insulating layer 402 is illustrated in FIG. 7, the first to fourth word line conductive layers 401a to 401d also curve in the layers therebelow similarly to the word line upper insulating layer 402.

As illustrated in FIG. 10, the first to fourth word line conductive layers 401a to 401d and the word line upper insulating layer 402 include a stairstep portion 415 formed in a stairstep configuration in the connection region 40C. In other words, the second to fourth word line conductive layers 401b to 401d and the word line upper insulating layer 402 are cut across prescribed lengths W2 to W5 (W2<W3<W4<W5) in the row direction, centered around the row-direction center of the connection region 40C.

The first to fourth word line conductive layers 401a to 401d include polysilicon (p-Si). The word line upper insulating layer 402 includes silicon oxide ($SiO_2$).

The first source line conductive layer 403 is electrically connected to one end of a U-shaped portion of a U-shaped semiconductor layer 413 (the U-shaped semiconductor Se of the memory unit Ut) described below. As illustrated in FIG. 5, the first source line conductive layer 403 is provided in the first memory cell region 40A. The first source line conductive layer 403 is provided in a layer above a 2 nth (or a (2n+1)th) word line upper insulating layer 402 (a layer above the first to fourth word line conductive layer 401a to 401d) juxtaposed in the column direction, where n is a natural number. The first source line conductive layer 403 is provided at intervals with respect to the word line upper insulating layer 402 juxtaposed in the column direction. The first source line conductive layer 403 has a width substantially equivalent to that of the word line upper insulating layer 402 in the column direction and is formed in a rectangular plate configuration extending in the row direction.

The first source line conductive layer 403 includes polysilicon (p-Si).

The second source line conductive layer 404 is electrically connected to one end of the U-shaped portion of the U-shaped semiconductor layer 413 (the U-shaped semiconductor Se of the memory unit Ut) via the first source line conductive layer 403. As illustrated in FIG. 5, the second source line conductive layer 404 is provided in a region (including the non-memory cell region 40B and the connection region 40C) to straddle the first memory cell regions 40A adjacent in the row direction. The second source line conductive layer 404 is formed at a position to match the first source line conductive layers 403 in the column direction to extend in the row direction in a layer above the first source line conductive layer 403. The second source line conductive layer 404 has a width substantially equivalent to the word line upper insulating layer 402 in the column direction and is formed in a rectangular plate configuration extending in the row direction. The second source line conductive layer 404 is formed such that both row-direction ends thereof match the row-direction end portions of the first source line conductive layer 403 as viewed from above. Both row-direction ends of the second source line conductive layer 404 are connected to the row-direction end portions of the two first source line conductive layers 403 juxtaposed in the row direction on either side of the non-memory cell region 40B via the source line connection plug layer 404a (referring to FIG. 5 and FIG. 10).

In other words, the first source line conductive layer 403 (the second conductive layer) extends in the row direction in a layer above the first to fourth word line conductive layers 401a to 401d (the first conductive layers) in the first memory cell region 40A.

The second source line conductive layer 404 (the third conductive layer) extends in the row direction (the first direction) in a layer above the first source line conductive layer 403 in a region between the first memory cell regions 40A mutually adjacent in the row direction. The position of the second source line conductive layer 404 in the column direction (the second direction) matches the position of the first source line conductive layer 403 in the column direction.

The bit line conductive layer (the fourth conductive layer) 405 extends in the column direction in the first memory cell region 40A.

The second source line conductive layer 404 includes polysilicon (p-Si). The source line connection plug layer 404a includes tungsten (W) and the like.

The bit line conductive layer 405 is electrically connected to the other end of the U-shaped semiconductor layer 413 (the U-shaped semiconductor Se of the memory unit Ut). As illustrated in FIG. 5 and FIG. 10 to FIG. 12, the bit line conductive layer 405 is provided in the first memory cell region 40A. The bit line conductive layer 405 is formed at a prescribed pitch in the row direction. Restated, the bit line conductive layer 405 is formed in a striped configuration extending in the column direction and repeatedly provided in the row direction. A bit line plug layer 405a is provided below the bit line conductive layer 405 to extend downward. The bit line plug layer 405a is formed such that a lower face thereof is connected to a second contact layer 407 (referring to FIG. 8) described below.

The bit line conductive layer 405 includes polysilicon (p-Si). The bit line conductive layer 405 functions as the bit line BL described above. The bit line plug layer 405a includes tungsten (W) and the like.

As illustrated in FIG. 5 to FIG. 8, a pair of the first to fourth word line conductive layers 401a to 401d adjacent in the column direction in the first memory cell region 40A of the memory cell array layer 400 form the memory unit Ut described above with a configuration described below.

Figure 8:
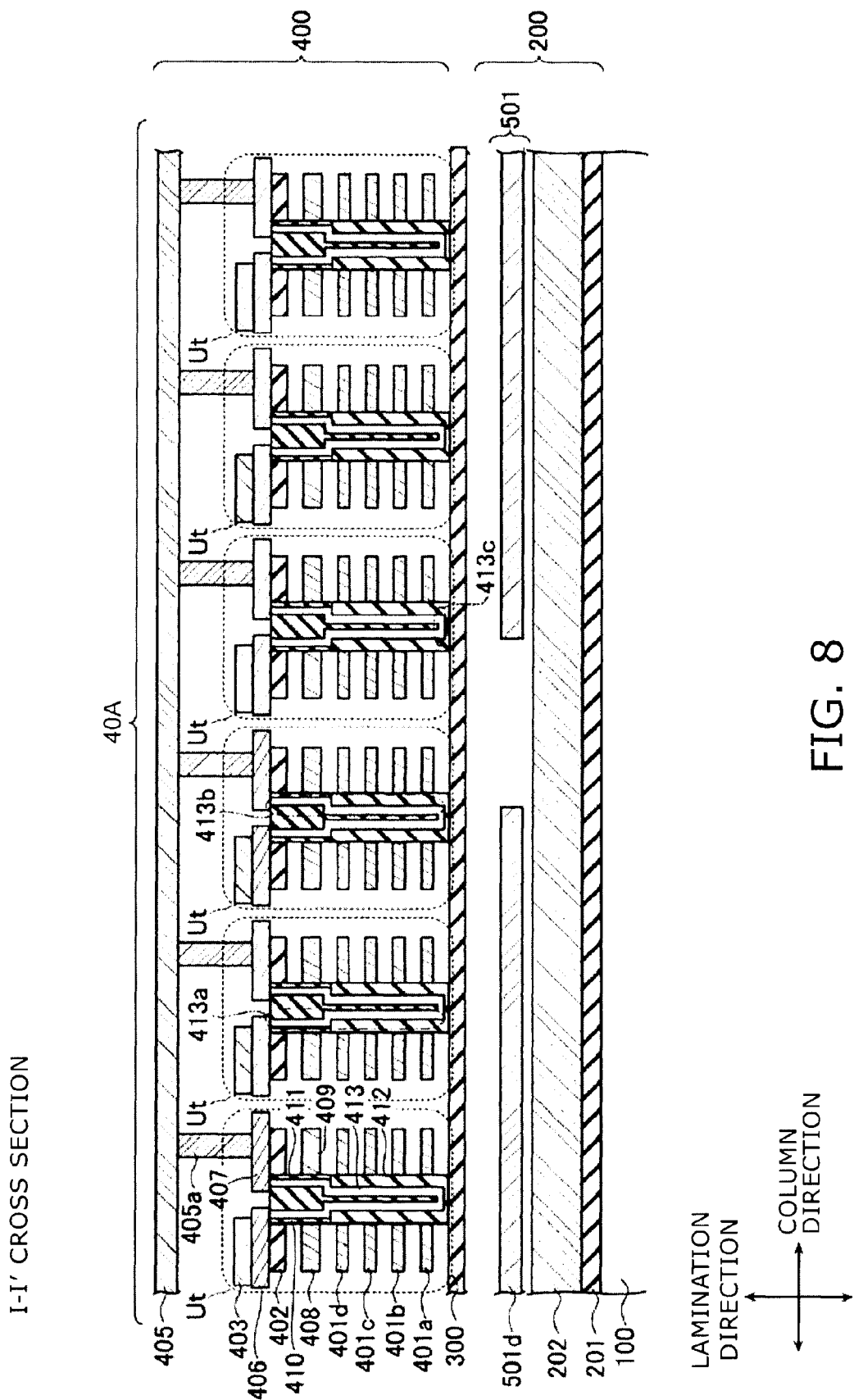
FIG. 8 is a cross-sectional view along the line I-I' of FIG. 5.

In addition to the first to fourth word line conductive layers 401a to 401d, the memory unit Ut includes a first contact layer 406, a second contact layer 407, a source side gate conductive layer 408, a drain side gate conductive layer 409, a source side gate insulating layer 410, a drain side gate insulating layer 411, a memory gate insulating layer 412, and a U-shaped semiconductor layer 413 as illustrated in FIG. 8. The first contact layer 406 functions as the first contact electrode C1 described above. The second contact layer 407 functions as the second contact electrode C2 described above. The source side gate conductive layer 408 functions as the source-side selection gate line SGSL described above. The drain side gate conductive layer 409 functions as the drain-side selection gate line SGDL described above. The U-shaped semiconductor layer 413 functions as the U-shaped semiconductor Se described above.

The first contact layer 406 and the second contact layer 407 are formed on an upper face of the word line upper insulating layer 402 in the first memory cell region 40A. The first contact layer 406 is formed to contact a lower face of the first source line conductive layer 403. The second contact layer 407 is formed to contact the bit line plug layer 405a. The first contact layer 406 and the second contact layer 407 include polysilicon (p-Si).

The source side gate conductive layer 408 and the drain side gate conductive layer 409 are formed substantially similarly to the first to the fourth word line conductive layers 401a to 401d. That is, the source side gate conductive layer 408 and the drain side gate conductive layer 409 have prescribed widths in the column direction and are formed to extend in the row direction. The source side gate conductive layer 408 and the drain side gate conductive layer 409 also are formed at a prescribed pitch in the column direction. The source side gate conductive layer 408 is formed between the word line upper insulating layer 402 positioned below the first contact layer 406 and the fourth word line conductive layer 401d via inter-layer insulating layers. The drain side gate conductive layer 409 is formed between the word line upper insulating layer 402 positioned below the second contact layer 407 and the fourth word line conductive layer 401d via inter-layer insulating layers. The source side gate conductive layer 408 and the drain side gate conductive layer 409 include polysilicon (p-Si).

The source side gate insulating layer 410 is formed on one side face of the source side gate conductive layer 408 on the column direction side. The drain side gate insulating layer 411 is formed on one side face of the drain side gate conductive layer 409 on the column direction side facing the source side gate conductive layer 408 via the U-shaped semiconductor layer 413 and an inter-layer insulating layer. The source side gate insulating layer 410 and the drain side gate insulating layer 411 include silicon oxide ($SiO_2$).

The memory gate insulating layer 412 is formed below the source side gate insulating layer 410 and below the drain side gate insulating layer 411. The memory gate insulating layer 412 is formed on side faces of the first to fourth word line conductive layers 401a to 401d. The memory gate insulating layer 412 includes highly dielectric and insulating films such as, for example, aluminum oxide ($Al_2O_3$), silicon nitride (SiN), and silicon oxide ($SiO_2$) laminated from the side face of the first to fourth word line conductive layers 401a to 401d. The memory gate insulating layer 412 functions as a charge storage layer that stores a charge in silicon nitride (SiN) according to an applied voltage.

The U-shaped semiconductor layer 413 is formed in a U-shape as viewed from the row direction. The U-shaped semiconductor layer 413 is formed to contact the word line upper insulating layer 402, a side face of the source side gate insulating layer 410, a side face of the drain side gate insulating layer 411, and a side face of the memory gate insulating layer 412. In other words, the U-shaped semiconductor layer 413 includes a first columnar portion 413a, a second columnar portion 413b, and a lower end portion 413c. The first columnar portion 413a is formed to extend downward from a lower face of the first contact layer 406 to contact the side faces of the fourth to first word line conductive layers 401d to 401a. The second columnar portion 413b is formed to extend downward from a lower face of the second contact layer 407 to contact the side faces of the fourth to first word line conductive layers 401d to 401a. The lower end portion 413c is formed to connect a lower end of the first columnar portion 413a and a lower end of the second columnar portion 413b. The U-shaped semiconductor layer 413 includes polysilicon (p-Si) or monocrystalline silicon.

The interconnection portion 500 has a configuration that connects the stairstep portion 415 of the first to fourth word line conductive layers 401a to 401d to the control circuit layer 200. As illustrated in FIG. 6 and FIG. 9 to FIG. 12, the interconnection portion 500 includes the lower interconnection layer 501 and the upper interconnection layer 502. The lower interconnection layer 501 includes polysilicon (p-Si), tungsten (W), or the like. The upper interconnection layer 502 includes tungsten (W) or the like.

As illustrated in FIG. 9 to FIG. 12, the lower interconnection layer 501 is formed in the control circuit layer 200. The lower interconnection layer 501 is formed in a layer above the gate conductive layer 202 and in a layer below the support layer 300 via inter-layer insulating layers. The lower interconnection layer 501 includes first to seventh lower interconnection layers 501a to 501g. Each of the first to seventh lower interconnection layers 501a to 501g is insulatively separated by an inter-layer insulating layer. A portion of each of the first to seventh lower interconnection layers 501a to 501g is formed to be positioned in a layer above the diffusion layer 101. The first to seventh lower interconnection layers 501a to 501g are formed in the non-memory cell region 40B to extend in the column direction at a prescribed pitch in the row direction.

As illustrated in FIG. 12, a connection plug layer 501aa is provided on a lower face of the first lower interconnection layer 501a to extend downward from the lower face. The lower face of the connection plug layer 501aa is formed to contact the diffusion layer 101. Connection plug layers are provided on lower faces of the other second to seventh lower interconnection layers 501b to 501g to extend downward from the lower faces. Similarly, the lower faces of these connection plug layers are formed to contact diffusion layers 101 (not illustrated).

As illustrated in FIG. 6 and FIG. 9 to FIG. 12, the upper interconnection layer 502 is formed in the first non-memory cell region 40B of the memory cell array layer 400. The upper interconnection layer 502 includes first to fourth upper interconnection layers 502a to 502d.

As illustrated in FIG. 6, the first upper interconnection layer 502a is formed in a rectangular plate configuration extending in the column direction as viewed from above. One longitudinal-direction end of the first upper interconnection layer 502a is formed to match a portion of the stairstep portion 415 of the first word line conductive layer 401a (a region in which the second to fourth word line conductive layers 401b to 401d and the word line upper insulating layer 402 are cut) from above.

As illustrated in FIG. 6, FIG. 7, and FIG. 9 to FIG. 12, a first connection plug layer 503a and a second connection plug layer 503b are provided on a lower face of the first upper interconnection layer 502a. The first connection plug layer 503a is formed on one end side of the first upper interconnection layer 502a. The first connection plug layer 503a is formed to extend downward in the lamination direction to contact an upper face of the first word line conductive layer 401a. The second connection plug layer 503b is formed on the other end side of the first upper interconnection layer 502a. The second connection plug layer 503b is formed to extend downward in the lamination direction to pass through the support layer 300 and contact the fourth lower interconnection layer 501d.

As illustrated in FIG. 6, the second upper interconnection layer 502b is formed between the first upper interconnection layer 502a and the third upper interconnection layer 502c as viewed from above. The second upper interconnection layer 502b is formed in a C-shape such that the opening thereof faces the row-direction and column-direction center of the connection region 40C as viewed from above.

One column-direction end of the second upper interconnection layer 502b is formed at a position to match a portion of the stairstep portion 415 of the second word line conductive layer 401b (a region in which the third and fourth word line conductive layers 401c and 401d and the word line upper insulating layer 402 are broken) from above.

As illustrated in FIG. 6, FIG. 7, and FIG. 9 to FIG. 12, first connection plug layers 504a and 504b and a second connection plug layer 504c are provided on a lower face of the second upper interconnection layer 502b. The first connection plug layer 504a is formed to extend downward in the lamination direction and contact one of the upper faces of the stairstep portion 415 of the second word line conductive layer 401b. The first connection plug layer 504b is formed to extend downward in the lamination direction and contact another upper face of the stairstep portion 415 of the second word line conductive layer 401b. The second connection plug layer 504c is formed to extend downward in the lamination direction, pass through the support layer 300, and contact an upper face of the third or the fifth lower interconnection layer 501c or 501e.

As illustrated in FIG. 6, the third upper interconnection layer 502c is formed between the second upper interconnection layer 502b and the fourth upper interconnection layer 502d as viewed from above. The third upper interconnection layer 502c is formed in a C-shape such that the opening thereof faces the row-direction and column-direction center of the connection region 40C as viewed from above.

One column-direction end of the third upper interconnection layer 502c is formed at a position to match a portion of a stairstep portion 415 of the third word line conductive layer 401c (a region in which the fourth word line conductive layer 401d and the word line upper insulating layer 402 are cut) from above.

As illustrated in FIG. 6, FIG. 7, and FIG. 9 to FIG. 12, first connection plug layers 505a and 505b and a second connection plug layer 505c are provided on a lower face of the third upper interconnection layer 502c. The first connection plug layer 505a is formed to extend downward in the lamination direction and contact one of the upper faces of the stairstep portion 415 of the third word line conductive layer 401c. The first connection plug layer 505b is formed to extend downward in the lamination direction and contact another upper face of the stairstep portion 415 of the third word line conductive layer 401c. The second connection plug layer 505c is formed to extend downward in the lamination direction, pass through the support layer 300, and contact an upper face of the second or the sixth lower interconnection layer 501b or 501f.

As illustrated in FIG. 6, the fourth upper interconnection layer 502d is formed to enclose the third upper interconnection layer 502c as viewed from above. The fourth upper interconnection layer 502d is formed in a C-shape such that the opening thereof faces the row-direction and column-direction center of the connection region 40C as viewed from above.

One column-direction end of the fourth upper interconnection layer 502d is formed at a position to match a portion of a stairstep portion 415 of the fourth word line conductive layer 401d (a region in which the word line upper insulating layer 402 is cut) from above.

As illustrated in FIG. 6, FIG. 7, and FIG. 9 to FIG. 12, first connection plug layers 506a and 506b and a second connection plug layer 506c are provided on a lower face of the fourth upper interconnection layer 502d. The first connection plug layer 506a is formed to extend downward in the lamination direction and contact one of the upper faces of the stairstep portion 415 of the fourth word line conductive layer 401d. The first connection plug layer 506b is formed to extend downward in the lamination direction and contact another upper face of the stairstep portion 415 of the fourth word line conductive layer 401d. The second connection plug layer 506c is formed to extend downward in the lamination direction, pass through the support layer 300, and contact an upper face of the first or the seventh lower interconnection layer 501a or 501g.

Figure 9:
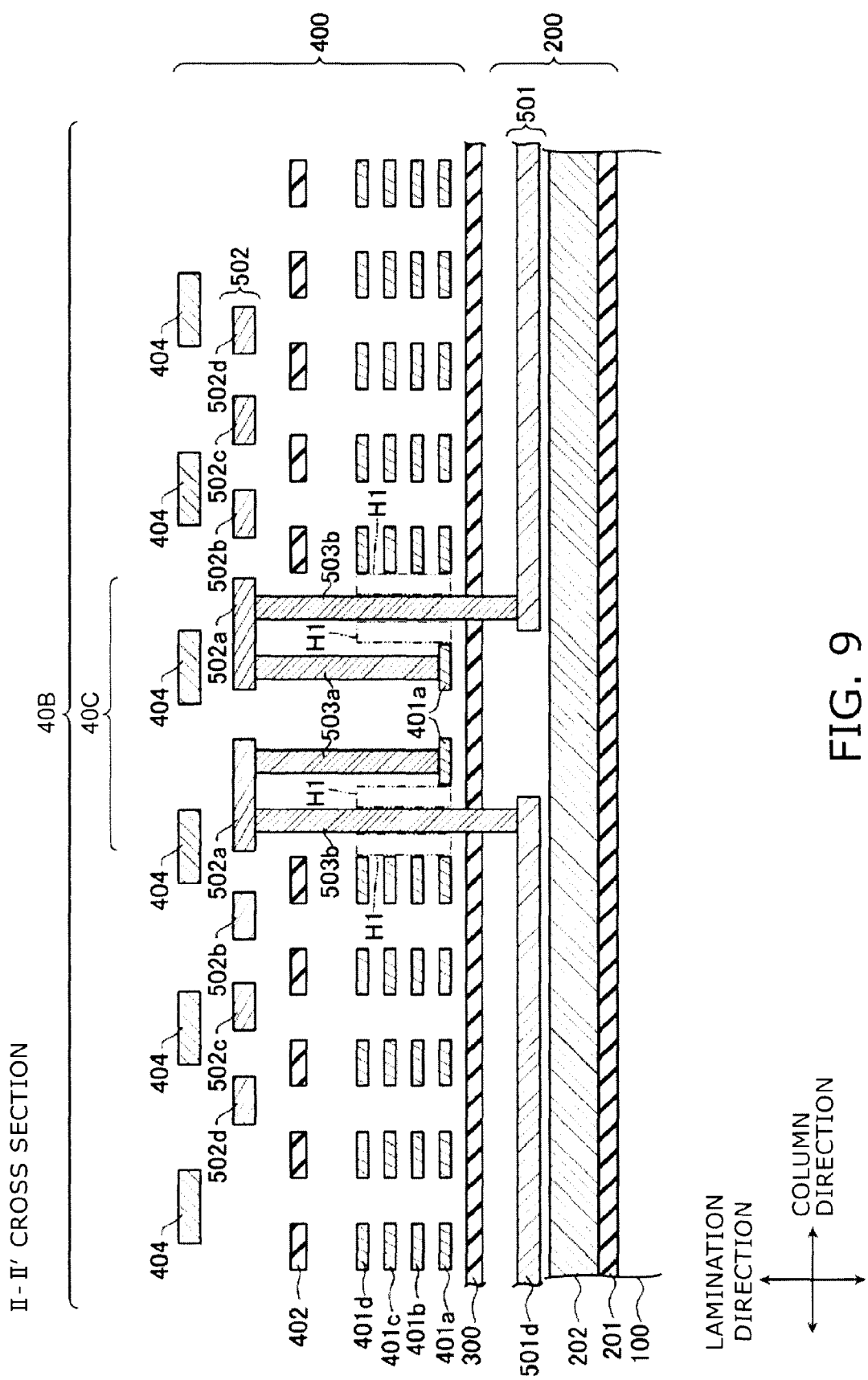
FIG. 9 is a cross-sectional view along the line II-II' of FIG. 5.

In the configuration recited above as illustrated in FIG. 7 and FIG. 9, the second connection plug layers 503b and 504c to 506c are formed to provide a breakdown voltage region H1 formed by an inter-layer insulating layer having a prescribed thickness in the column direction between the first to fourth word line conductive layers 401a to 401d. A breakdown voltage such as a program voltage and the like can be ensured between the second connection plug layers 503b and 504c to 506c and the first to fourth word line conductive layers 401a to 401d by the breakdown voltage region H1.

(Effects of the Nonvolatile Semiconductor Memory Device According to the First Embodiment)

Effects of the nonvolatile semiconductor memory device according to the first embodiment will now be described. The nonvolatile semiconductor memory device according to the first embodiment includes the control circuit layer 200, the memory cell array layer 400, and the interconnection portion 500 having configurations such as those recited above. Accordingly, the control circuit layer 200 is formed on a layer below the memory cell array layer 400. Therefore, the occupied surface area of the entire nonvolatile semiconductor memory device can be reduced.

The memory cell array layer 400 includes the memory cell region 40A and the connection region 40C disposed as described above. Accordingly, the interconnection portion 500 can efficiently electrically connect the memory cell array layer 400 and the control circuit layer 200 only by the connection region 40C which is established in advance. Moreover, the nonvolatile semiconductor memory device according to the first embodiment is manufacturable without using special interconnections or increasing steps.

The nonvolatile semiconductor memory device according to the first embodiment can be highly integrated as illustrated by the laminated structure recited above. Further, as described by the manufacturing steps recited above, each layer that forms the memory cell MC and each layer that forms the source-side selection transistor SST and the drain-side selection transistor SDT of the nonvolatile semiconductor memory device can be manufactured by a prescribed number of lithography steps regardless of the number of laminations. In other words, an inexpensive nonvolatile semiconductor memory device can be manufactured.

SECOND EMBODIMENT

Specific Configuration of the Nonvolatile Semiconductor Memory Device According to a Second Embodiment A specific configuration of a nonvolatile semiconductor memory device according to a second embodiment will now be described with reference to FIG. 13 to FIG. 22. In the description, it is assumed that inter-layer insulating layers exist in regions not illustrated in FIG. 13 to FIG. 22. In the case where the configuration of the second embodiment is similar to that of the first embodiment, like reference numerals are used and a description thereof is omitted.

Figure 13:
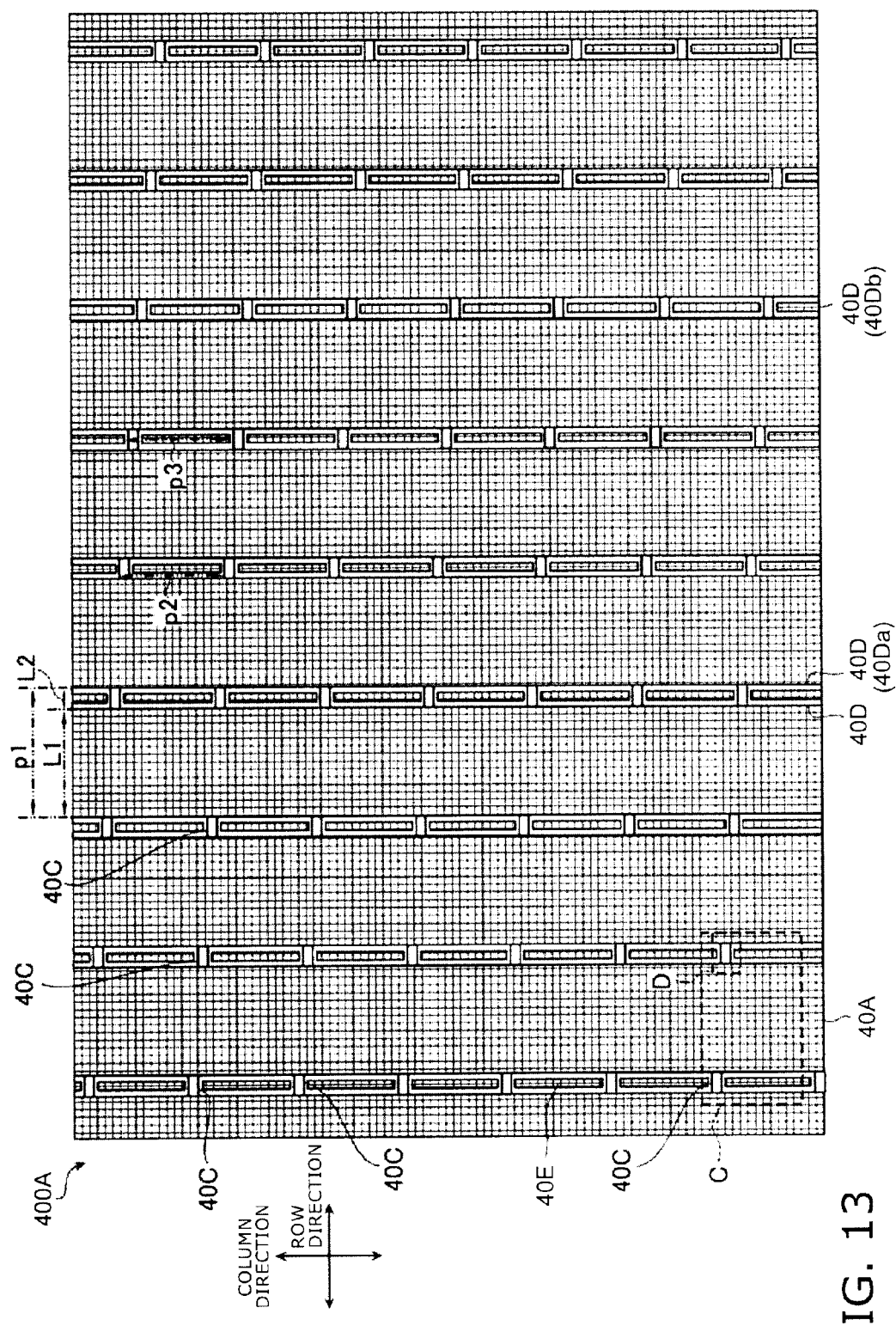
FIG. 13 is a schematic top view of a memory cell array layer 400A of the nonvolatile semiconductor memory device according to a second embodiment of the invention.
Figure 14:
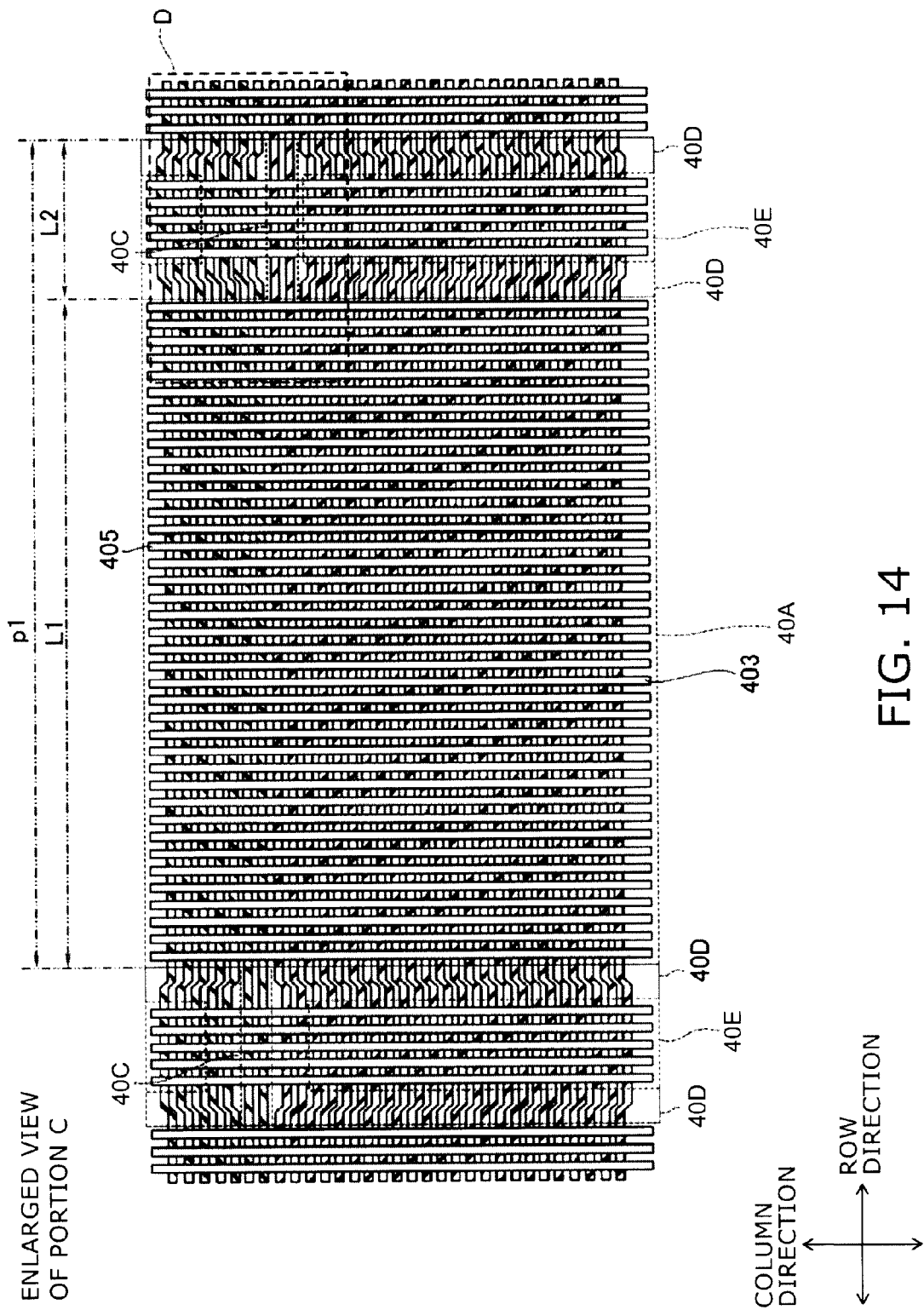
FIG. 14 is an enlarged view of the portion C of FIG. 13.
Figure 15:
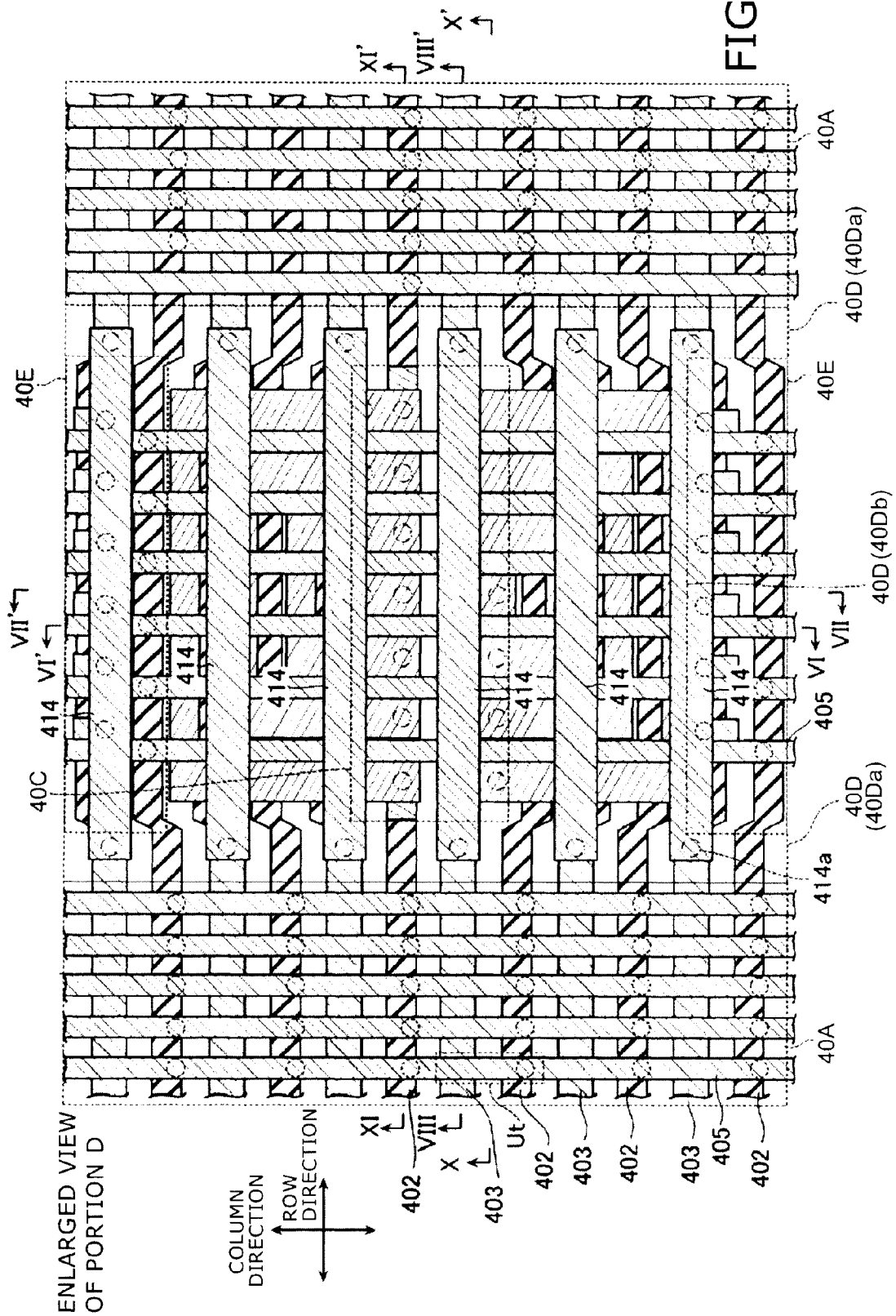
FIG. 15 is an enlarged view of the portion D of FIG. 13.
Figure 16:
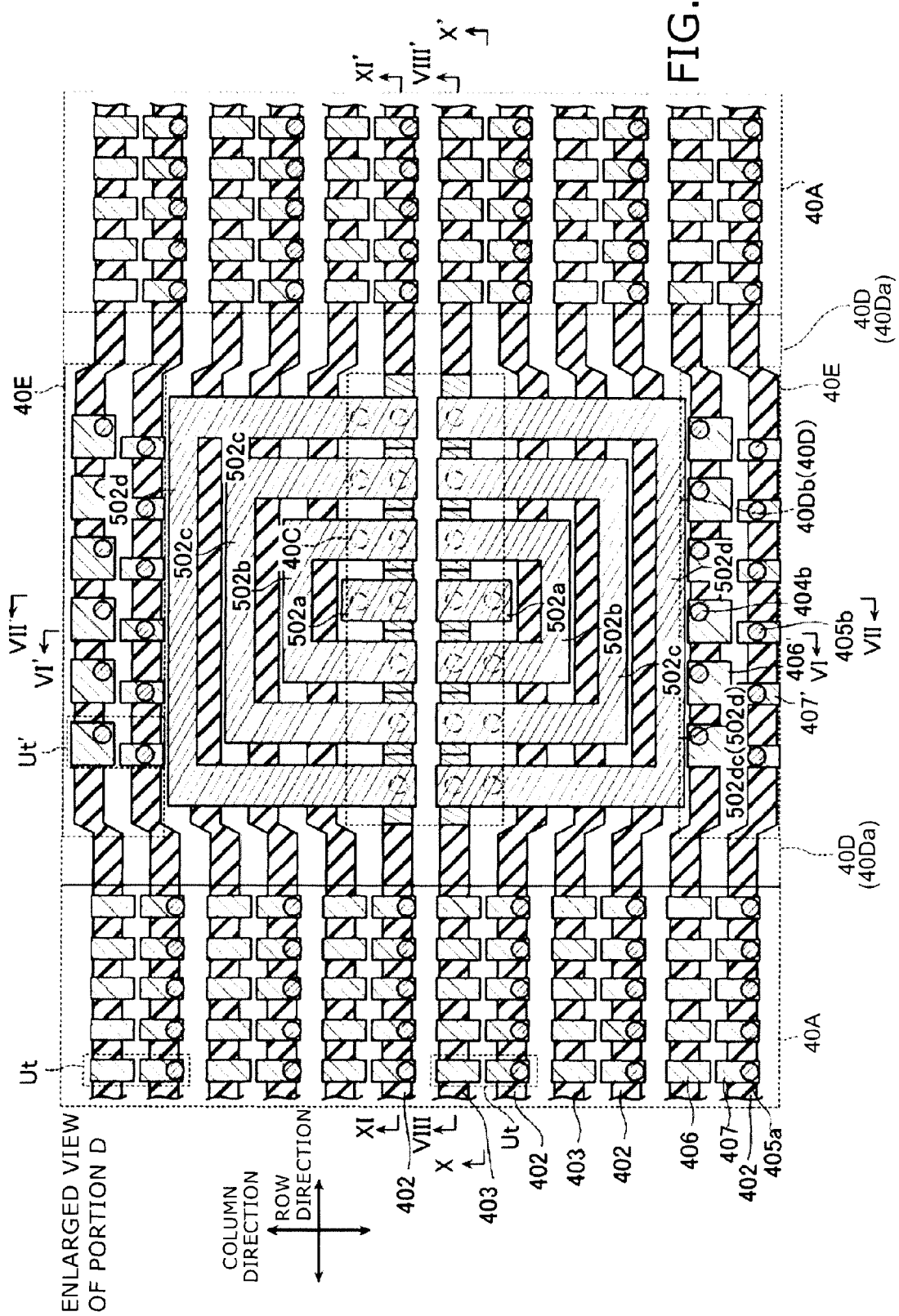
FIG. 16 and FIG. 17 are views of FIG. 15 minus omitted portions
Figure 17:
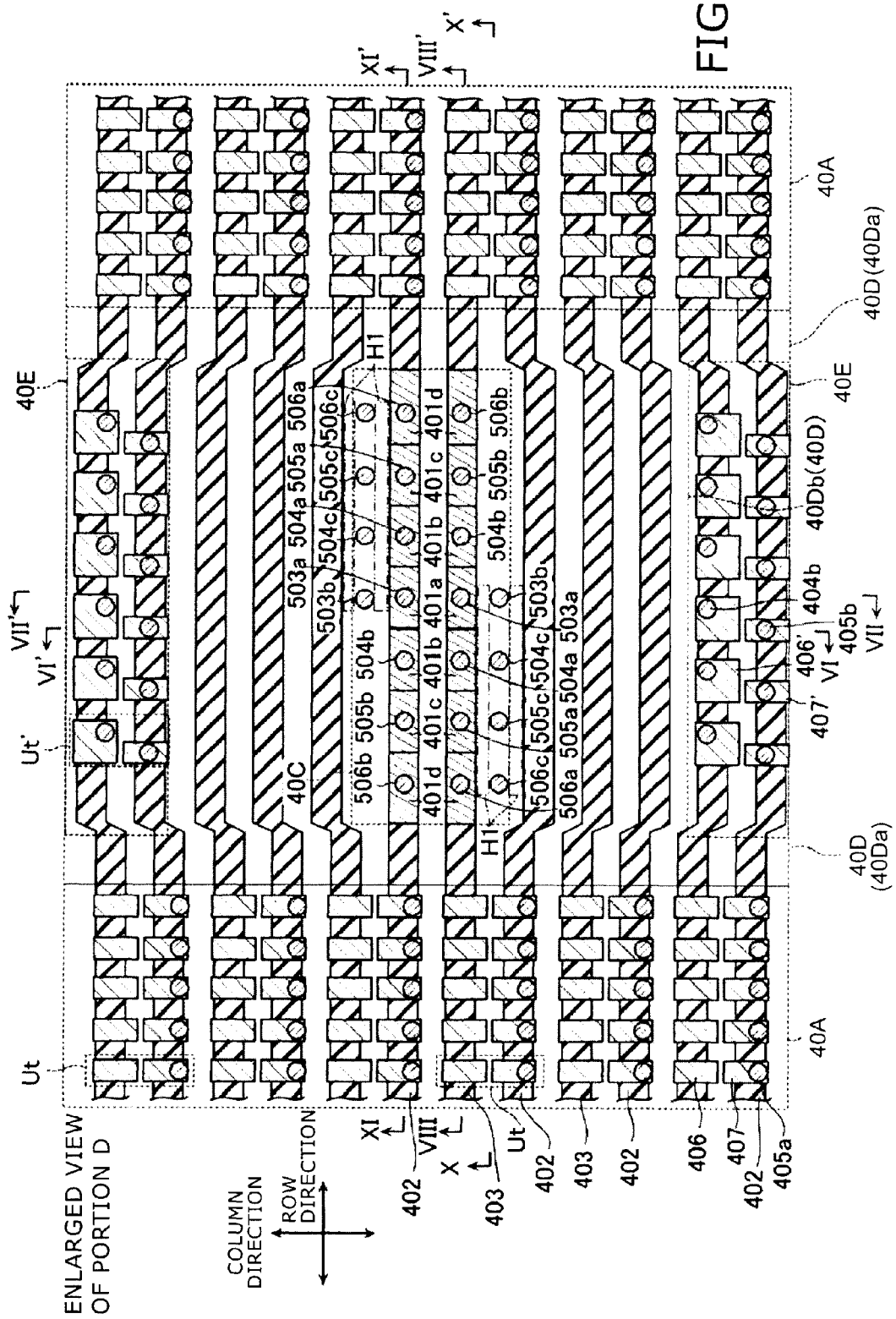
Figure 18:
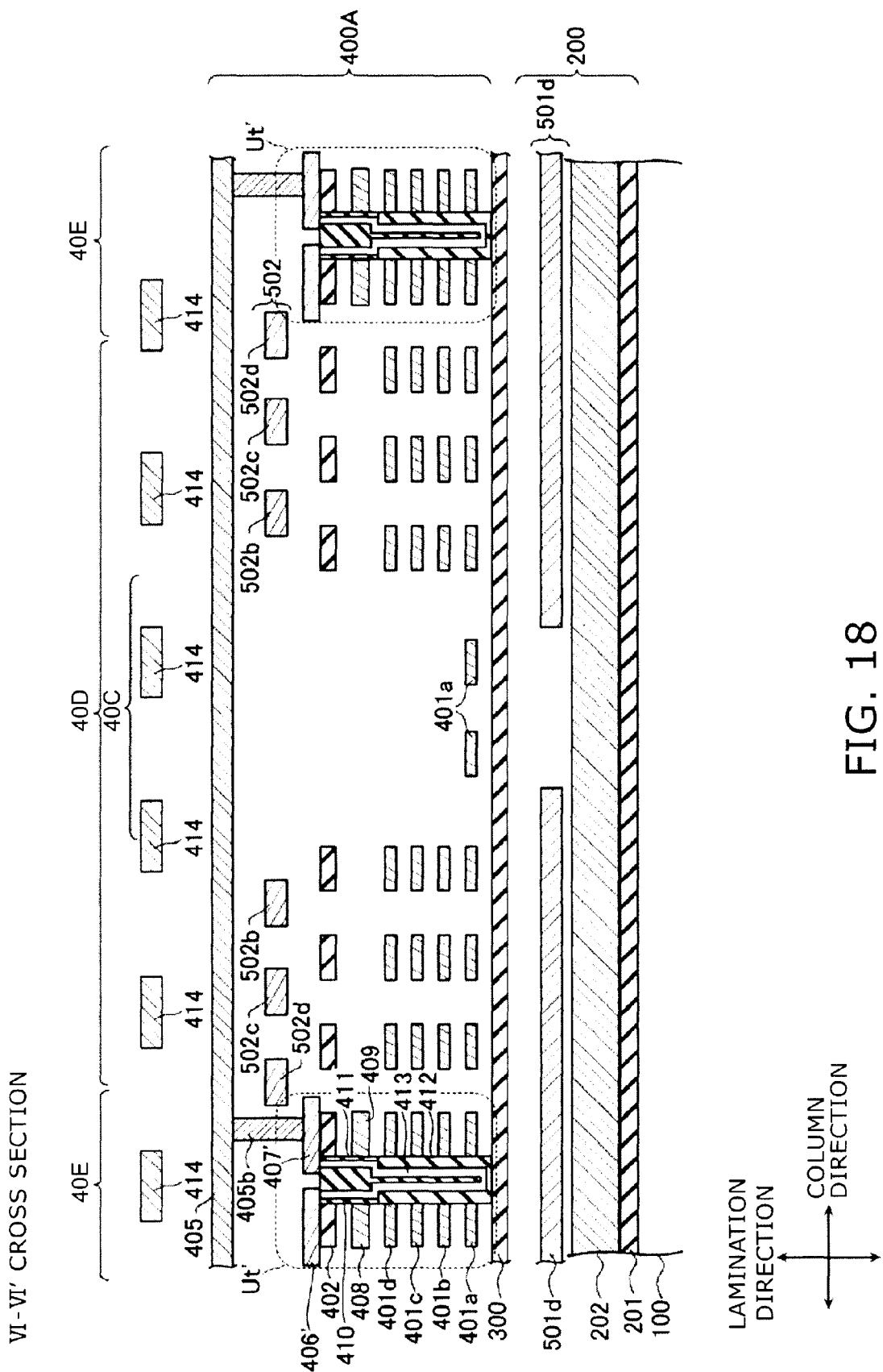
FIG. 18 is a cross-sectional view along the line VI-VI' of FIG. 15.
Figure 19:
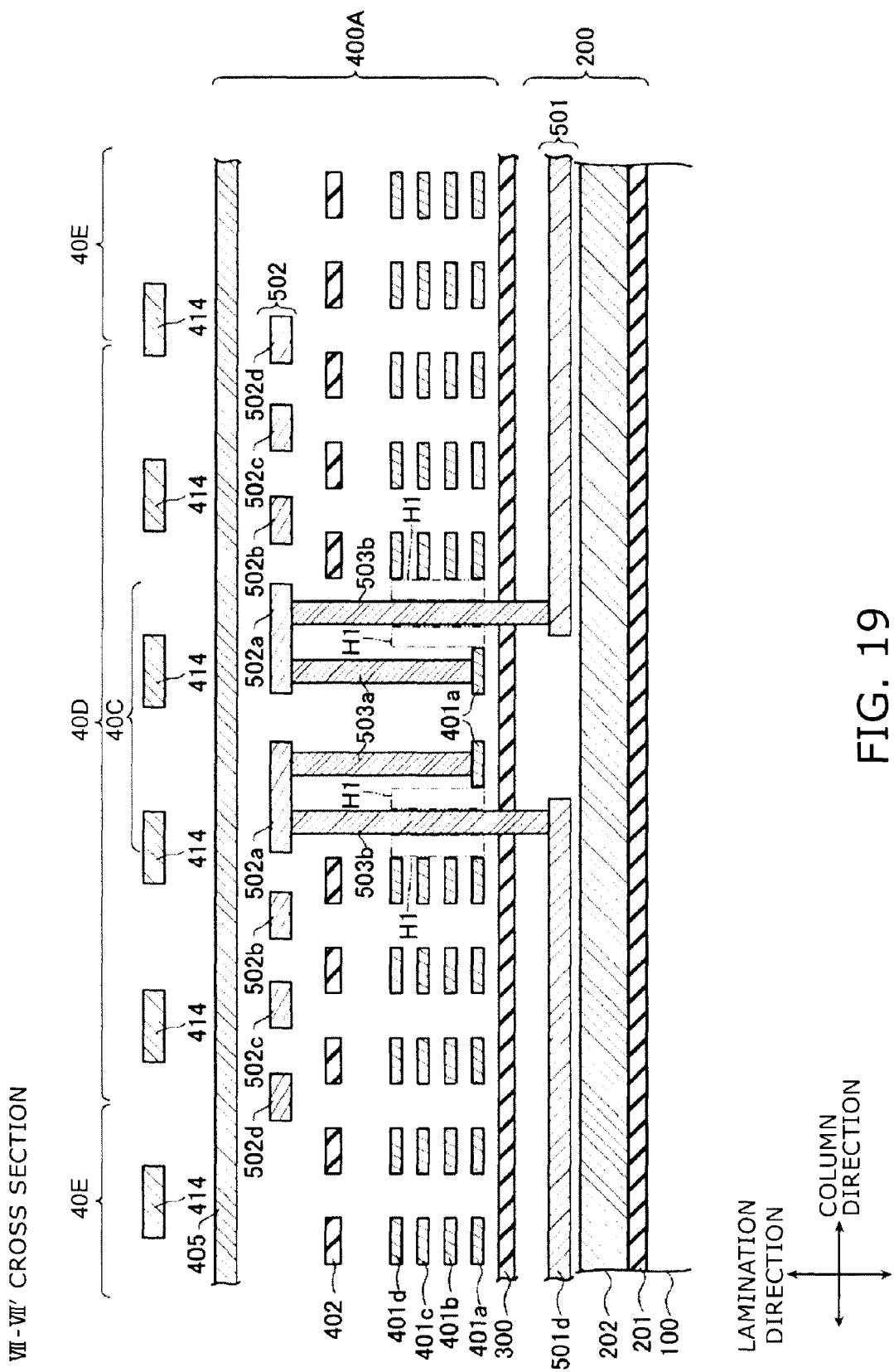
FIG. 19 is a cross-sectional view along the line VII-VII' of FIG. 15.
Figure 20:
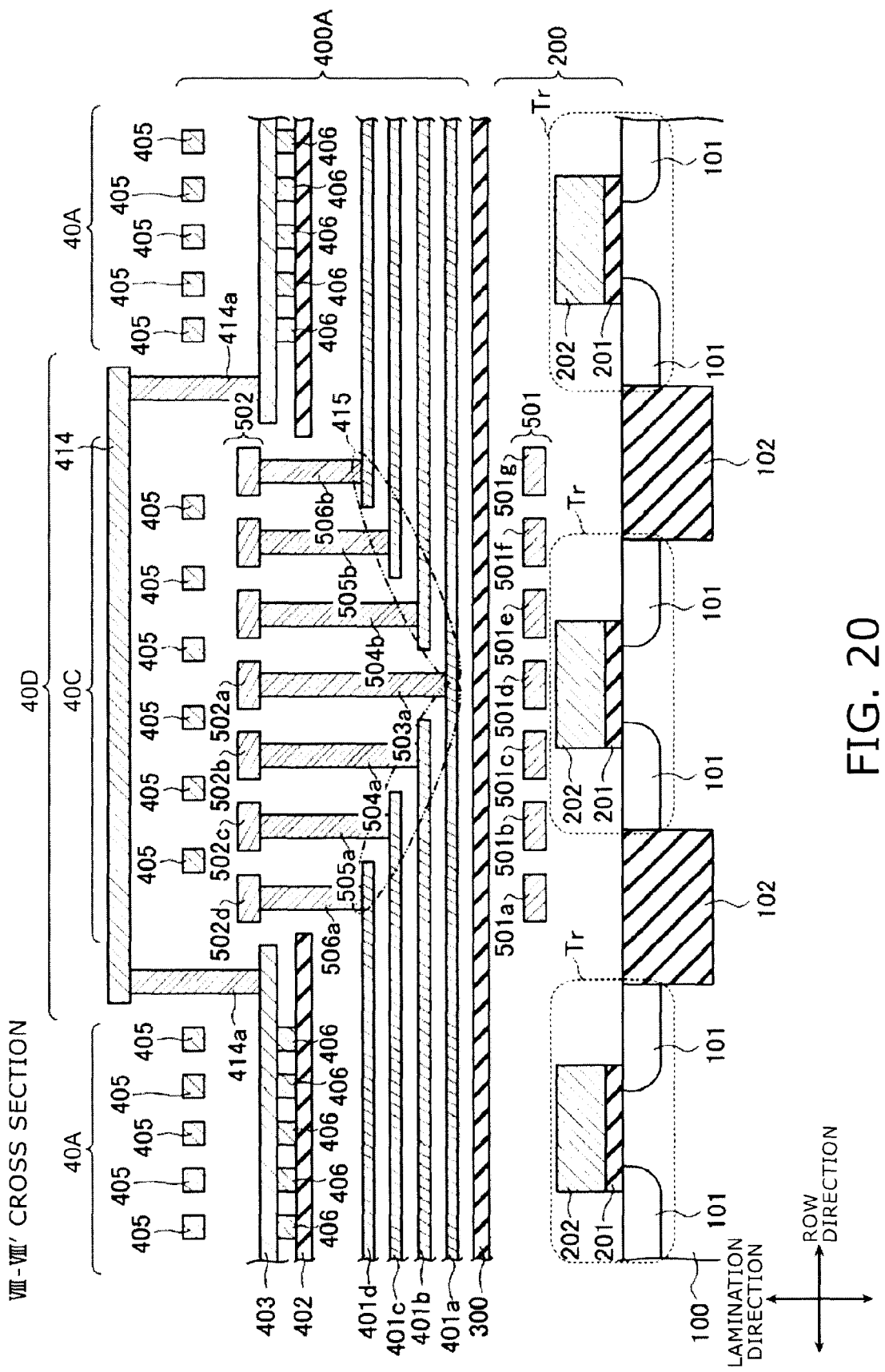
FIG. 20 is a cross-sectional view along the line VIII-VIII' of FIG. 15.
Figure 21:
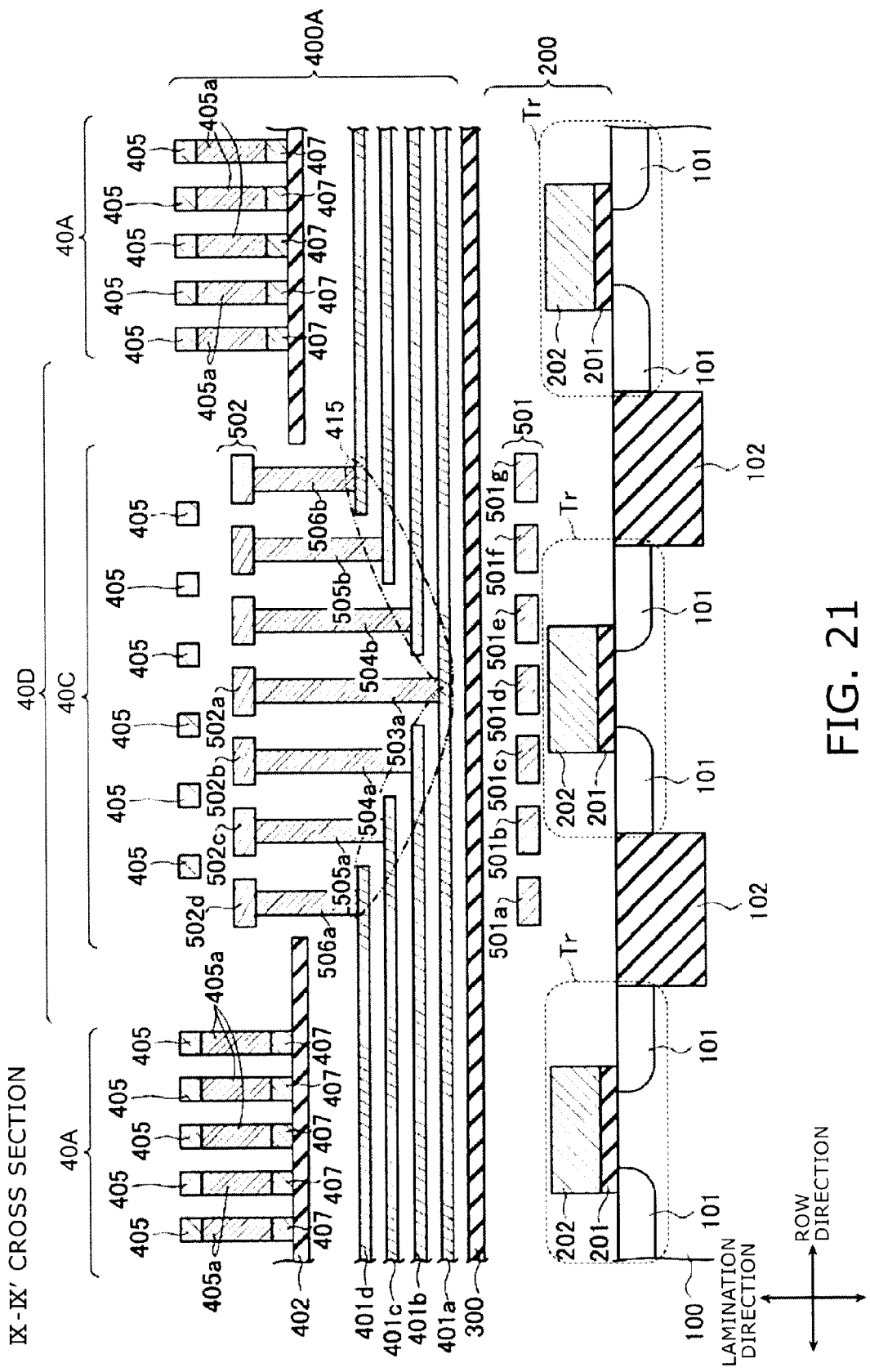
FIG. 21 is a cross-sectional view along the line IX-IX' of FIG. 15.
Figure 22:
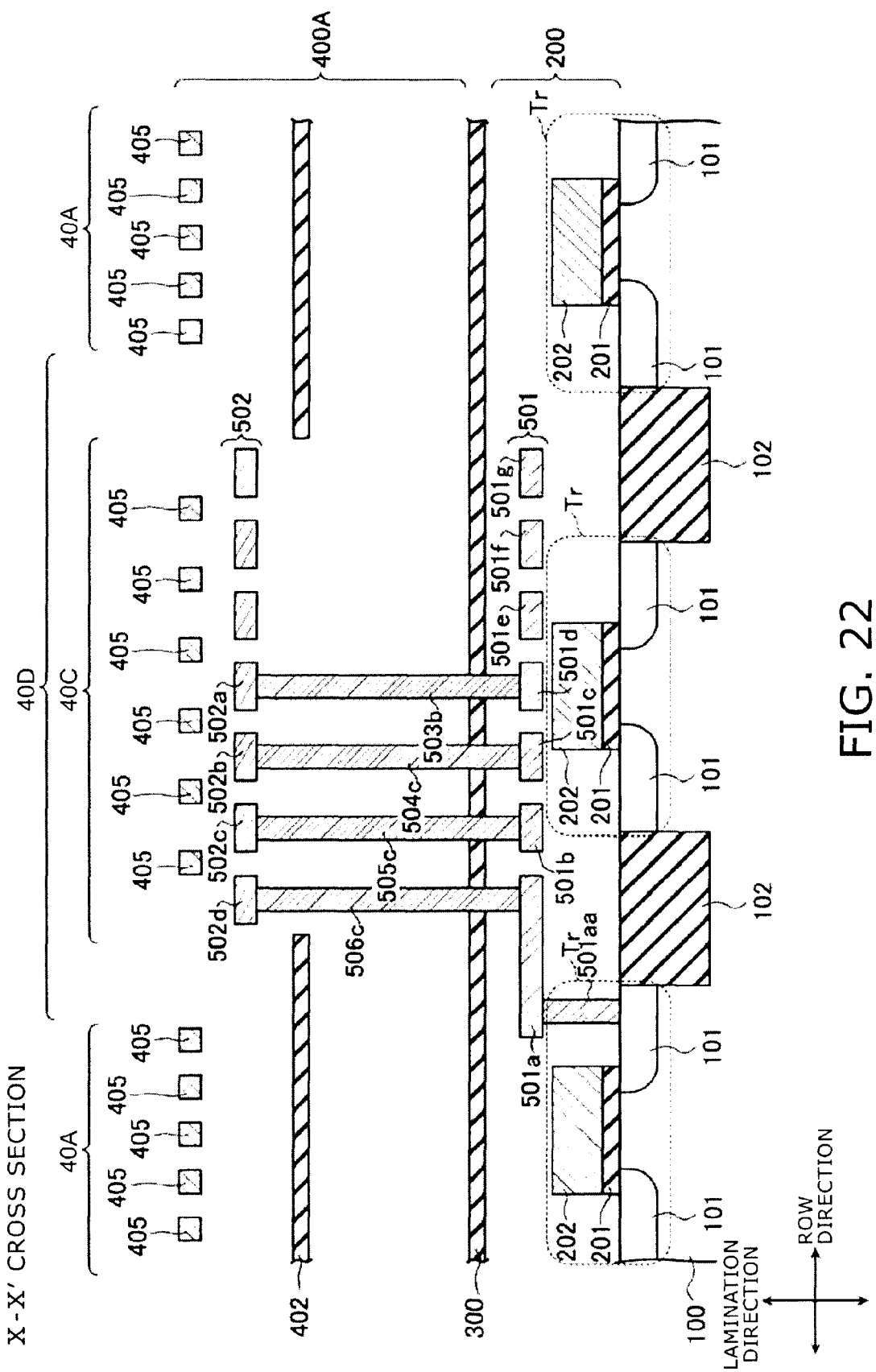
FIG. 22 is a cross-sectional view along the line X-X' of FIG. 15.

FIG. 13 is a schematic top view of a memory cell array layer 400A of the nonvolatile semiconductor memory device according to the second embodiment of the invention. FIG. 14 is an enlarged view of the portion C of FIG. 13. FIG. 15 is an enlarged view of the portion D of FIG. 13. FIG. 16 and FIG. 17 are views of FIG. 15 minus omitted portions. In particular, the first source line conductive layer 403, a second source line conductive layer 414, and the bit line conductive layer 405, to be described below, are omitted in FIG. 16. In FIG. 17, the first source line conductive layer 403, the second source line conductive layer 414, the bit line conductive layer 405, and an upper interconnection layer 502, to be described below, are omitted from FIG. 15. FIG. 18 to FIG. 22 are cross-sectional views along lines VI-VI' to X-X' of FIG. 15.

The configuration of the memory cell array layer 400A of the nonvolatile semiconductor memory device according to the second embodiment is different in comparison to that of the first embodiment.

The memory cell array layer 400A includes the first memory cell region 40A and the connection region 40C similar to those of the first embodiment. As illustrated in FIG. 13, the memory cell array layer 400A includes a second non-memory cell region 40D different from that of the first embodiment. The memory cell array layer 400A is also different from that of the first embodiment by further including a second memory cell region 40E.

As illustrated in FIG. 13, the second non-memory cell region 40D has a ladder configuration as viewed from above. The second non-memory cell region 40D includes a pair of first regions 40Da extending in the column direction and multiple second regions 40Db extending in the row direction to connect the pair of the first regions 40Da. The first region 40Da is formed along an end portion extending in the column direction of the first memory cell region 40A. The second regions 40Db are formed to include the connection region 40C.

As illustrated in FIG. 13, the second memory cell region 40E is repeatedly formed between first memory cell regions 40A adjacent in the row direction at a third pitch p3 in the column direction. Restated, the second memory cell region 40E is formed in a region enclosed by the first region 40Da and the second region 40Db of the second non-memory cell region 40D.

As illustrated in FIG. 15 and FIG. 18 to FIG. 20, the memory cell array layer 400A includes the second source line conductive layer 414 which is different than that of the first embodiment. The second source line conductive layer 414 is formed in a layer above the bit line conductive layer 405. The second source line conductive layer 414 includes a source line connection plug layer 414a on a lower face thereof. The source line connection plug layer 414a is connected to an upper face of the first source line conductive layer 403.

The second source line conductive layer 414 is formed in a layer above the bit line conductive layer 405 in the memory cell array layer 400A. Therefore, different than those of the first embodiment, the bit line conductive layer 405 is formed also between the second source line conductive layer 414 and the upper interconnection layer 502. The bit line conductive layer 405 is formed to straddle the connection region 40C, the second memory cell region 40E, and the second non-memory cell region 40D.

As illustrated in FIG. 15 to FIG. 18, the memory cell array layer 400A includes a bit line connection plug layer 405b on a lower face of the bit line conductive layer 405 in the second memory cell region 40E. The bit line connection plug layer 405b is connected to a second contact layer 407' of a memory unit Ut' similar to those of the first memory cell region 40A (referring to FIG. 18).

The memory cell array layer 400A includes a source line connection plug layer 404b on a lower face of the second source line conductive layer 414 in the second memory cell region 40E. The source line connection plug layer 404b is connected to a first contact layer 406' of the memory unit Ut' (referring to FIG. 17).

(Effects of the Nonvolatile Semiconductor Memory Device According to the Second Embodiment)

Effects of the nonvolatile semiconductor memory device according to the second embodiment will now be described. The nonvolatile semiconductor memory device according to the second embodiment has the configuration recited above and therefore can provide effects similar to those of the first embodiment.

In addition to the configuration of the first embodiment, the nonvolatile semiconductor memory device according to the second embodiment includes the second memory cell region 40E. Accordingly, the integration density of the memory cells MC of the nonvolatile semiconductor memory device according to the second embodiment can be increased even more than that of the first embodiment.

THIRD EMBODIMENT

Figure 23:
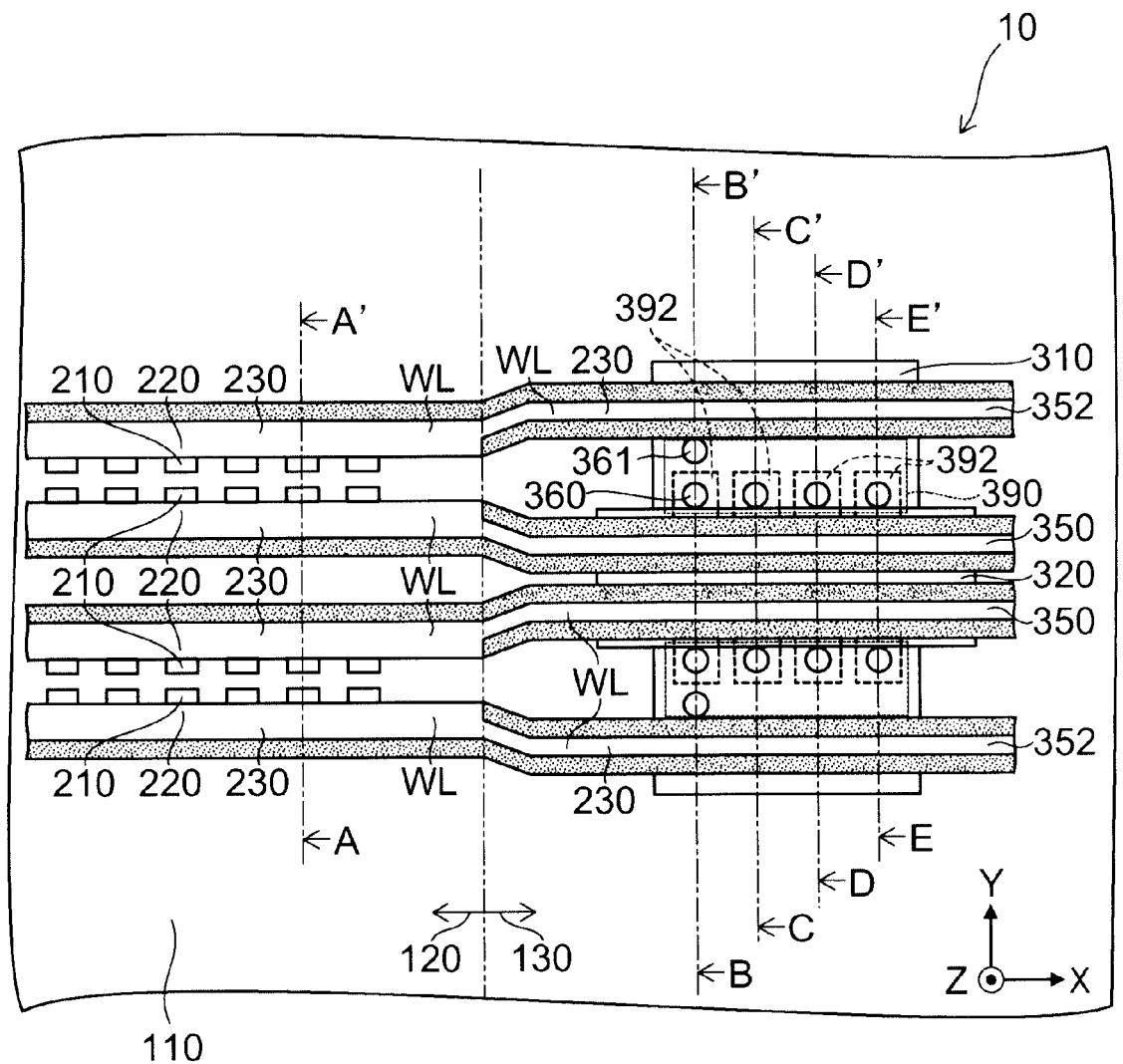
FIG. 23 is a schematic plan view illustrating the configuration of a nonvolatile semiconductor memory device according to a third embodiment of the invention.

FIG. 23 is a schematic plan view illustrating a configuration of a nonvolatile semiconductor memory device according to the third embodiment of the invention.

FIG. 24, FIG. 25, FIG. 26, FIG. 27, and FIG. 28 are a cross-sectional view along line A-A', a cross-sectional view along line B-B', a cross-sectional view along line C-C', a cross-sectional view along line D-D', and a cross-sectional view along line E-E' of FIG. 23, respectively.

Figure 29:
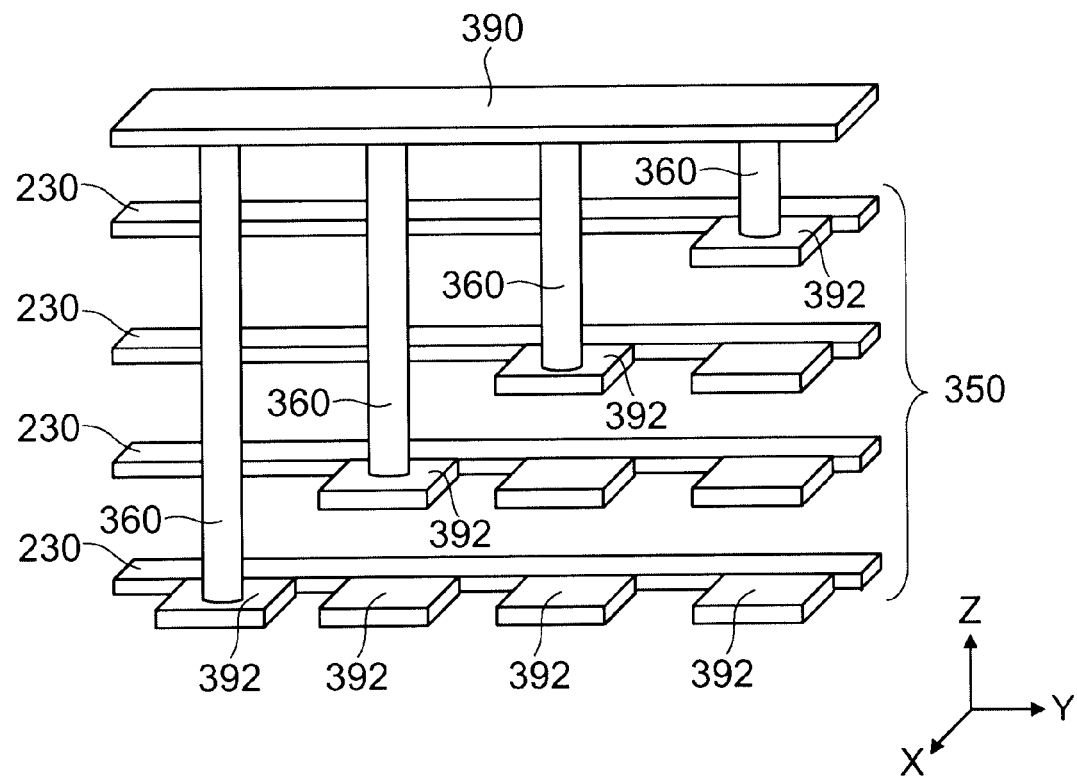
FIG. 29 is a schematic perspective view illustrating the configuration of a portion of the nonvolatile semiconductor storage device according to the third embodiment of the invention.

FIG. 29 is a schematic perspective view illustrating the configuration of a portion of the nonvolatile semiconductor memory device according to the third embodiment of the invention.

In a nonvolatile semiconductor memory device 10 according to the third embodiment of the invention illustrated in FIG. 23, the semiconductor substrate 110 includes a memory cell region 120 and a peripheral circuit region 130 adjacent to the memory cell region 120.

Here, as illustrated in FIG. 23, a Z axis is a direction perpendicular to a major surface 111 of the semiconductor substrate 110; an X axis is a direction in a plane perpendicular to the Z axis and in which memory cells 210, connected by common word lines WL as described below, are juxtaposed in the memory cell region 120; a Y axis is and a direction perpendicular to the Z axis and the X axis. In other words, the X axis and the Y axis are parallel to the major surface 111.

Figure 24:
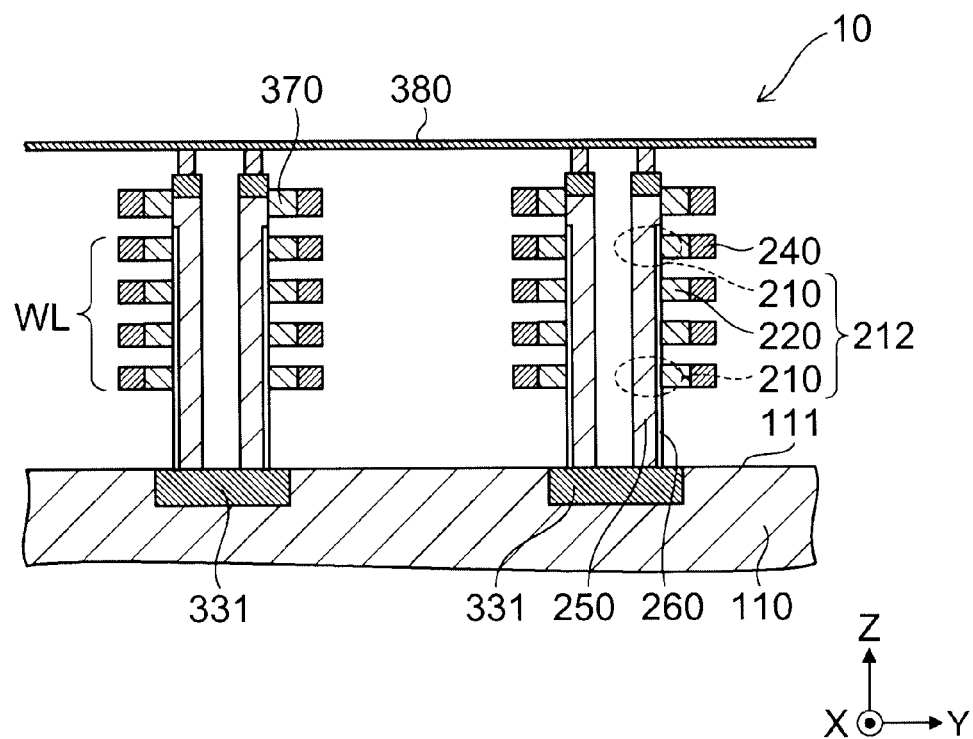
FIG. 24 is a cross-sectional view along the line A-A' of FIG. 23.

As illustrated in FIG. 24, multiple memory cells 210 are provided above the semiconductor substrate 110 of the memory cell region 120 and juxtaposed in the direction (Z-axis direction) perpendicular to the major surface 111 of the semiconductor substrate 110. The memory cells 210 are connected in series in the direction perpendicular to the major surface 111 to form a memory cell string 212. The memory cell 210 includes a semiconductor layer 250 provided on the major surface 111 of the semiconductor substrate 110 to extend in the direction perpendicular to the major surface 111 and an insulating layer 260 adjacent to the semiconductor layer 250. A control gate 220 is provided on the face of the insulating layer 260 on the side opposite to the semiconductor layer 250 in each memory cell 210. In other words, the insulating layer 260 is provided between the semiconductor layer 250 and the control gate 220.

The control gates 220 are multiply laminated in the direction perpendicular to the major surface 111 via not-illustrated insulating layers.

Thus, the memory cells 210 are connected in series in the direction perpendicular to the major surface 111.

Although four control gate 220 layers are laminated in the direction (the Z-axis direction) perpendicular to the major surface 111, the number of laminations is arbitrary. In other words, two or more layers of the control gates 220 may be multiply laminated.

The semiconductor layer 250 may include, for example, an n⁻-type SOI (Silicon On Insulator). The insulating layer 260 may include, for example, three layers of laminated films such as $SiO_2$—SiN—AlO. The control gate 220 may include, for example, an n-type polysilicon. However, each of these materials is one example, and various modifications are possible.

A drain-side selection gate line 370 is provided on the uppermost portion of the memory cell string 212. The uppermost portion of the semiconductor layer 250 is connected to a bit line 380. The drain-side selection gate line 370 may include, for example, an n-type polysilicon. The bit line 380 may include, for example, Cu. However, each of these materials is one example, and various modifications are possible. The bit line 380 is omitted in FIG. 23.

A diffusion layer 331 in the memory cell region is provided on the lowermost portion of the memory cell string 212.

As described above in regard to FIG. 23, the memory cells 210, that is, the memory cell strings 212, are multiply juxtaposed in the X-axis direction. A conductive layer 230, which forms the control gates 220 of the memory cells 210 in the memory cell strings 212 juxtaposed at substantially the same distance from the major surface 111 as illustrated in FIG. 24, is formed in the same layer. As illustrated in FIG. 23, the conductive layer 230 which forms the control gates 220 of the memory cells 210 extends in the X-axis direction and mutually connects the control gates 220 juxtaposed at substantially the same distance from the major surface 111.

The conductive layer 230 includes a function as the word line WL. In other words, the word line WL including the conductive layer 230 commonly connects, in the X-axis direction, the memory cells 210 formed at positions having substantially the same height from the major surface 111 of the semiconductor substrate 110.

In other words, the word lines WL, which extend in the X-axis direction (the first direction) and include the conductive layer 230 forming the control gate 220, are multiply disposed in the Y-axis direction (the second direction) in planes parallel to the major surface 111 of the semiconductor substrate 110. The word line WL commonly connects the memory cells 210 formed at positions having substantially the same height from the semiconductor substrate 110. The memory cell strings 212 are multiply disposed in the X-axis direction. Groups of the memory cell strings 212 commonly connected by common word lines WL and multiply disposed in the X-axis direction are multiply juxtaposed at different positions in the Y-axis direction.

The conductive layer 230 forming the control gate 220 also extends into the peripheral circuit region 130. In other words, the word line WL connected to the memory cells 210 extends into the peripheral circuit region 130.

On the other hand, as illustrated in FIG. 23 and FIG. 25 to FIG. 28, a transfer gate transistor 310 is provided on the major surface 111 of the semiconductor substrate 110 of the peripheral circuit region 130. The transfer gate transistor 310 includes a gate electrode 320 and diffusion layers 330 formed on either side of the gate electrode 320.

As illustrated in FIG. 25 to FIG. 28, the gate electrode 320 of the transfer gate transistor 310 is provided more proximal to the semiconductor substrate 110 side than is the conductive layer 230 forming the control gate 220 of the memory cells 210. A first interconnection 350 is an extension portion to the peripheral circuit region 130 of the conductive layer (a fifth conductive layer) 230 forming the control gate 220 of the memory cell 210 and passes above the gate electrode 320. The first interconnection 350 is a word line WL.

In other words, the nonvolatile semiconductor memory device 10 includes the semiconductor substrate 110 including the memory cell region 120 and the peripheral circuit region 130 provided adjacent to the memory cell region 120.

The nonvolatile semiconductor memory device 10 further includes the memory cell string 212, which is provided in the memory cell region 120 of the semiconductor substrate 110 and includes multiple memory cells 210 connected in series in the direction perpendicular to the major surface 111 of the semiconductor substrate 110, and the transfer gate transistor 310, which is provided on the peripheral circuit region 130 of the semiconductor substrate 110.

The nonvolatile semiconductor memory device 10 further includes the first interconnection 350 which is formed by extending the conductive layer 230 forming the control gate 220 of the memory cell 210 into the peripheral circuit region 130 and passes above the gate electrode 320 of the transfer gate transistor 310 as viewed from the semiconductor substrate 110.

In other words, the conductive layer 230 forming the control gate 220 of the memory cell 210 is a word line WL; and a portion of the word line WL forms the first interconnection 350 that passes above the gate electrode 320 of the transfer gate transistor 310 as viewed from the semiconductor substrate 110.

The conductive layer (a sixth conductive layer) 230 forming the control gate 220 of the memory cells 210, that is, another portion of the word line WL, does not pass above the gate electrode 320. Thus, the other portion of the word line WL (the sixth conductive layer) extends into the peripheral circuit region 130; and the extension portion forms a second interconnection 352 that does not pass above the gate electrode 320 of the transfer gate transistor 310.

At this time, as illustrated in FIG. 23 and FIG. 25 to FIG. 28, the spacing between the word lines WL (the first interconnections 350) can be small in the portion above the gate electrode 320 of the transfer gate transistor 310 in the peripheral circuit region 130.

In other words, the spacing between the first interconnections 350 in the plane parallel to the major surface 111 of the semiconductor substrate 110 above the gate electrode 320 can be smaller than the spacing between the conductive layers 230 in the plane parallel to the major surface 111 in the memory cell region 120.

Then, the spacing between the second interconnection 352 and the first interconnection 350 can be larger than the spacing between the first interconnections 350 that are above the same X axis as the gate electrode 320 but not above the gate electrode 320.

Thereby, a contact electrode (inter-layer connection part) 360 and a contact electrode 361 can be provided between the word lines WL, that is, the first interconnection 350 and the second interconnection 352 of regions not above the gate electrode 320, and easily connect each of the laminated conductive layers 230 forming the control gate 220 of the laminated memory cell 210 to the peripheral circuit (for example, the transfer gate transistor 310).

Figure 25:
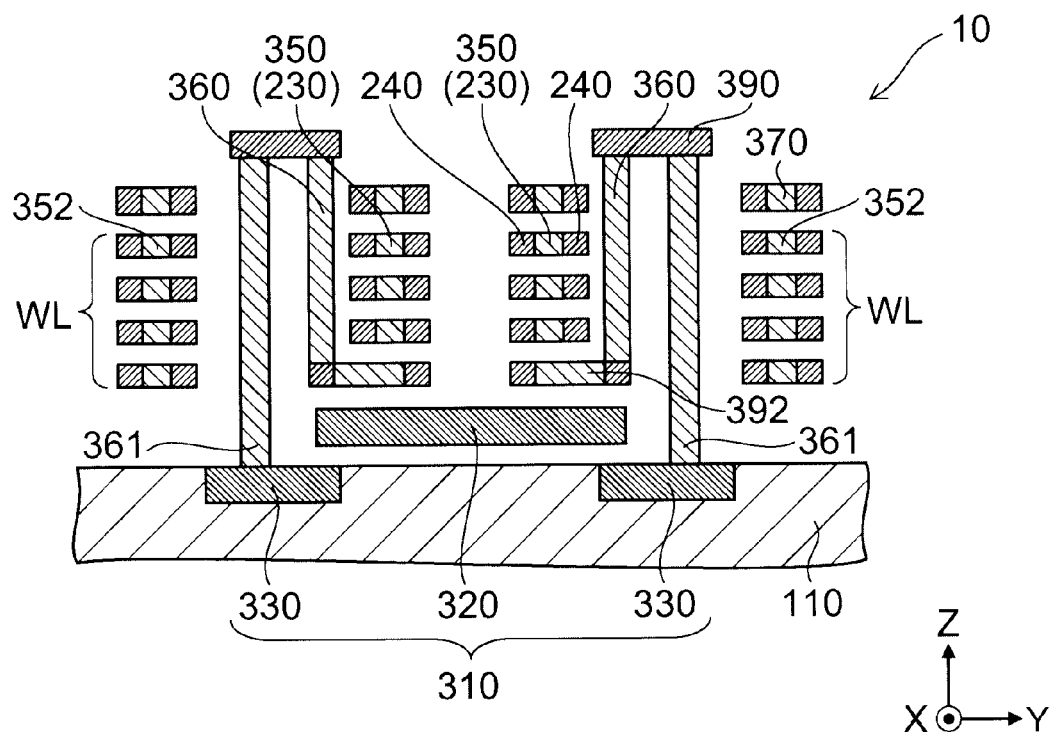
FIG. 25 is a cross-sectional view along the line B-B' of FIG. 23.

In other words, as illustrated in FIG. 25, a contact electrode 361 connected to the diffusion layer 330 of the transfer gate transistor 310 is provided between the laminated first interconnections 350 and the laminated second interconnections 352. The contact electrode 361 is connected to, for example, a portion of an upper layer electrode 390. Another portion of the upper layer electrode 390 is connected to a connection portion 392 provided on the lowermost word line WL of the laminated word lines WL (first interconnections 350) by another contact electrode (inter-layer connection part) 360. The connection portion 392 is formed by, for example, the conductive layer 230 protruding in the Y-axis direction.

Figure 26:
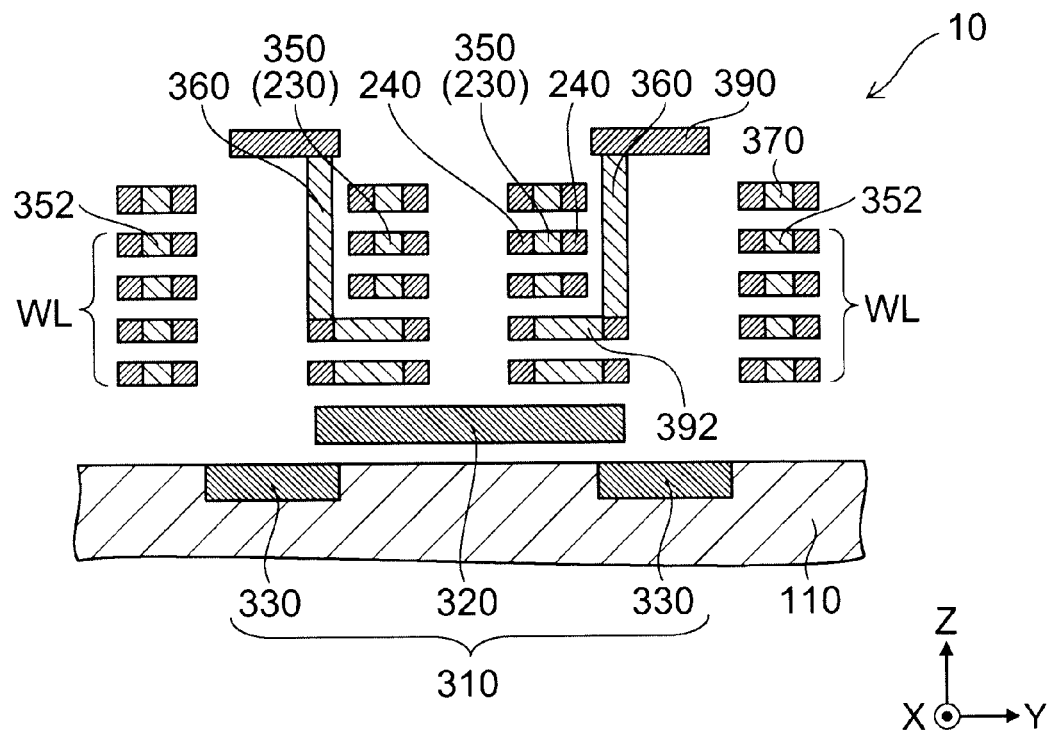
FIG. 26 is a cross-sectional view along the line C-C' of FIG. 23.

As illustrated in FIG. 26, a portion of the upper layer electrode 390 connected to the diffusion layer 330 of the transfer gate transistor 310 is connected to the connection portion 392 provided on the second lowermost word line WL (first interconnection 350) by the contact electrode 360.

Figure 27:
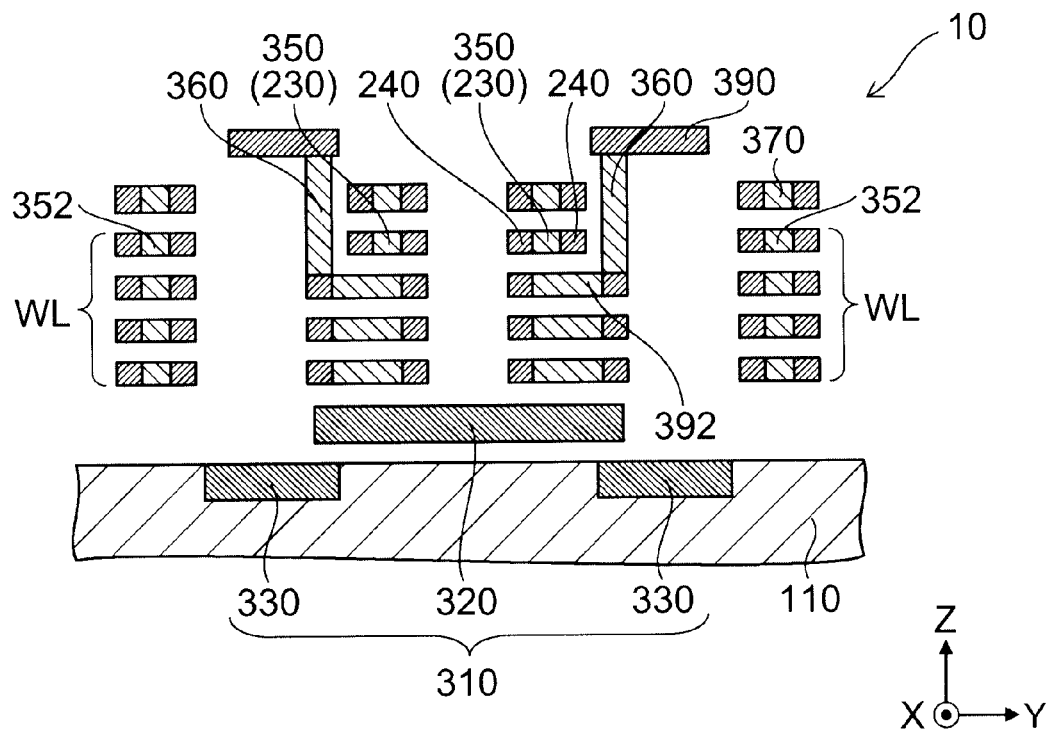
FIG. 27 is a cross-sectional view along the line D-D' of FIG. 23.

As illustrated in FIG. 27, a portion of the upper layer electrode 390 connected to the diffusion layer 330 of the transfer gate transistor 310 is connected to the connection portion 392 provided on the third lowermost word line WL (first interconnection 350) by the contact electrode 360.

Figure 28:
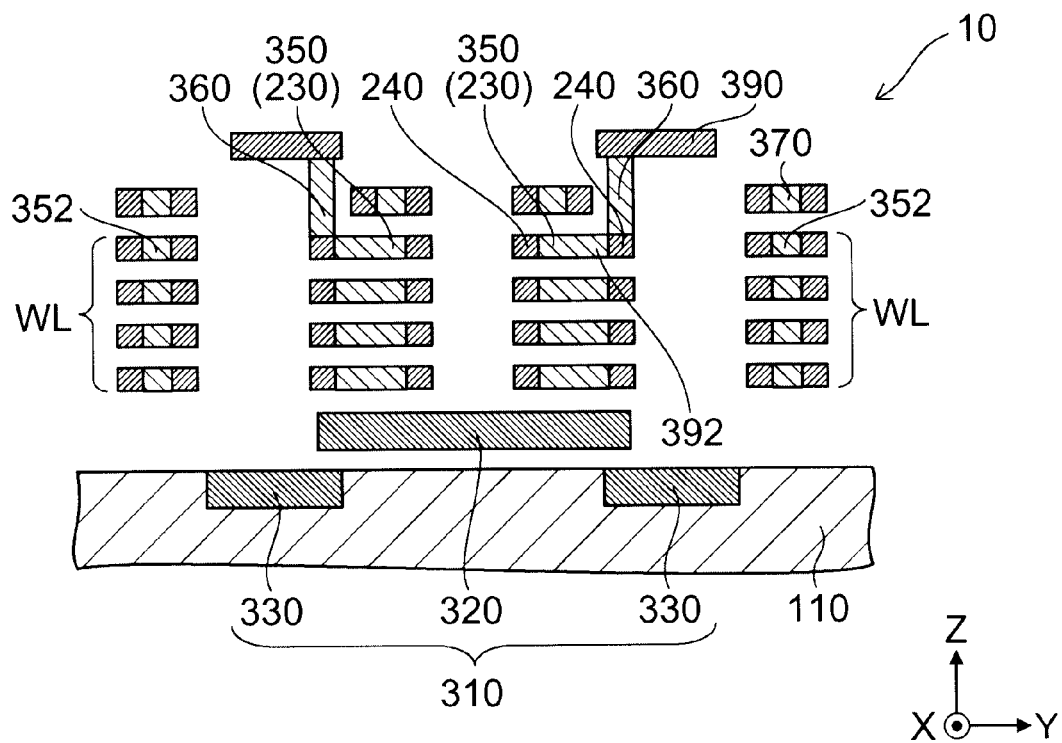
FIG. 28 is a cross-sectional view along the line E-E' of FIG. 23.

As illustrated in FIG. 28, a portion of the upper layer electrode 390 connected to the diffusion layer 330 of the transfer gate transistor 310 is connected to the connection portion 392 provided on the fourth lowermost (in this example, the uppermost) word line WL (first interconnection 350) by the contact electrode 360.

Thus, each of the laminated word lines WL (first interconnections 350) is conducted to the diffusion layer 330. In other words, each of the laminated word lines WL (first interconnections 350) is connected to the peripheral circuit.

Thus, multiple contact electrodes 360 are provided at different positions in planes parallel to the major surface of the semiconductor substrate 110, and all of the laminated layers of the word line WL (first interconnection 350) are connected to the peripheral circuit. In other words, each of the laminated word lines WL (first interconnections 350) includes the connection portion 392 (a protruding portion formed by the conductive layer 230 protruding in the Y-axis direction) provided in different planar positions. The contact electrode 360 connecting to the upper layer electrode 390 is connected to the connection portion 392.

Although the contact electrode 360 recited above is connected to the first interconnection 350, the contact electrode 360 may be connected to the second interconnection 352 as described below. In other words, the contact electrode 360 is connected to at least one of the first interconnection 350 and the second interconnection 352.

Thus, the nonvolatile semiconductor memory device 10 further includes the second interconnection 352, which is formed by the conductive layer 230 forming the control gate 220 of the memory cell 210 extending into the peripheral circuit region 130 and has a spacing to the first interconnection 350 in the plane parallel to the major surface 111 above the gate electrode 320 that is larger than a spacing between the first interconnections 350 in the plane above the gate electrode 320, and an inter-layer connection part (the contact electrode 360), which is provided between the first interconnection 350 and the second interconnection 352, extends in a direction non-parallel to the major surface 111, and is connected to at least one of the first interconnection 350 and the second interconnection 352.

By repeatedly disposing word lines WL having such a configuration in the Y-axis direction, it is possible to draw out the laminated word lines WL individually to the peripheral circuit region; and all of the word lines WL can be connected to the transfer gate transistor 310 in the nonvolatile semiconductor memory device 10 including laminated memory cells.

Thus, the nonvolatile semiconductor memory device 10 according to this embodiment provides a nonvolatile semiconductor memory device having a high memory density that enables each laminated memory cell to connect to the peripheral circuit.

At the boundary between the memory cell region 120 and the peripheral circuit region 130 of the nonvolatile semiconductor memory device 10, the word lines WL can detour around the contact electrode 360 to extend in the X-axis direction by curving the extension direction (changing the direction of the extension axis) of the word lines WL (the first interconnection 350 and the second interconnection 352), that is, causing the extension direction to form a curve in the Y-axis direction.

The first interconnection 350, which is one portion of the word line WL, passes above the gate electrode 320 of the transfer gate transistor 310; and the second interconnection 352, which is another portion of the word line WL, does not pass above the gate electrode 320.

In the nonvolatile semiconductor memory device 10, the word line WL (in this case, for example, the first interconnection 350), which is formed by the conductive layer 230 forming the control gate 220 of the memory cell 210 extending into the peripheral circuit region 130, passes between inter-layer connection parts (in this case, for example, the contact electrodes 360) of the semiconductor substrate 110.

In other words, in this example, the contact electrode 360 is disposed above neither the first interconnection 350 nor the second interconnection 352 which are word lines WL.

However, the contact electrode 360 is not necessarily disposed above all of the first interconnections 350 and the second interconnections 352. The contact electrode 360 may be disposed above a portion or more of the laminated first interconnections 350 and the laminated second interconnections 352. Then, another portion of the first interconnections 350 and the second interconnections 352 may pass between the contact electrodes 360.

As illustrated in FIG. 29, the nonvolatile semiconductor memory device 10 according to this embodiment includes: a semiconductor substrate 110 including a memory cell region 120 and a peripheral circuit region 130 provided adjacent to the memory cell region 120; a memory cell string 212 provided on the memory cell region 120 of the semiconductor substrate 110 and including multiple memory cells 210 connected in series in the direction perpendicular to the major surface 111 of the semiconductor substrate 110; the inter-layer connection part (the contact electrode 360) which is provided in the peripheral circuit region 130 of the semiconductor substrate 110, extends in a direction non-parallel to the major surface 111, and is electrically connected to the diffusion layer 330 of the transfer gate transistor 310; and the peripheral circuit region interconnection (the word line WL, that is, at least one of the first interconnection 350 and the second interconnection 352) which is formed by the conductive layer 230 forming the control gate 220 of the memory cell 210, provided to extend in the first direction (the X-axis direction), protrudes in the second direction (for example, the Y-axis direction) non-parallel to the first direction in the plane parallel to the major surface 111 of the semiconductor substrate 110, and includes the connection portion 392 electrically connected to the inter-layer connection part.

The inter-layer connection part (the contact electrode 360) recited above is connected to the diffusion layer 330 of the transfer gate transistor 310 provided in the peripheral circuit region 130 of the semiconductor substrate 110 by the upper layer electrode 390 and the contact electrode 361 as described above.

By repeatedly disposing word lines WL having such a configuration in the Y-axis direction, it is possible to draw out the laminated word lines WL individually to the peripheral circuit region; and all of the word lines WL can be connected to the transfer gate transistor 310 in the nonvolatile semiconductor memory device 10 including laminated memory cells.

Thus, the nonvolatile semiconductor memory device 10 according to this embodiment provides a nonvolatile semiconductor memory device that enables each laminated memory cell to connect to the peripheral circuit.

Although the contact electrode 361 connected to the transfer gate transistor 310 is further connected to the not-illustrated row decoder, according to the structure of the nonvolatile semiconductor memory device 10, the contact electrode 361 can be connected to the upper layer electrode 390 above the word line WL (more distal to the major surface 111 of the semiconductor substrate 110 than is the word line WL) as illustrated in FIG. 25 to FIG. 28; and the interconnection resistance can be reduced.

As illustrated in FIG. 23 and FIG. 24, the conductive layer 230 forming the control gate 220 in the memory cell region 120 of the nonvolatile semiconductor memory device 10 includes a silicide portion 240 provided along the side face opposite to the control gate 220 side in the extension direction of the conductive layer 230.

As illustrated in FIG. 23 and FIG. 25 to FIG. 28, the conductive layer 230 forming the control gate 220 in the peripheral circuit region 130 includes the silicide portion 240 provided along both side faces in the extension direction (the X-axis direction) of the first interconnection 350.

The silicide portions 240 may include, for example, $NiSi_x$. Additionally, $MoSi_x$, $NbSi_x$, $TaSi_x$, $VSi_x$, $WSi_x$, $TiSi_x$, $CoSi_x$, $PdSi_x$, and the like also may be used.

Thereby, it is possible to reduce the resistance of the word line WL (at least one of the first interconnection 350 and the second interconnection 352) formed by the conductive layer 230 forming the control gate 220.

Although the silicide portion 240 in the memory cell region 120 is provided on the conductive layer 230 forming the control gate 220 on the side face opposite to the control gate 220, and the silicide portion 240 in the peripheral circuit region 130 is provided on the conductive layer 230 forming the control gate 220 on both side faces extending in the X-axis direction, the silicide portion 240 of such a structure can be formed by forming the memory cell 210 on the control gate 220 side of the conductive layer 230, after which the insulating layer is provided to cover the memory cell 210, the conductive layer 230 is patterned in a band configuration extending in the X-axis direction, and then the side faces of the conductive layer 230 are silicided. Thereby, it is possible to provide a silicide portion 240 without reducing the reliability, etc., of the memory cell 210.

Thus, by using the structure including the silicide portion 240 in the memory cell region 120 provided on the conductive layer 230 forming the control gate 220 on the side face opposite to the control gate 220 and the silicide portion 240 in the peripheral circuit region 130 provided on the conductive layer 230 forming the control gate 220 on both side faces extending in the X-axis direction, a nonvolatile semiconductor memory device can be realized having high reliability of the memory cell 210, enabling manufacturing by simple methods, and providing word lines WL having low resistance.

However, in some cases, the silicide portion 240 in the memory cell region 120 is not limited to the side face opposite to the control gate 220 of the conductive layer 230, and may be provided on the same side face as the control gate 220 on the conductive layer 230, and further, may be provided on both side faces of the conductive layer 230. In such cases as well, the resistance of the word line WL formed by the conductive layer 230 forming the control gate 220 can be reduced.

Although the conductive layer 230 forming the control gate 220 in the peripheral circuit region 130 includes the silicide portion 240 on both side faces extending in the X-axis direction, the silicide portion 240 may be included on one of the side faces extending in the X-axis direction. For example, the conductive layer 230 in the peripheral circuit region 130 may be provided with the silicide portion 240 on the side face opposite to the control gate 220 of the conductive layer 230 forming the control gate 220 or on the same side face as the control gate 220 of the conductive layer 230 forming the control gate 220. In such cases as well, the resistance of the word line WL formed by the conductive layer 230 forming the control gate 220 can be reduced.

Although the peripheral circuit region interconnection (the word line WL, that is, at least one of the first interconnection 350 and the second interconnection 352) of the nonvolatile semiconductor memory device 10 according to this embodiment includes the connection portion 392 that protrudes in the second direction (for example, the Y-axis direction) non-parallel to the first direction (the X-axis direction) in the plane parallel to the major surface 111 of the semiconductor substrate 110 and has an independent configuration corresponding to each of the inter-layer connection parts (the contact electrodes 360) as illustrated in FIG. 29, the configuration of the connection portion 392 is arbitrary.

Figure 30:
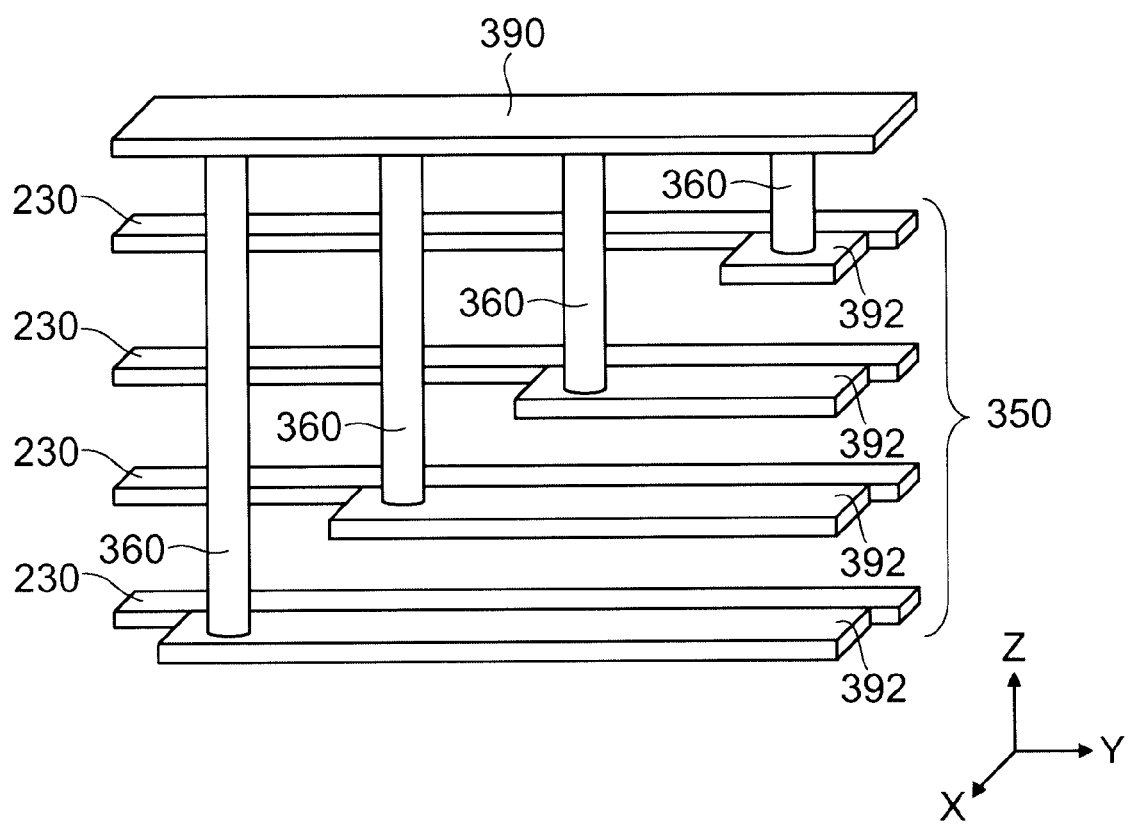
FIG. 30 is a schematic perspective view illustrating the configuration of a portion of another nonvolatile semiconductor storage device according to the third embodiment of the invention.

FIG. 30 is a schematic perspective view illustrating the configuration of a portion of another nonvolatile semiconductor memory device according to the third embodiment of the invention.

As illustrated in FIG. 30, the connection portion 392 of the other nonvolatile semiconductor memory device according to the third embodiment of the invention is provided to extend along a side face of the peripheral circuit region interconnection (the word line WL, that is, at least one of the first interconnection 350 and the second interconnection 352) and has a continuous configuration extending in the X-axis direction while corresponding to the inter-layer connection part (the contact electrode 360).

In such a case as well, a nonvolatile semiconductor memory device is provided that enables each laminated memory cell to connect to the peripheral circuit.

FOURTH EMBODIMENT

Figure 31:
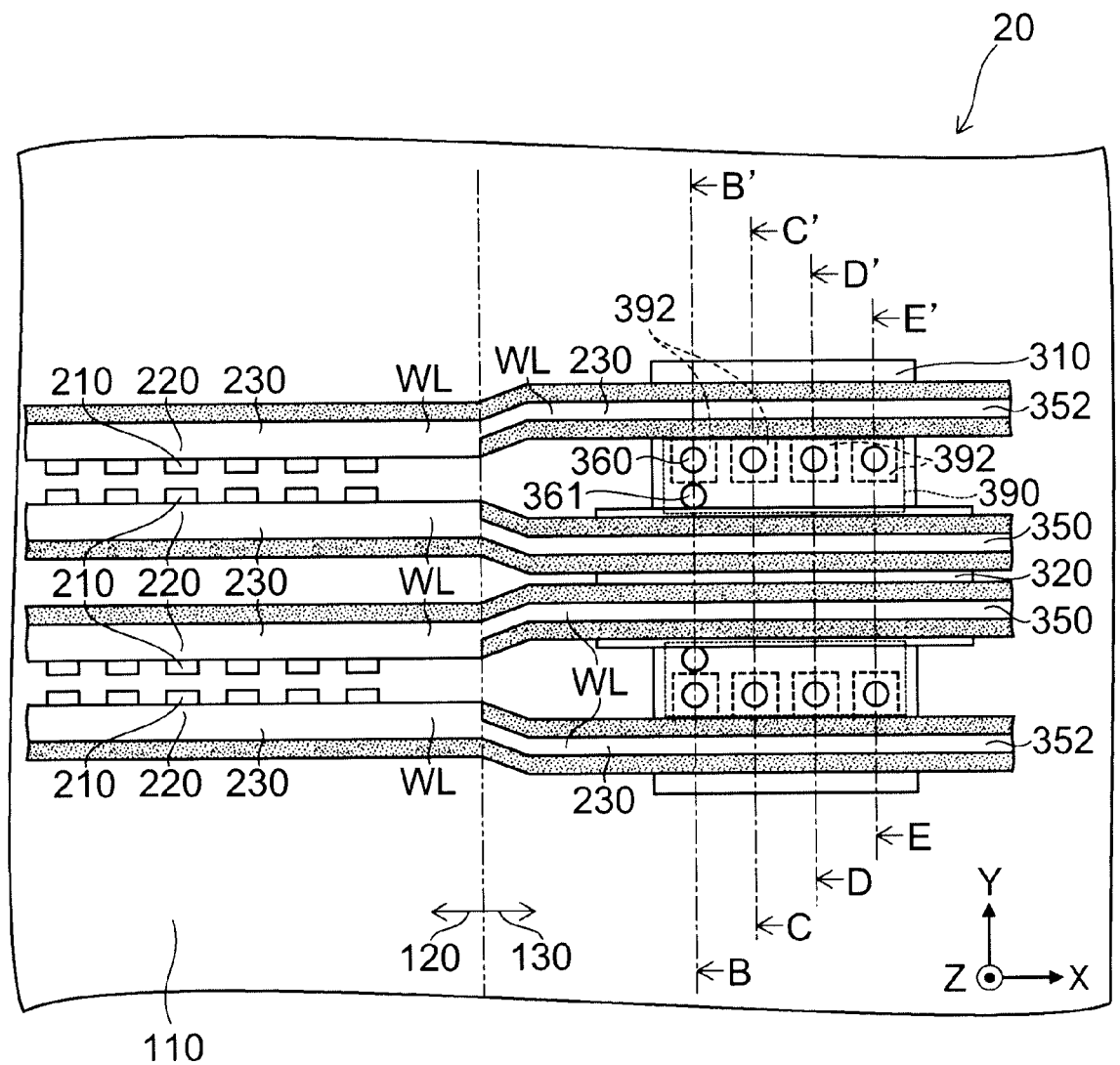
FIG. 31 is a schematic plan view illustrating the configuration of a nonvolatile semiconductor memory device according to a fourth embodiment of the invention.

FIG. 31 is a schematic plan view illustrating a configuration of a nonvolatile semiconductor memory device according to a fourth embodiment of the invention.

FIG. 32, FIG. 33, FIG. 34, and FIG. 35 are a cross-sectional view along line B-B', a cross-sectional view along line C-C', a cross-sectional view along line D-D', and a cross-sectional view along line E-E' of FIG. 31, respectively.

As illustrated in FIG. 31 to FIG. 35, in the peripheral circuit region 130 of the nonvolatile semiconductor memory device 20 according to the fourth embodiment of the invention, the spacing between the word lines WL (the first interconnections 350) is small in the portion above the gate electrode 320 of the transfer gate transistor 310; the spacing between the second interconnection 352 and the first interconnection 350 is larger than the spacing between the first interconnections 350; and the contact electrode (the inter-layer connection part) 360 is provided between the word lines WL, that is, between the first interconnection 350 and the second interconnection 352, in a region not above the gate electrode 320 to connect the second interconnection 352 to the peripheral circuit.

In other words, the nonvolatile semiconductor memory device 10 has a structure in which the contact electrode (the inter-layer connection part) 360 connects to the first interconnection 350 and connects the first interconnection 350 to the peripheral circuit, while the nonvolatile semiconductor memory device 20 has a structure in which the contact electrode (the inter-layer connection part) 360 connects to the second interconnection 352 and connects the second interconnection 352 to the peripheral circuit. Otherwise, the nonvolatile semiconductor memory device 20 is similar to the nonvolatile semiconductor memory device 10 and a description is omitted.

Figure 32:
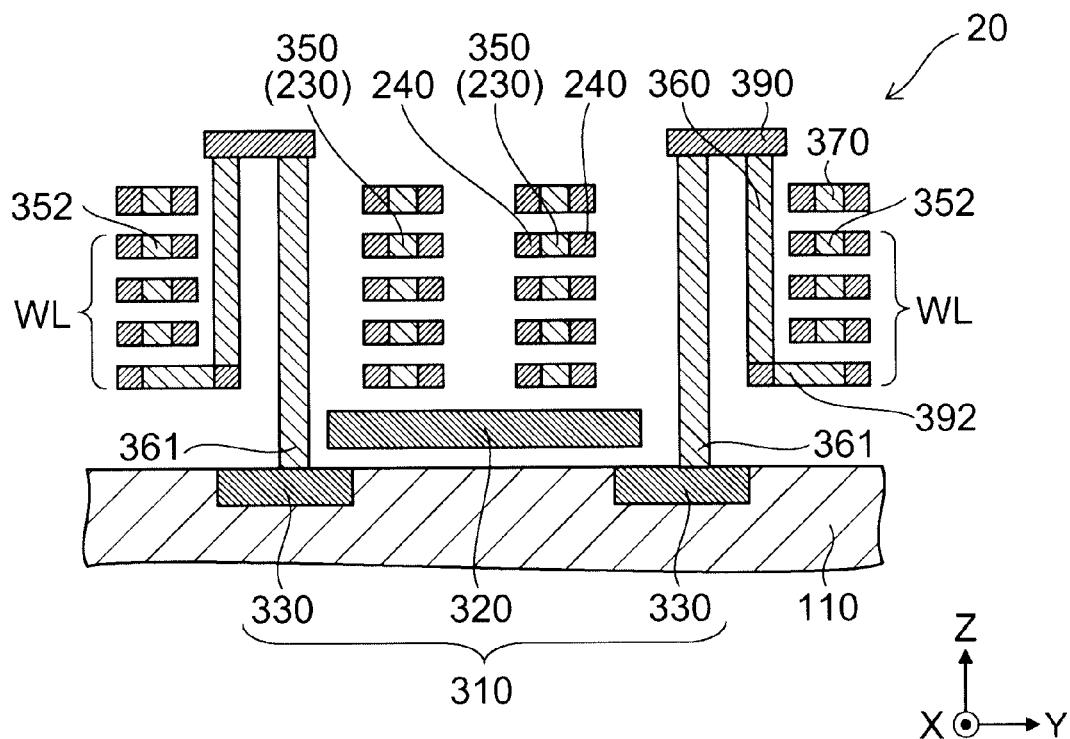
FIG. 32 is a cross-sectional view along the line B-B' of FIG. 31.

In other words, as illustrated in FIG. 32, the contact electrode (the inter-layer connection part) 361 connected to the diffusion layer 330 of the transfer gate transistor 310 is provided between the laminated first interconnections 350 and the laminated second interconnections 352; and the contact electrode 361 is connected to, for example, one portion of the upper layer electrode 390. Then, another portion of the upper layer electrode 390 is connected to a connection portion 392 provided on the lowermost word line WL of the laminated word lines WL (the second interconnections 352) by another contact electrode (inter-layer connection part) 360.

Figure 33:
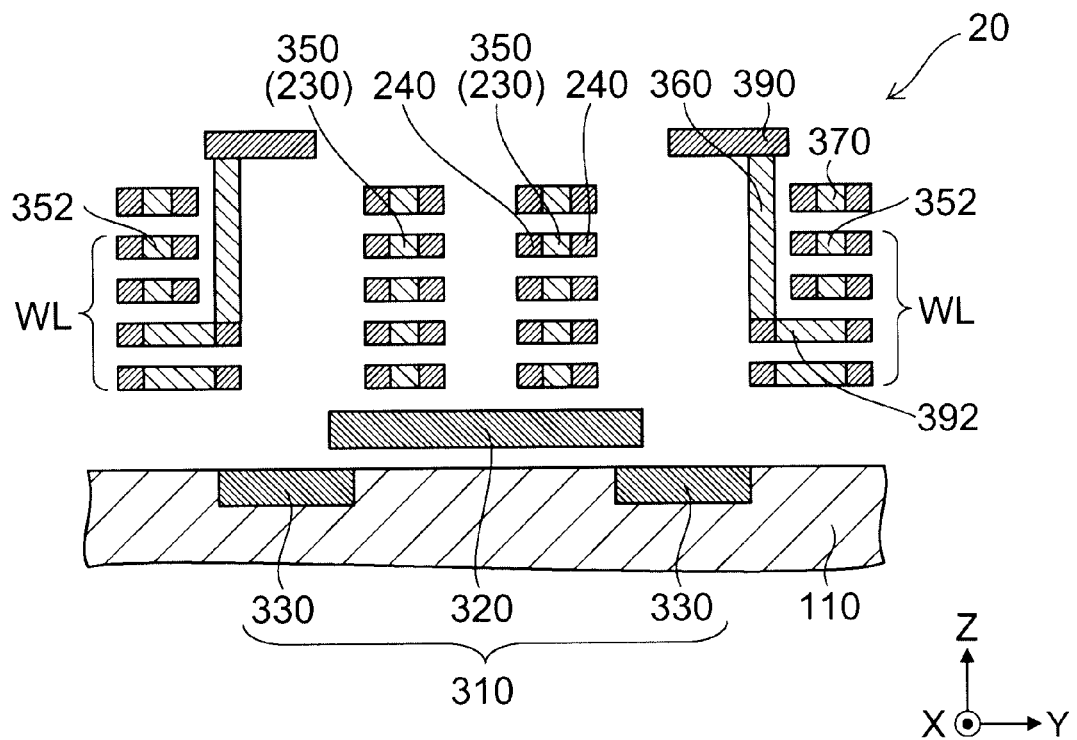
FIG. 33 is a cross-sectional view along the line C-C' of FIG. 31.

As illustrated in FIG. 33, one portion of the upper layer electrode 390 connected to the diffusion layer 330 of the transfer gate transistor 310 is connected to a connection portion 392 provided on the second lowermost word line WL (second interconnection 352) by the contact electrode 360.

Figure 34:
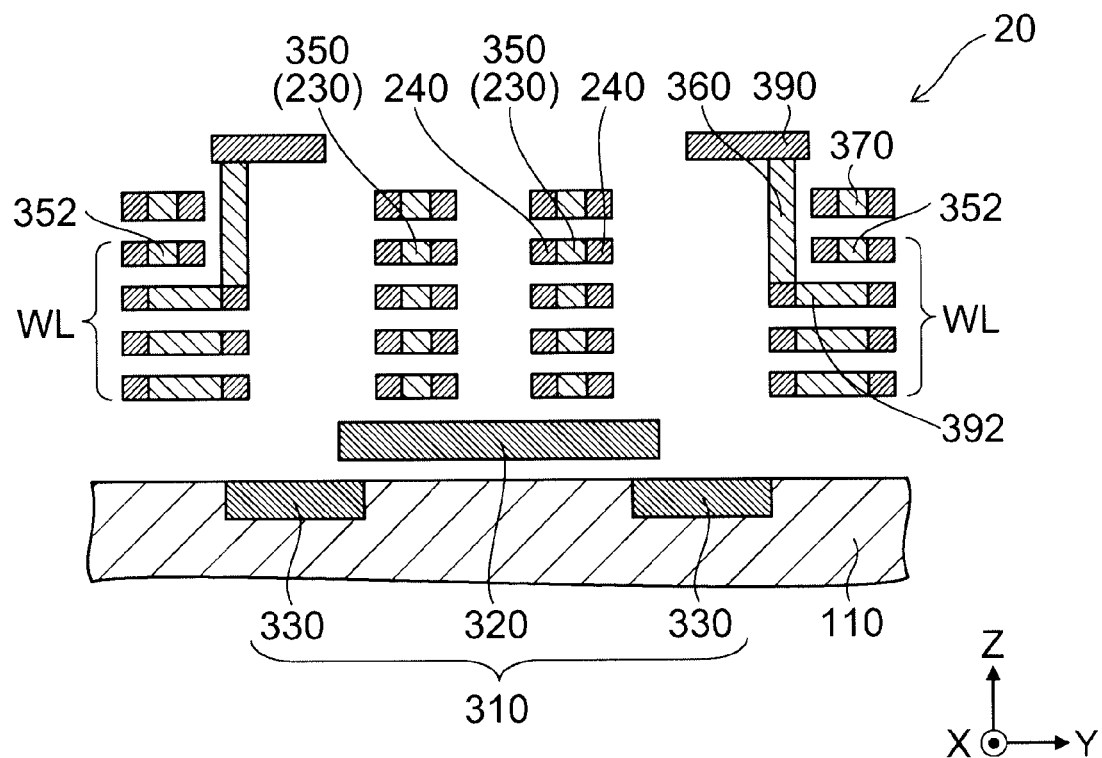
FIG. 34 is a cross-sectional view along the line D-D' of FIG. 31.

As illustrated in FIG. 34, one portion of the upper layer electrode 390 connected to the diffusion layer 330 of the transfer gate transistor 310 is connected to a connection portion 392 provided on the third lowermost word line WL (second interconnection 352) by the contact electrode 360.

Figure 35:
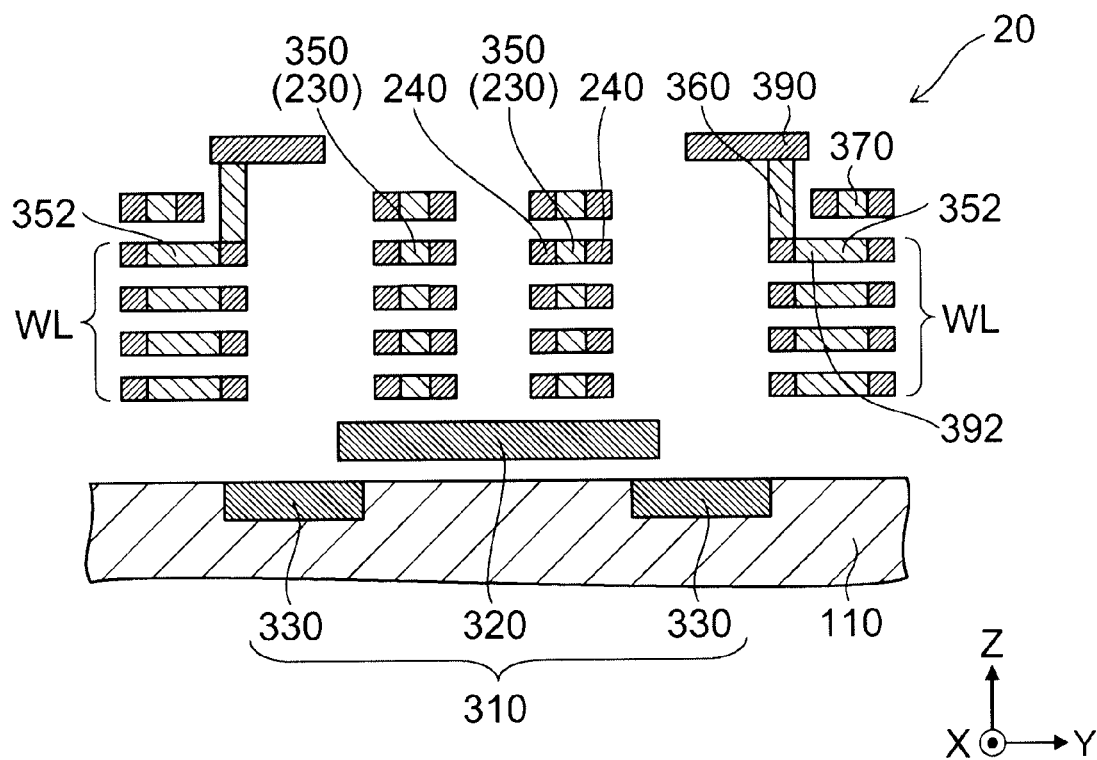
FIG. 35 is a cross-sectional view along the line E-E' of FIG. 31.

As illustrated in FIG. 35, one portion of the upper layer electrode 390 connected to the diffusion layer 330 of the transfer gate transistor 310 is connected to a connection portion 392 provided on the fourth lowermost (in this example, the uppermost) word line WL (second interconnection 352) by the contact electrode 360.

Thus, each of the laminated word lines WL (the second interconnections 352) is conducted to the diffusion layer 330. In other words, each of the laminated word lines WL (the second interconnections 352) is connected to the peripheral circuit.

Thus, multiple contact electrodes 360 are provided at different positions in the plane parallel to the major surface of the semiconductor substrate 110; and all of the word lines WL (the second interconnections 352) of each laminated layer are connected to the peripheral circuit. In other words, each of the laminated word lines WL (the second interconnections 352) includes a connection portion 392 provided in a different planar position (a protruding portion formed by the conductive layer 230 protruding in, for example, the Y-axis direction); and a contact electrode 360 connected to an upper layer electrode 390 is connected to the connection portion 392.

The connection portion 392 of the second interconnection 352 recited above may have the structures illustrated in FIG. 29 and FIG. 30, that is, an independent configuration protruding in the second direction (for example, the Y-axis direction) non-parallel to the first direction (the X-axis direction) in the plane parallel to the major surface 111 of the semiconductor substrate 110 and corresponding to each of the inter-layer connection parts (the contact electrodes 360), and a continuous configuration extending along the side face of the word line WL (the second interconnection 352) and extending in the X-axis direction while corresponding to the inter-layer connection part (the contact electrode 360).

Thus, the nonvolatile semiconductor memory device 20 according to this embodiment can provide a nonvolatile semiconductor memory device that enables each laminated memory cell to connect to the peripheral circuit.

FIFTH EMBODIMENT

Figure 36:
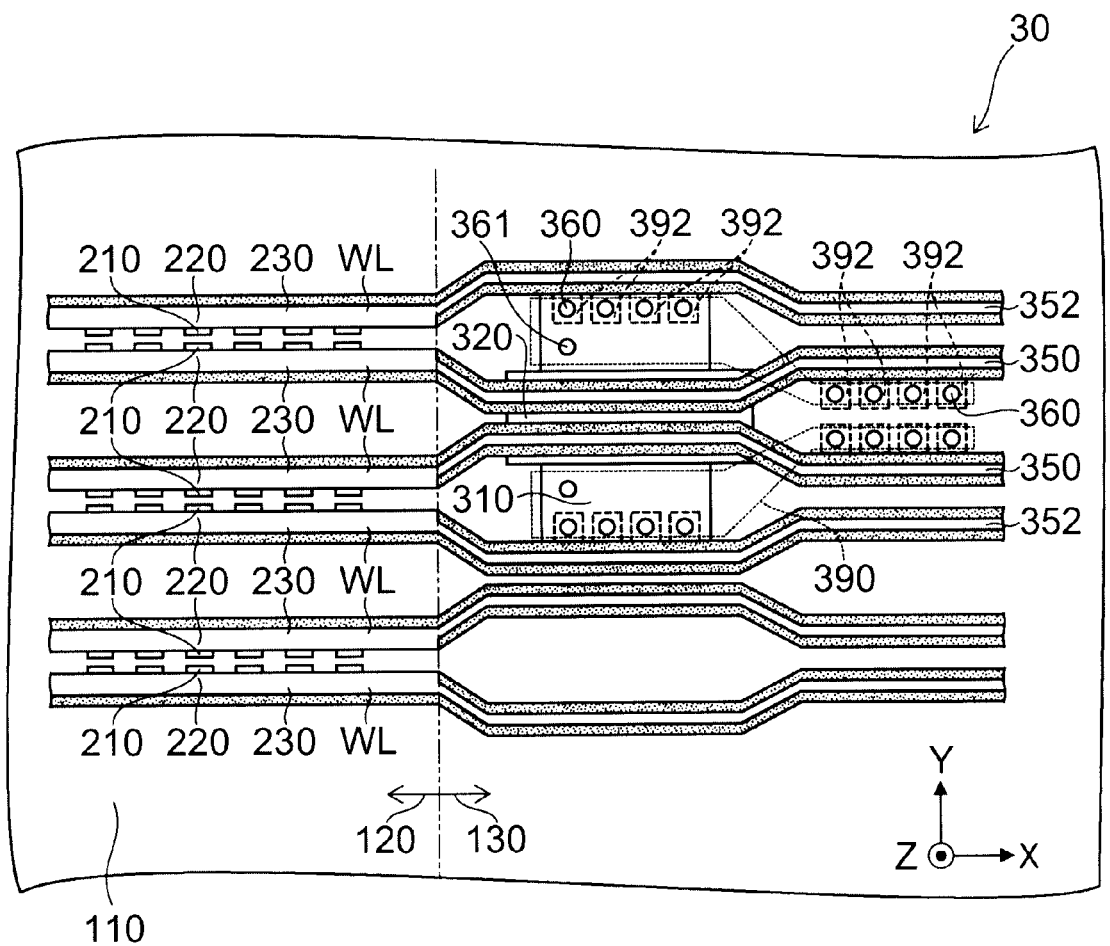
FIG. 36 is a schematic plan view illustrating the configuration of a nonvolatile semiconductor memory device according to a fifth embodiment of the invention.

FIG. 36 is a schematic plan view illustrating a configuration of a nonvolatile semiconductor memory device according to a fifth embodiment of the invention.

As illustrated in FIG. 36, in the peripheral circuit region 130 of a nonvolatile semiconductor memory device 30 according to the fifth embodiment of the invention, the spacing between the word lines WL (the first interconnections 350) is small and the spacing between the second interconnection 352 and the first interconnection 350 is larger than the spacing between the first interconnections 350 in a portion above the gate electrode 320 of the transfer gate transistor 310. Then, the inter-layer connection part (the contact electrode 360) can be provided between the first interconnection 350 and the second interconnection 352 in a region that is above the same X axis as the gate electrode 320 but not above the gate electrode 320.

The contact electrode 360 is connected to the connection portion 392 of the second interconnection 352 and the upper layer electrode 390. The upper layer electrode 390 is connected to the diffusion layer 330 of the transfer gate transistor 310 by another contact electrode 361. Thereby, the second interconnection 352 is connected to the peripheral circuit (the transfer gate transistor 310).

In other words, each of the laminated second interconnections 352 include a connection portion 392 (a protruding portion formed by the conductive layer 230 protruding in, for example, the Y-axis direction) provided in different planar positions. The contact electrode 360 connected to the upper layer electrode 390 is connected to the connection portion 392; and all of the second interconnections 352 laminated in each layer are connected to the peripheral circuit.

Further, on the peripheral region side of the transfer gate transistor 310 in the X-axis direction (the direction opposite from the memory cell region 120 as viewed from the transfer gate transistor 310) of the peripheral circuit region 130, the spacing between the first interconnections 350 is large, and the spacing between the second interconnection 352 and the first interconnection 350 is smaller than the spacing between the first interconnections 350. Then, the inter-layer connection part (the contact electrode 360) is provided between the first interconnections 350 having a large spacing therebetween. The contact electrode 360 is connected to the connection portion 392 of the first interconnection 350 and the upper layer electrode 390. The upper layer electrode 390 is connected to the diffusion layer 330 of the transfer gate transistor 310 by another contact electrode 361. Thereby, each of the laminated first interconnections 350 is connected to the peripheral circuit (the transfer gate transistor 310).

In other words, each of the laminated first interconnections 350 includes a connection portion 392 (a protruding portion formed by the conductive layer 230 protruding in, for example, the Y-axis direction) provided in different planar positions. The contact electrode 360 connected to the upper layer electrode 390 is connected to the connection portion 392. All of the first interconnections 350 in each laminated layer are connected to the peripheral circuit.

Thus, the nonvolatile semiconductor memory device 30 includes a portion in which the spacing between the first interconnections 350 is small and the spacing between the first interconnection 350 and the second interconnection 352 is large. The inter-layer connection part (the contact electrode 360) is provided between the first interconnection 350 and the second interconnection 352. Then, the inter-layer connection part (the contact electrode 360) is provided between the first interconnections 350 in another portion, disposed in the X-axis direction of the first interconnection 350 having the portion in which the mutual spacing is small, which has a large spacing between the first interconnections 350.

The inter-layer connection part connects each of the connected first interconnections 350 and second interconnections 352 to the peripheral circuit. The portion recited above in which the spacing between the first interconnections 350 is small passes above the gate electrode 320 of the transfer gate transistor 310.

Thus, in the nonvolatile semiconductor memory device 30, each of the laminated first interconnections 350 and second interconnections 352 can be connected to the peripheral circuit. The nonvolatile semiconductor memory device 30 according to this embodiment can provide a nonvolatile semiconductor memory device that enables each laminated memory cell to connect to the peripheral circuit.

Figure 37:
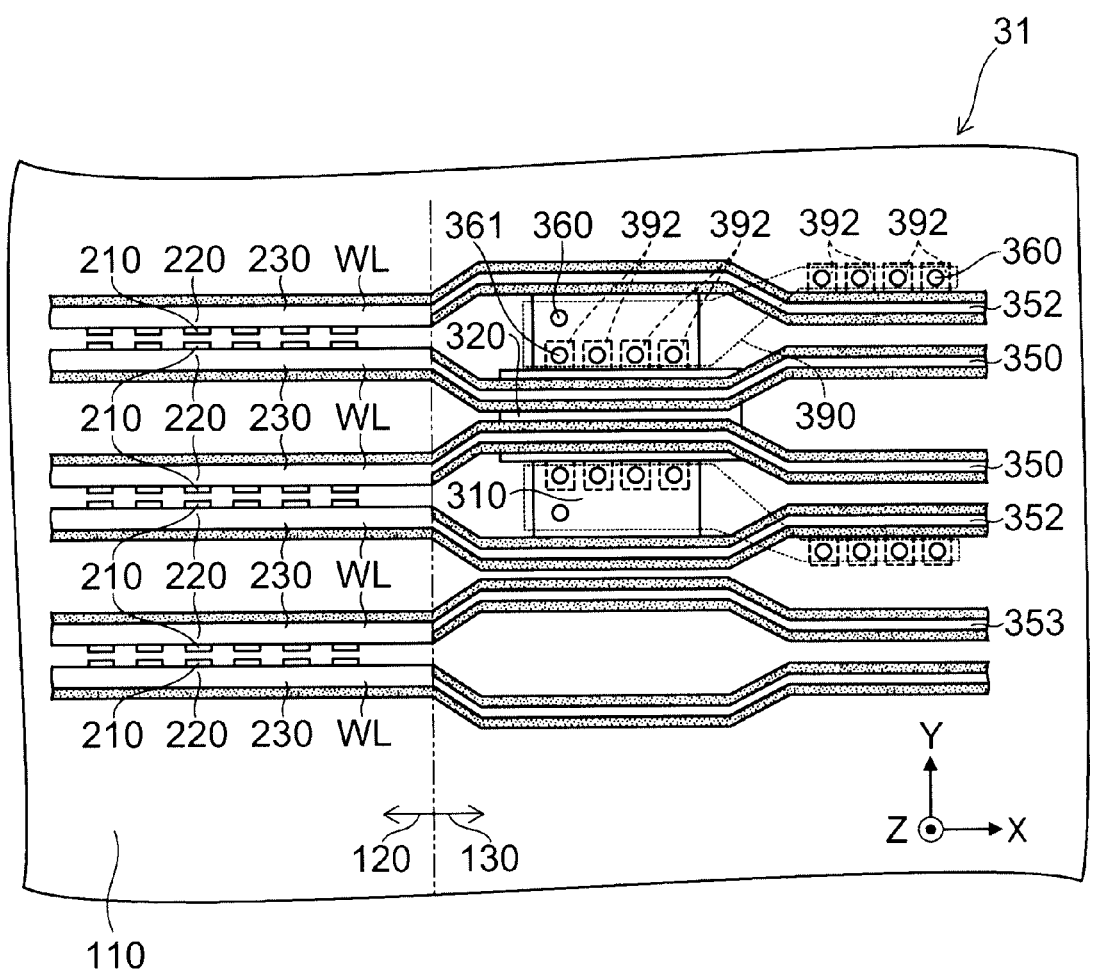
FIG. 37 is a schematic plan view illustrating the configuration of another nonvolatile semiconductor memory device according to the fifth embodiment of the invention.

FIG. 37 is a schematic plan view illustrating the configuration of another nonvolatile semiconductor memory device according to the fifth embodiment of the invention.

As illustrated in FIG. 37, in the peripheral circuit region 130 of the other nonvolatile semiconductor memory device 31 according to the fifth embodiment of the invention, the spacing between the word lines WL (the first interconnections 350) is small, and the spacing between the second interconnection 352 and the first interconnection 350 is larger than the spacing between the first interconnections 350 in a portion above the gate electrode 320 of the transfer gate transistor 310. Then, the inter-layer connection part (the contact electrode 360) is provided between the first interconnection 350 and the second interconnection 352 in a region on the same X axis of the gate electrode 320 other than above the gate electrode 320.

The contact electrode 360 is connected to the connection portion 392 of the first interconnection 350 and the upper layer electrode 390. The upper layer electrode 390 is connected to the diffusion layer 330 of the transfer gate transistor 310 by another contact electrode 361. Thereby, each of the laminated first interconnections 350 is connected to the peripheral circuit (the transfer gate transistor 310).

In other words, each of the laminated first interconnections 350 includes the connection portion 392 (the protruding portion formed by the conductive layer 230 protruding in, for example, the Y-axis direction) provided in different planar positions. The contact electrode 360 connected to the upper layer electrode 390 is connected to the connection portion 392. All of the first interconnections 350 of each laminated layer are connected to the peripheral circuit.

Also, in the peripheral circuit region 130, the spacing between the second interconnection 352 and another interconnection 353 is large on the peripheral region side of the transfer gate transistor 310 in the X-axis direction (the direction opposite to the memory cell region 120 as viewed from the transfer gate transistor 310). Then, the inter-layer connection part (the contact electrode 360) is provided in the portion in which the spacing to the other interconnection 353 is large. The contact electrode 360 is connected to the connection portion 392 of the second interconnection 352 and the upper layer electrode 390. The upper layer electrode 390 is connected to the diffusion layer 330 of the transfer gate transistor 310 by another contact electrode 361. Thereby, each of the laminated second interconnections 352 is connected to the peripheral circuit (the transfer gate transistor 310).

In other words, each of the laminated second interconnections 352 include the connection portion 392 (the protruding portion formed by the conductive layer 230 protruding in, for example, the Y-axis direction) provided in different planar positions. The contact electrode 360 connected to the upper layer electrode 390 is connected to the connection portion 392. All of the second interconnections 352 in each laminated layer are connected to the peripheral circuit.

Thus, the nonvolatile semiconductor memory device 31 includes a portion in which the spacing between the first interconnection 350 and the second interconnection 352 is large. The inter-layer connection part is provided between the first interconnection 350 and the second interconnection 352 of this portion. On the other hand, the inter-layer connection part is provided in a portion in which the spacing between the second interconnection 352 and the other interconnection 353 is large.

The inter-layer connection part connects each of the connected first interconnection 350 and second interconnection 352 to the peripheral circuit. The portion recited above in which the spacing between the first interconnection 350 and the second interconnection 352 is large is formed by arranging the portion in which the spacing between the first interconnections 350 is small; and the portion in which the spacing between the first interconnections 350 is small passes above the gate electrode 320 of the transfer gate transistor 310.

Thus, in the nonvolatile semiconductor memory device 31, each of the laminated first interconnections 350 and second interconnections 352 can be connected to the peripheral circuit. The nonvolatile semiconductor memory device 31 according to this embodiment can provide a nonvolatile semiconductor memory device that enables each laminated memory cell to connect to the peripheral circuit.

Figure 38:
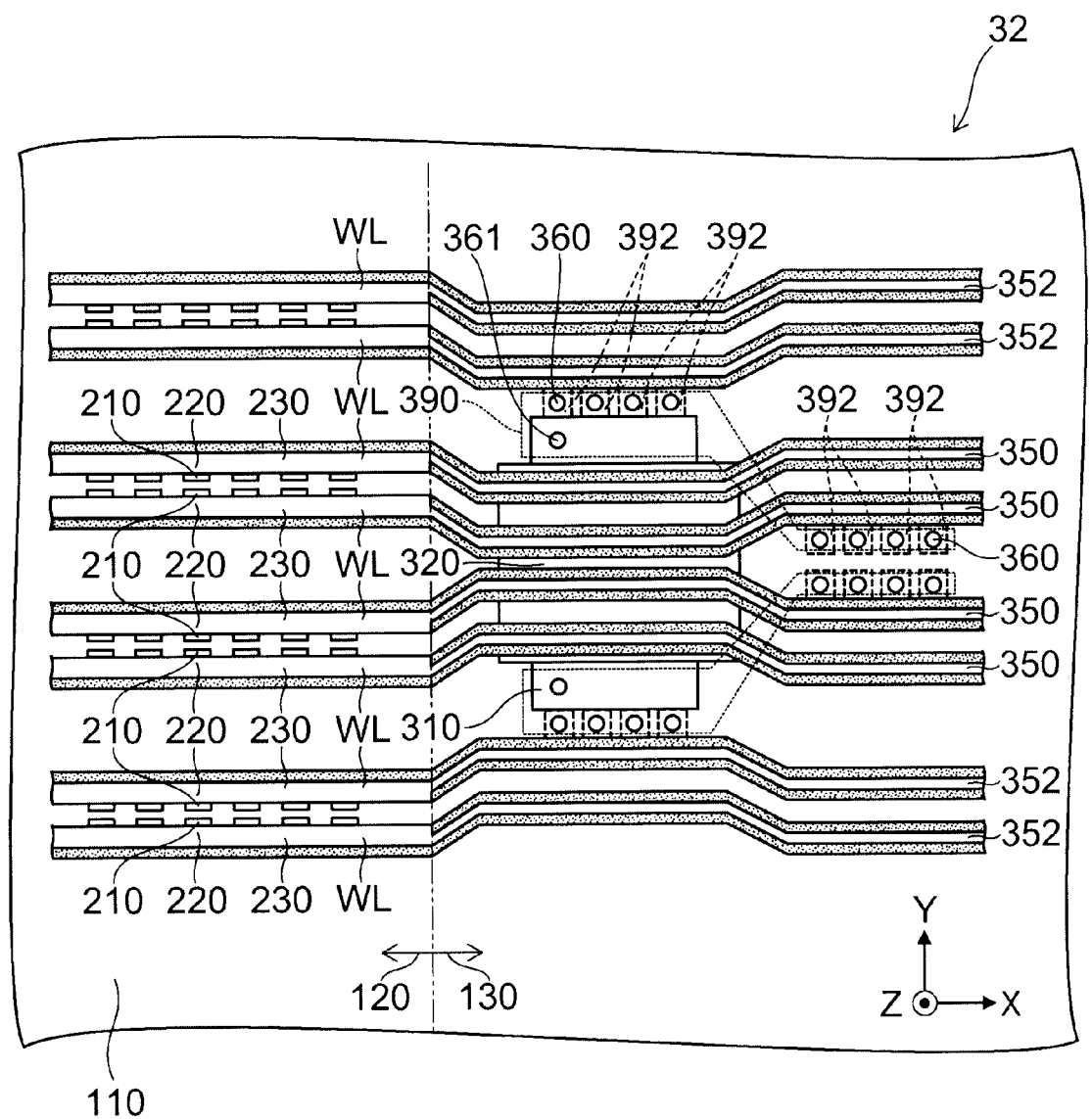
FIG. 38 is a schematic plan view illustrating the configuration of another nonvolatile semiconductor memory device according to the fifth embodiment of the invention.

FIG. 38 is a schematic plan view illustrating the configuration of another nonvolatile semiconductor memory device according to the fifth embodiment of the invention.

As illustrated in FIG. 38, in the peripheral circuit region 130 of another nonvolatile semiconductor memory device 32 according to the fifth embodiment of the invention, four of the first interconnections 350 pass through the portion above the gate electrode 320 of the transfer gate transistor 310.

In other words, two first interconnections 350 pass through the portion above the gate electrode 320 of the transfer gate transistor 310 in the nonvolatile semiconductor memory device 30 illustrated in FIG. 36, while four first interconnections 350 pass through the portion above the gate electrode 320 in the nonvolatile semiconductor memory device 32. Thus, the number of word lines WL (first interconnections 350) passing through the portion above the gate electrode 320 in this embodiment is arbitrary.

In the portion above the gate electrode 320 of the transfer gate transistor 310 in the nonvolatile semiconductor memory device 32, the spacing between the word lines WL (the first interconnections 350) is small, and the spacing between the second interconnection 352 and the first interconnection 350 is larger than the spacing between the first interconnections 350. Then, the inter-layer connection part (the contact electrode 360) can be provided between the first interconnection 350 and the second interconnection 352 in the region that is above the same X axis of the gate electrode 320 but not above the gate electrode 320.

The contact electrode 360 is connected to the connection portions 392 of two first interconnections 350 on the second interconnection 352 side and the upper layer electrode 390. The upper layer electrode 390 is connected to the diffusion layer 330 of the transfer gate transistor 310 by another contact electrode 361.

Thereby, each of the laminated conductive layers 230 forming the two first interconnections 350 on the second interconnection 352 side are connected to the peripheral circuit (the transfer gate transistor 310).

In other words, in regard to the two first interconnections 350 on the second interconnection 352 side, each of the laminated first interconnections 350 includes the connection portion 392 (the protruding portion formed by the conductive layer 230 protruding in, for example, the Y-axis direction) provided at different planar positions. The contact electrode 360 connected to the upper layer electrode 390 is connected to the connection portion 392. All of the first interconnections 350 in each laminated layer are connected to the peripheral circuit.

Further, on the peripheral region side in the Y-axis direction of the transfer gate transistor 310 (the side opposite to the memory cell region 120 as viewed from the transfer gate transistor 310) in the peripheral circuit region 130, the spacing between the two first interconnections 350 on the distal side as viewed from the second interconnection 352 is large. Then, the contact electrode (the inter-layer connection part) 360 is provided between the first interconnections 350 having the large mutual spacing. The contact electrode 360 is connected to the upper layer electrode 390 and the connection portion 392 of the two first interconnections 350 on the distal side as viewed from the second interconnection 352. The upper layer electrode 390 is connected to the diffusion layer 330 of the transfer gate transistor 310 by the other contact electrode 361.

Thereby, each of the laminated conductive layers 230 forming the two first interconnections 350 on the distal side as viewed from the second interconnection 352 is connected to the peripheral circuit (the transfer gate transistor 310).

In other words, in regard to the two first interconnections 350 on the distal side as viewed from the second interconnection 352, each of the laminated first interconnections 350 includes the connection portion 392 (the protruding portion formed by the conductive layer 230 protruding in, for example, the Y-axis direction) provided in different planar positions. The contact electrode 360 connected to the upper layer electrode 390 is connected to the connection portion 392. All of the first interconnections 350 of each laminated layer are connected to the peripheral circuit.

Thus, the nonvolatile semiconductor memory device 32 includes the portion in which the spacing between the first interconnections 350 is small and the portion adjacent thereto in the Y-axis direction in which spacing between the first interconnection 350 and the second interconnection 352 is large. The inter-layer connection part is provided between the first interconnection 350 and the second interconnection 352. The inter-layer connection part connects the second interconnection 352 to the peripheral circuit.

On the other hand, the inter-layer connection part is provided between the first interconnections 350 in a portion at a position not on the X axis of the gate electrode 320 of the transfer gate transistor 310 in which the spacing between the first interconnections 350 is large. The inter-layer connection part connects the first interconnection 350 to the peripheral circuit.

The portion recited above in which the spacing between the first interconnections 350 is small passes above the gate electrode 320 of the transfer gate transistor 310.

Thus, in the nonvolatile semiconductor memory device 32, each of the laminated first interconnections 350 can be connected to the peripheral circuit. The nonvolatile semiconductor memory device 32 according to this embodiment can provide a nonvolatile semiconductor memory device that enables each laminated memory cell to connect to the peripheral circuit.

Figure 39:
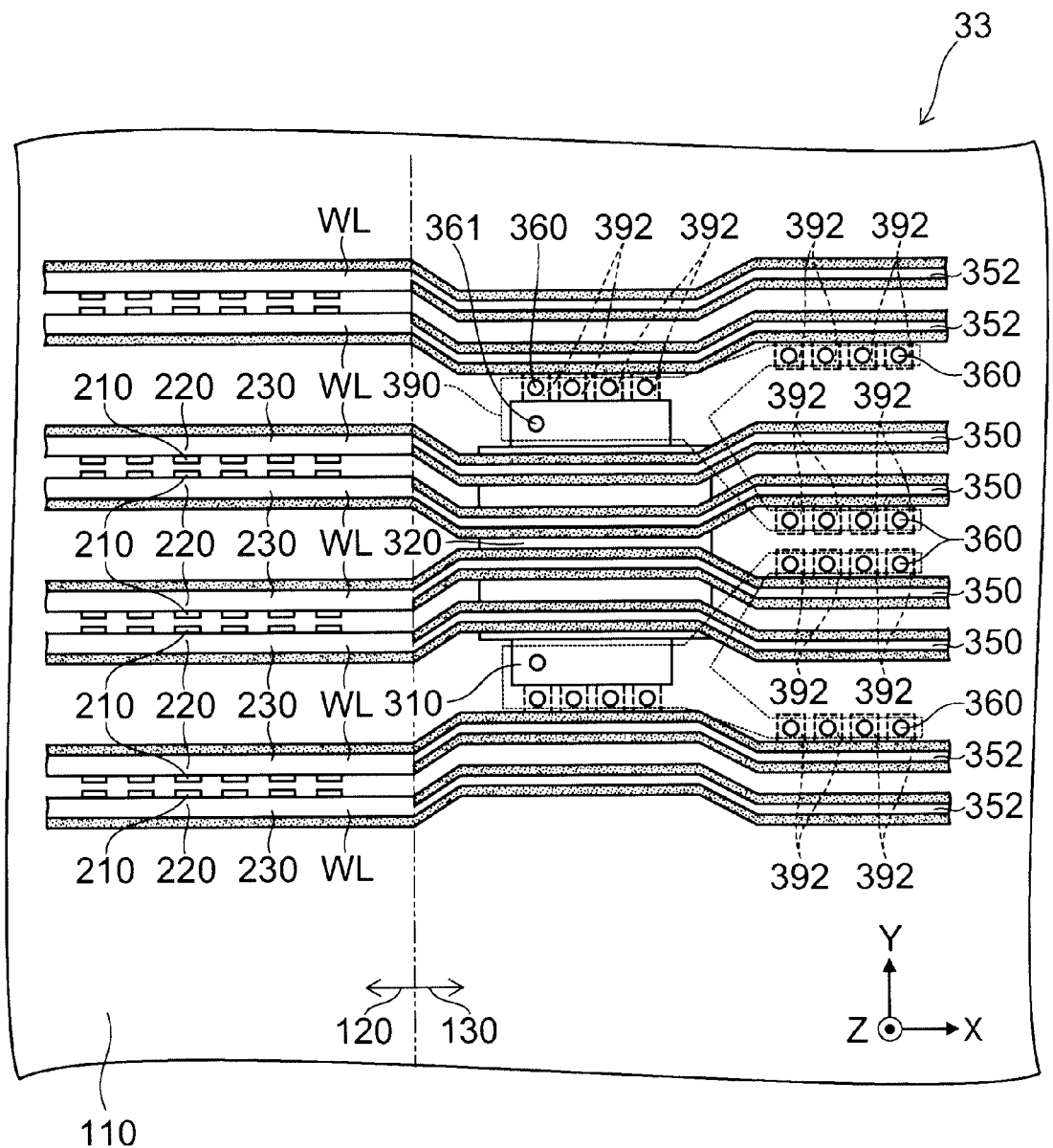
FIG. 39 is a schematic plan view illustrating the configuration of another nonvolatile semiconductor memory device according to the fifth embodiment of the invention.

FIG. 39 is a schematic plan view illustrating the configuration of another nonvolatile semiconductor memory device according to the fifth embodiment of the invention.

As illustrated in FIG. 39, in the peripheral circuit region 130 of another nonvolatile semiconductor memory device 33 according to the fifth embodiment of the invention, four first interconnections 350 pass through the portion above the gate electrode 320 of the transfer gate transistor 310.

In the nonvolatile semiconductor memory device 33, the spacing between the word lines WL (the first interconnections 350) is small and the spacing between the second interconnection 352 and the first interconnection 350 is larger than the spacing between the first interconnections 350 in the portion above the gate electrode 320 of the transfer gate transistor 310. Then, the inter-layer connection part (the contact electrode 360) is provided between the first interconnection 350 and the second interconnection 352 in the region that is above the same X axis of the gate electrode 320 but not above the gate electrode 320.

The contact electrode 360 is connected to the connection portions 392 of the two first interconnections 350 on the second interconnection 352 side and the upper layer electrode 390. The upper layer electrode 390 is connected to the diffusion layer 330 of the transfer gate transistor 310 by the other contact electrode 361. Thereby, each of the laminated conductive layers 230 forming the two first interconnections 350 on the second interconnection 352 side are connected to the peripheral circuit (the transfer gate transistor 310).

On the peripheral region side of the transfer gate transistor 310 in the Y-axis direction (the side opposite to the memory cell region 120 as viewed from the transfer gate transistor 310) in the peripheral circuit region 130, the spacing between the two first interconnections 350 on the distal side as viewed from the second interconnection 352 is large. Then, the contact electrode (the inter-layer connection part) 360 is provided between the first interconnections 350 in which the mutual spacing is large. The contact electrode 360 is connected to the upper layer electrode 390 and the connection portions 392 of the two first interconnections 350 on the distal side as viewed from the second interconnection 352. The upper layer electrode 390 is connected to the diffusion layer 330 of the transfer gate transistor 310 by the other contact electrode 361.

Thereby, each of the laminated conductive layers 230 forming the two first interconnections 350 on the distal side as viewed from the second interconnection 352 are connected to the peripheral circuit (the transfer gate transistor 310).

Another contact electrode 360 is provided between the first interconnection 350 and the second interconnection 352 at a different position in the Y direction than the contact electrode 360 connecting the peripheral circuit to the two first interconnections 350 on the distal side as viewed from the second interconnection 352 recited above. The other contact electrode 360 is connected to the second interconnection 352. In other words, each of the laminated second interconnections 352 is connected to the peripheral circuit.

Thus, in the nonvolatile semiconductor memory device 33, each of the laminated first interconnections 350 and second interconnections 352 can be connected to the peripheral circuit. According to this embodiment, the nonvolatile semiconductor memory device 33 can be provided as a nonvolatile semiconductor memory device that enables each laminated memory cell to connect to the peripheral circuit.

Thus, the nonvolatile semiconductor memory devices according to the embodiments of the invention include a distinctive layout of the word lines WL above the transfer gate transistor 310 in regard to the structure of a laminated nonvolatile semiconductor memory device. Thereby, it is possible to draw out the laminated word lines WL individually to the peripheral circuit region; and all of the word lines WL can be connected to the transfer gate transistor 310 in a nonvolatile semiconductor memory device including laminated memory cells.

Although all of the word lines WL are connected to the same transfer gate transistor 310 to simplify the descriptions in the nonvolatile semiconductor memory devices 10, 20, 30, 31, 32, and 33 recited above, normally, each word line WL is connected to an individual transfer gate transistor corresponding to each word line WL.

Figure 40:
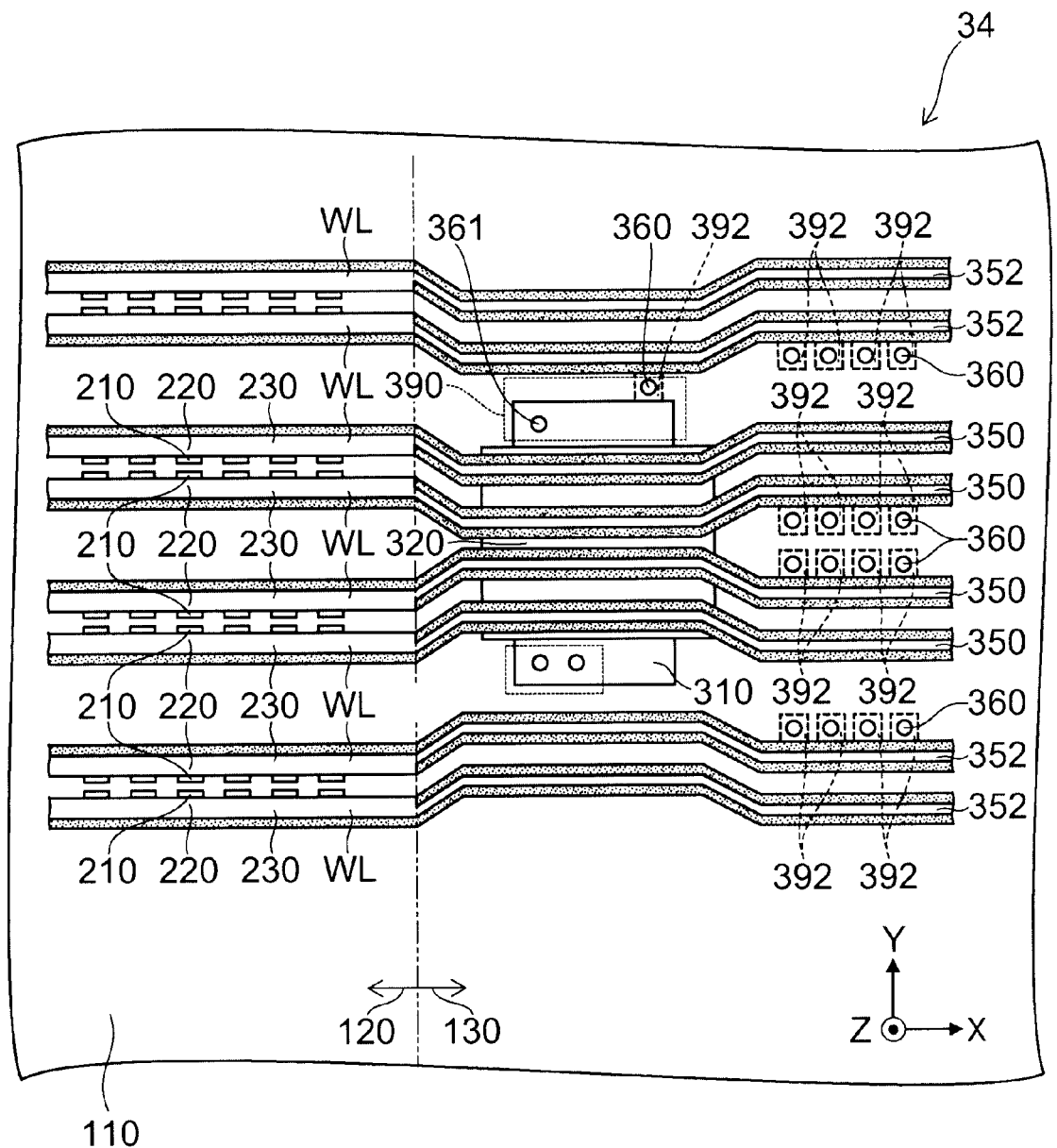
FIG. 40 is a schematic plan view illustrating the configuration of a nonvolatile semiconductor memory device according to a sixth embodiment of the invention.

FIG. 40 is a schematic plan view illustrating the configuration of a nonvolatile semiconductor memory device according to a sixth embodiment of the invention.

This embodiment can also be applied to the third, fourth and fifth embodiments.

As illustrated in FIG. 40, in a nonvolatile semiconductor memory device 34 according to the embodiment of the invention, a portion of the word lines WL is connected to the transfer gate transistor 310 illustrated in FIG. 40, and another portion of the word lines WL is connected to, for example, another not-illustrated transfer gate transistor disposed in the positive direction of the X axis from the transfer gate transistor 310. Thus, in the nonvolatile semiconductor memory devices 10, 20, 30, 31, 32, and 33 recited above, each of the word lines WL can be connected to another transfer gate transistor corresponding to each word line WL.

Hereinabove, embodiments of the invention are described with reference to specific examples. However, the invention is not limited to these specific examples. For example, one skilled in the art may appropriately select specific configurations of components of the nonvolatile semiconductor memory device from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices that can be obtained by an appropriate design modification by one skilled in the art based on the nonvolatile semiconductor memory devices described above as embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A nonvolatile semiconductor memory device comprising:
    a memory cell array region having memory cells connected in series;
    a control circuit region disposed below the memory cell array region; and
    an interconnection portion electrically connecting the control circuit region and the memory cell array region,
    the memory cell array region including:
        a plurality of first memory cell regions having the memory cells; and
        a plurality of connection regions, the interconnection portion being provided in the connection regions,
    the first memory cell regions being provided at a first pitch in a first direction orthogonal to a lamination direction of the memory cell array region and the control circuit region; and
    the connection regions being provided between the first memory cell regions mutually adjacent in the first direction, and at a second pitch in a second direction orthogonal to the lamination direction and the first direction.

2. The device according to claim 1, wherein
    the memory cell array region further includes a plurality of second memory cell regions provided between the first memory cell regions adjacent in the first direction and having the memory cell, and
    the second memory cell regions are provided at a third pitch in the second direction.

3. The device according to claim 2, wherein
    the memory cell array region further includes:
        a plurality of first conductive layers laminated in the lamination direction to extend in the first direction;
        a semiconductor layer provided facing a side wall of each of the first conductive layers in the first memory cell region; and
        a charge storage layer provided between each of the first conductive layers and the semiconductor layer in the first memory cell region,
    the first conductive layers further includes a stairstep portion formed in a stairstep configuration in the connection region,
    the first conductive layer in the first memory cell region and the connection region is formed in a straight-line configuration along the first direction,
    the first conductive layer between the first memory cell regions mutually adjacent in the first direction is formed to curve to the second direction side to avoid the connection region, and the interconnection portion connects the stairstep portion and a conductive layer of the control circuit region,
the semiconductor layer has a U-shape,
the memory cell array region further includes:
a second conductive layer, a third conductive layer and a fourth conductive layer,
the second conductive layer is electrically connected to one end of the semiconductor layer and extends in the first direction in a layer above the first conductive layers in the first memory cell region,
the third conductive layer is electrically connected to the second conductive layer and extends in the first direction in a layer above the second conductive layer in a region between the first memory cell regions mutually adjacent in the first direction, a position of the third conductive layer in the second direction matching a position of the second conductive layer in the second direction, and
the fourth conductive layer is electrically connected to another end of the semiconductor layer and extends in the second direction in the first memory cell region,
the third conductive layer is formed in a layer above the fourth conductive layer, and
the fourth conductive layer is further provided in the second memory cell region.

4. The device according to claim 1, wherein the memory cell array region further includes
a plurality of first conductive layers laminated in the lamination direction to extend in the first direction, and
a plurality of semiconductor layers passing through the first conductive layers in the lamination direction in the first memory cell region,
two mutually adjacent semiconductor layers of the semiconductor layers are electrically connected in a lower side of the memory cell array layer.

5. The device according to claim 1, wherein the memory cell array region further includes:
a plurality of first conductive layers laminated in the lamination direction to extend in the first direction, and
a plurality of semiconductor layers passing through the first conductive layers in the lamination direction in the first memory cell region,
a distance in the first direction between a lower conductive layer of the first conductive layers and a center of the connection region in the first direction is smaller than a distance in the first direction between the center of the connection region in the first direction and an upper conductive layer above the lower conductive layer of the first conductive layers.

6. The device according to claim 1, wherein
the memory cell array region further includes:
a plurality of first conductive layers laminated in the lamination direction to extend in the first direction;
a semiconductor layer provided facing a side wall of each of the first conductive layers in the first memory cell region; and
a charge storage layer provided between each of the first conductive layers and the semiconductor layer in the first memory cell region,
the first conductive layers further includes a stairstep portion formed in a stairstep configuration in the connection region,
the first conductive layer in the first memory cell region and the connection region is formed in a straight-line configuration along the first direction,
the first conductive layer between the first memory cell regions mutually adjacent in the first direction is formed to curve to the second direction side to avoid the connection region, and
the interconnection portion connects the stairstep portion and a conductive layer of the control circuit region.

7. The device according to claim 6, wherein
the semiconductor layer has a U-shape,
the memory cell array region further includes:
a second conductive layer, a third conductive layer and a fourth conductive layer,
the second conductive layer is electrically connected to one end of the semiconductor layer and extends in the first direction in a layer above the first conductive layers in the first memory cell region,
the third conductive layer is electrically connected to the second conductive layer and extends in the first direction in a layer above the second conductive layer in a region between the first memory cell regions mutually adjacent in the first direction, a position of the third conductive layer in the second direction matching a position of the second conductive layer in the second direction, and
the fourth conductive layer is electrically connected to another end of the semiconductor layer and extends in the second direction in the first memory cell region.

* * * * *